United States Patent
Su et al.

(10) Patent No.: US 12,439,548 B1
(45) Date of Patent: Oct. 7, 2025

(54) SYSTEMS AND METHODS FOR COOLING CIRCUIT BOARD COMPONENTS IN A COMPACT SIGNAL HUB

(71) Applicant: RIGH, INC., Palo Alto, CA (US)

(72) Inventors: Ming-Tsung Su, Taipei (TW); Chun-Wen Wang, Taoyuan (TW); Haohsiu Huang, Cupertino, CA (US); Huang Yu Ting, Hsinchu (TW); Yuhan Liu, Taipei (TW); ChiuWen Chen, New Taipei (TW)

(73) Assignee: RIGH, INC., Palo Alto, CA (US)

( * ) Notice: Subject to any disclaimer, the term of this patent is extended or adjusted under 35 U.S.C. 154(b) by 0 days.

(21) Appl. No.: 18/989,024

(22) Filed: Dec. 20, 2024

(51) Int. Cl.
*H05K 7/20* (2006.01)

(52) U.S. Cl.
CPC ....... *H05K 7/20154* (2013.01); *H05K 7/2039* (2013.01)

(58) Field of Classification Search
CPC ............. H05K 7/2039; H05K 7/20154; H05K 7/20145; H05K 7/20163; H05K 1/0203; H05K 7/20172; H05K 7/20136; H05K 7/20436
See application file for complete search history.

(56) References Cited

U.S. PATENT DOCUMENTS

| | | | | |
|---|---|---|---|---|
| 11,689,035 B2* | 6/2023 | Yang | ..................... | H02J 7/0042 |
| | | | | 320/108 |
| 2011/0304976 A1* | 12/2011 | Knopf | ..................... | B26D 3/14 |
| | | | | 361/679.47 |
| 2016/0044831 A1* | 2/2016 | Goh | ........................ | B23C 3/30 |
| | | | | 361/679.48 |
| 2017/0064865 A1* | 3/2017 | Kuwahara | ............ | H05K 7/2039 |
| 2020/0084900 A1* | 3/2020 | McDowell | ........... | H05K 5/0247 |
| 2022/0109222 A1* | 4/2022 | Heckmann | ............... | H01Q 9/32 |
| 2023/0007808 A1* | 1/2023 | Lau | ..................... | H05K 7/20445 |
| 2023/0139054 A1* | 5/2023 | Ali | ........................ | H05K 7/202 |
| | | | | 361/697 |
| 2023/0216367 A1* | 7/2023 | Rohoza | .................. | H02K 11/33 |
| | | | | 310/172 |
| 2024/0386917 A1* | 11/2024 | Utz | ........................ | H05K 5/026 |

* cited by examiner

*Primary Examiner* — Adam B Dravininkas
(74) *Attorney, Agent, or Firm* — Nicholas Martin; Greenberg Traurig, LLP

(57) ABSTRACT

The present disclosure relates to a signal hub incorporating a cooling system for managing heat dissipation in compact electronic devices. The cooling system addresses airflow impedance challenges as the hub's volume decreases, which can inhibit heat transfer and create hotspots. Impedance-reducing elements, such as a rounded top shell profile and flow depression, direct airflow efficiently across a top cooling plate. The antenna carrier contours to the top shell, supporting antennas electrically coupled to the top cooling plate for RF shielding and heat dissipation. A fan in the middle cooling plate creates a vacuum force, drawing air through an ambient air gap, while an exhaust fin directs airflow away from the bottom shell, preventing particle buildup. A BTB shield provides EMI protection and thermal management, and the bottom cooling plate enhances cooling efficiency, ensuring optimal performance and reliability in reduced volume settings.

18 Claims, 46 Drawing Sheets

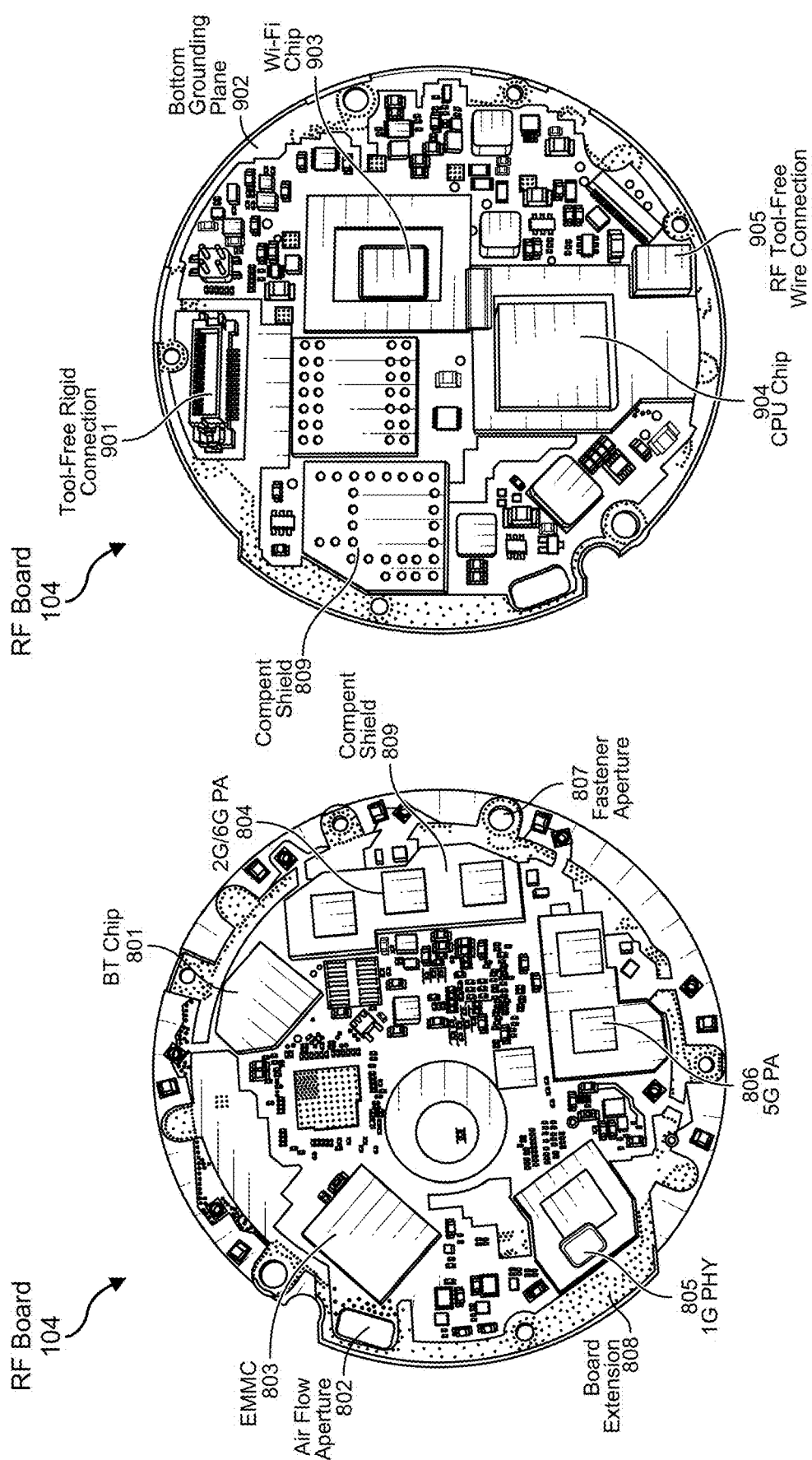

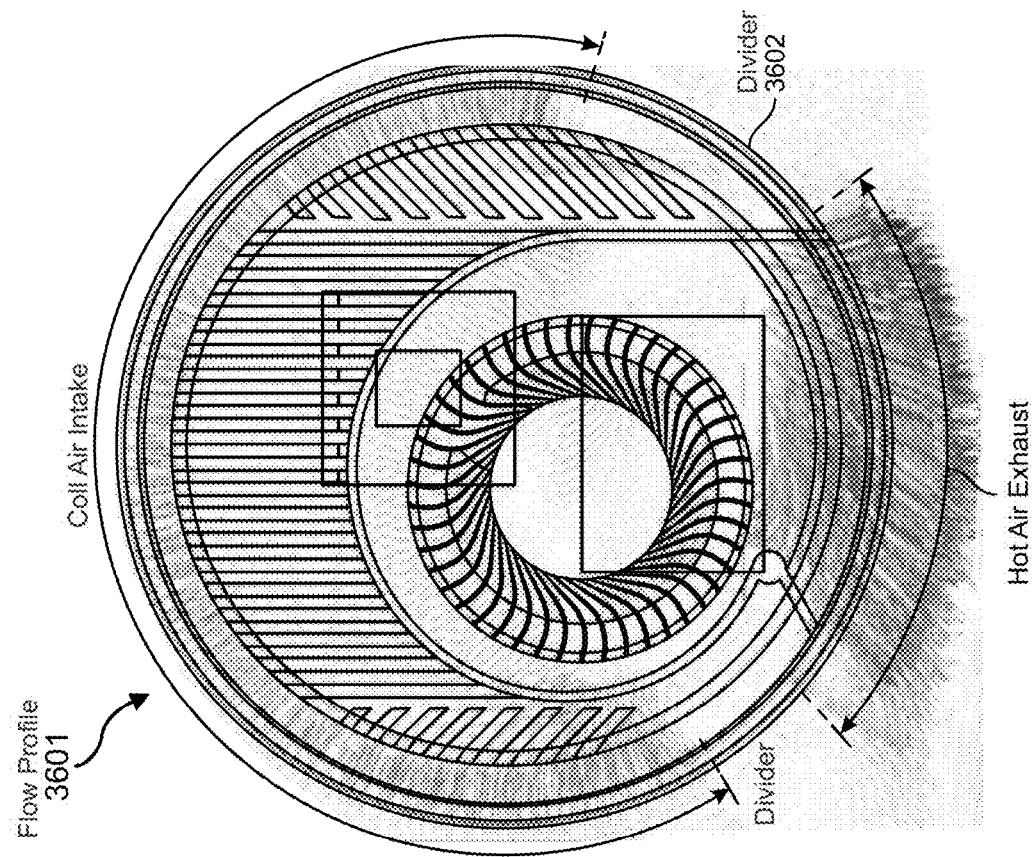
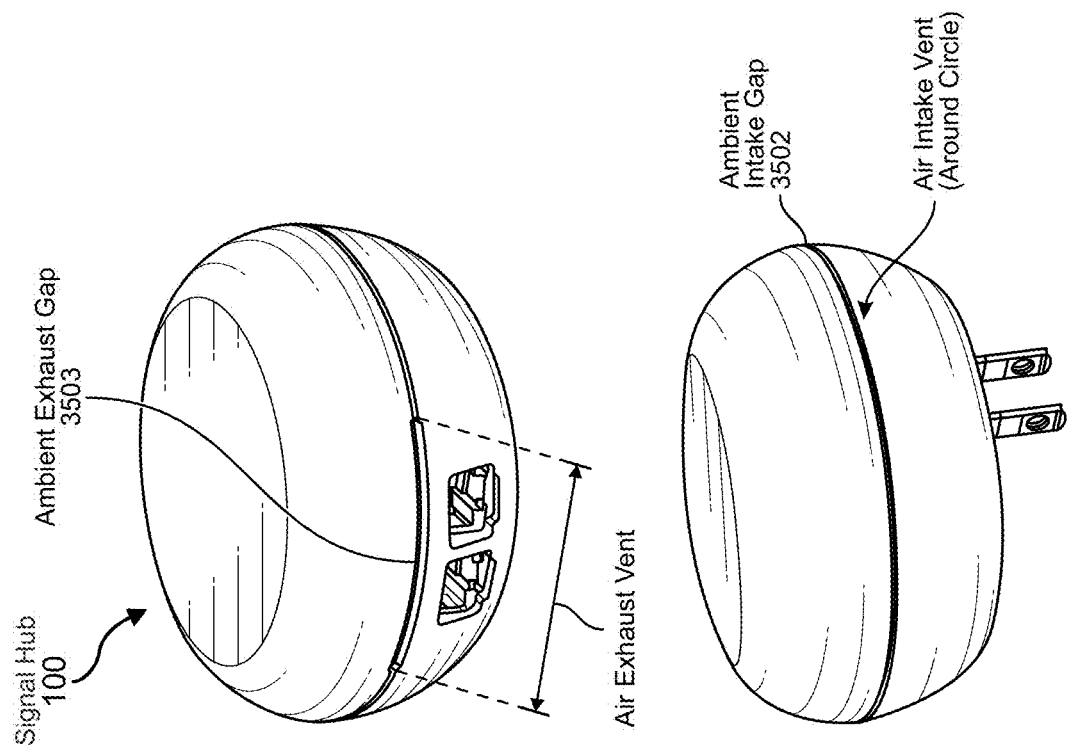
FIG. 36

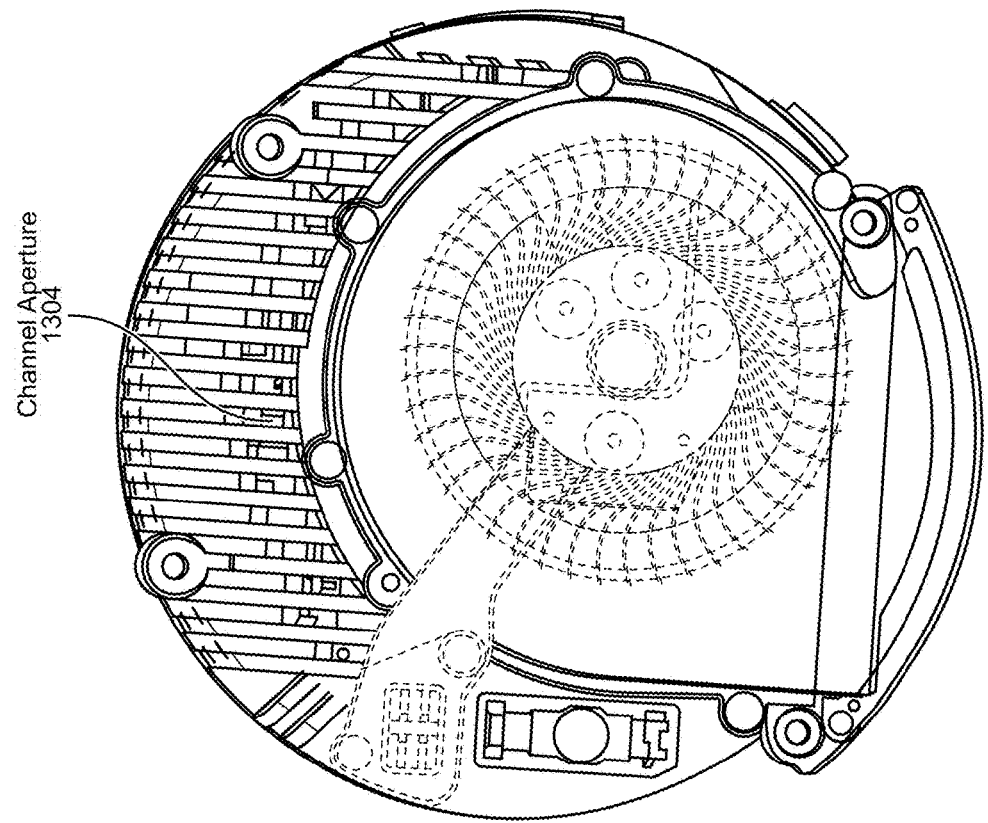
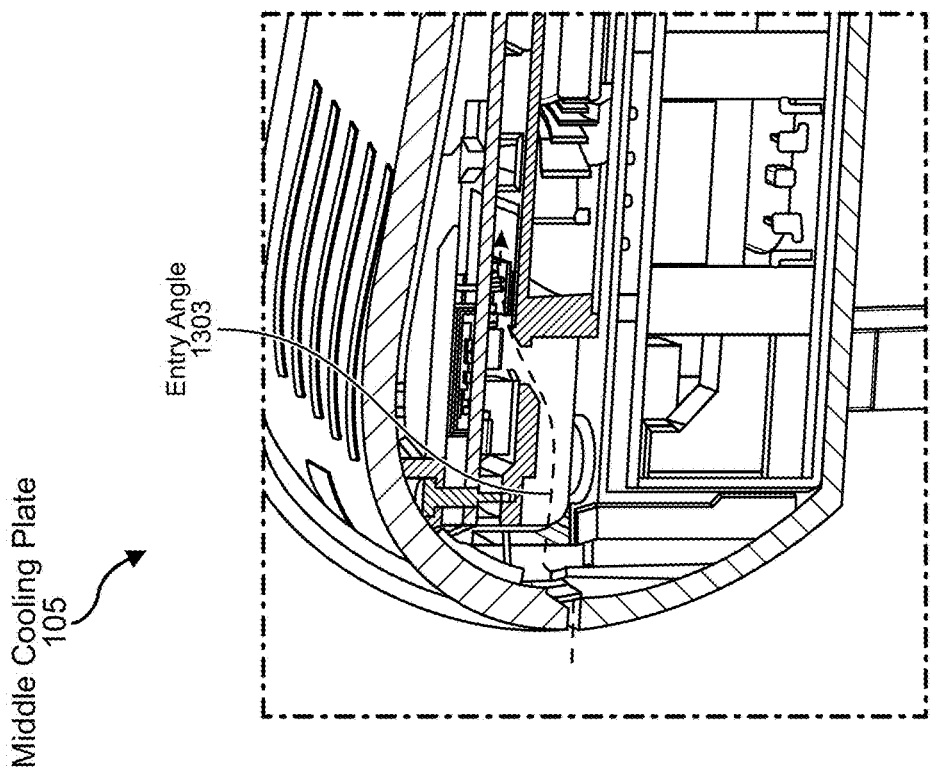
FIG. 45

SYSTEMS AND METHODS FOR COOLING CIRCUIT BOARD COMPONENTS IN A COMPACT SIGNAL HUB

FIELD OF THE DISCLOSURE

This disclosure pertains to system and methods for cooling compact electronic devices and antenna isolation. More particularly, the disclosure is directed to a system for cooling and electrically isolating Wi-Fi Access Points circuit boards in distributed Wi-Fi platforms.

SUMMARY OF THE DISCLOSURE

The present disclosure pertains to a novel signal hub, which integrates an advanced cooling system designed to efficiently manage heat dissipation within a compact electronic device. In some embodiments, the signal hub includes a top shell, an antenna carrier, a top cooling plate, a radio frequency (RF) board, an alternating current (AC) wire side plate, an exhaust fin, a middle cooling plate, a board-to-board (BTB) metal shield, an ethernet board, a top AC cover, an AC board, a bottom AC cover, a bottom cooling plate, a bottom cover, and screws.

In some embodiments, the cooling system is configured to address the challenges posed by increased airflow impedance as the volume of the signal hub decreases. This impedance inhibits heat transfer through air conduction, creating hotspots where air moves slowly or not at all. To mitigate the effects of air resistance, the signal hub features impedance-reducing elements that enable sufficient cooling for the components. For example, in some embodiments, the top shell includes a rounded profile and flow depression that directs airflow efficiently across the top cooling plate.

In some embodiments, an antenna carrier is configured to contour to the top shell, and supports a plurality of antennas, which are electrically coupled to the top cooling plate. This electrical coupling not only facilitates RF shielding but also aids in heat dissipation. The middle cooling plate, equipped with a fan that is configured to create a vacuum force that draws ambient air through the ambient air gap formed between the top shell and the bottom shell. In some embodiments, exhaust airflow is directed by an exhaust fin, which directs the majority of exhaust air away from the bottom shell, thereby preventing particle buildup and maintaining a clean operational environment.

In some embodiments, a BTB shield is configured to provide electromagnetic interference (EMI) protection and thermal management. In some embodiments, the BTB shield assists in thermal management by transferring thermal energy away from critical components. In some embodiments, a bottom cooling plate further aids in heat dissipation by directing airflow through fin channels, enhancing the overall cooling efficiency. The strategic placement and configuration of these components ensure that the signal hub maintains optimal performance, even in reduced volume configurations. This innovative cooling system not only addresses the thermal challenges associated with compact electronic devices but also enhances the reliability and longevity of the signal hub, as described with reference to the non-limiting example below.

DRAWING DESCRIPTION

The features and advantages of the disclosure will be apparent from the following description of some embodiments as illustrated in the accompanying drawings, in which reference characters refer to the same parts throughout the various views. The drawings are not necessarily to scale, emphasis instead being placed upon illustrating principles of the disclosure:

FIG. 8 shows a top view of an RF board according to some embodiments;

FIG. 9 illustrates a bottom view of an RF board according to some embodiments;

FIG. 36 shows a top sectional ambient air gap intake and exhaust profile in accordance with some embodiments;

FIG. 45 illustrates air flow through the channel apertures of the middle cooling plate in accordance with some embodiments;

DETAILED DESCRIPTION

Figure 1:
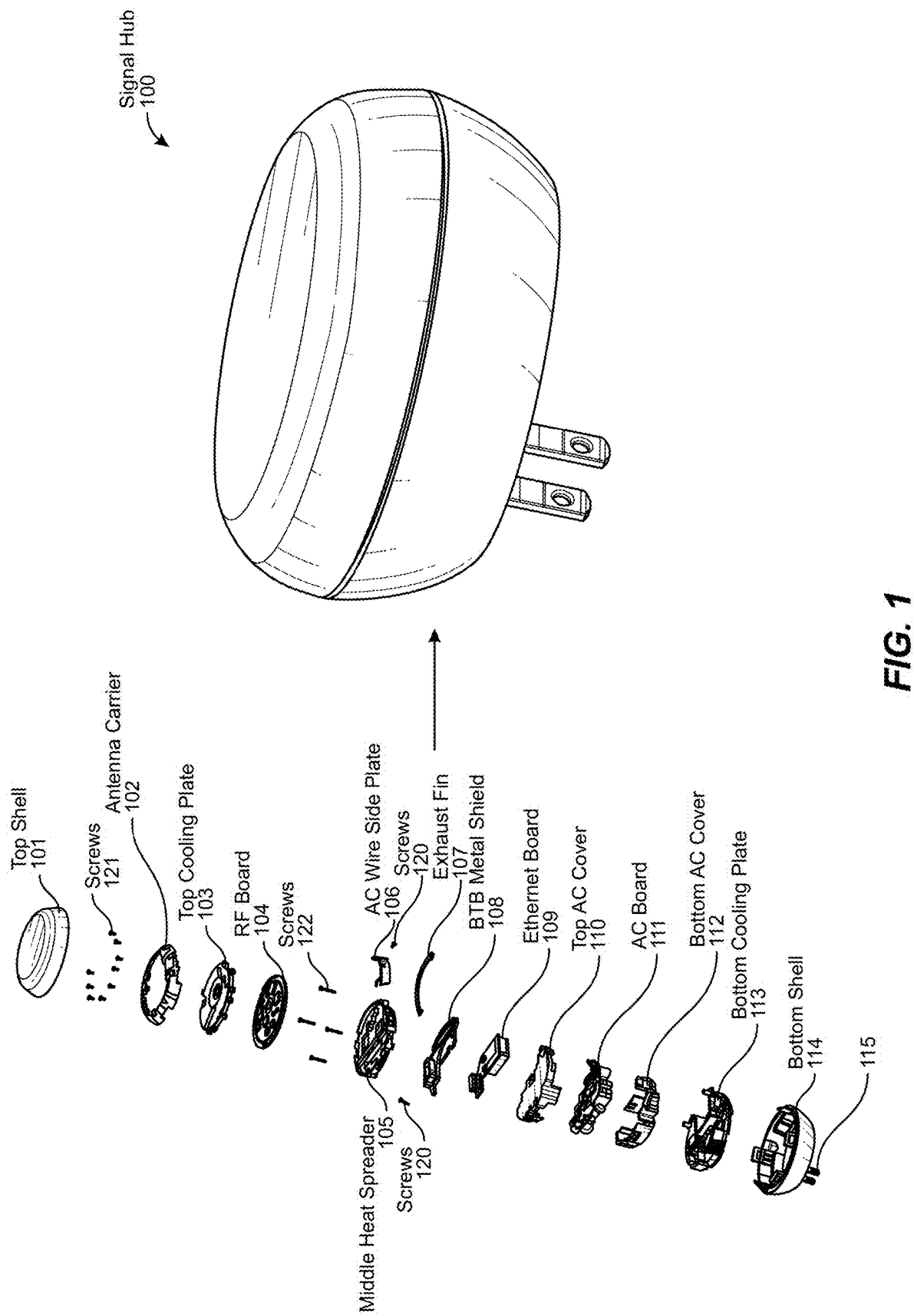
FIG. 1 illustrates an exploded view of the signal hub in accordance with some embodiments.

FIG. 1 shows an exploded view of a novel signal hub 100 that includes the cooling system described herein in accordance with some embodiments. In some embodiments, the signal hub 100 includes one or more of a top shell 101, an antenna carrier 102, a top cooling plate 103, a radio frequency (RF) board 104, an alternating current (AC) wire side plate 106, an exhaust fin 107, a middle cooling plate 105, a board-to-board (BTB) metal shield, an ethernet board 109, a top AC cover 110, an AC board 111, a bottom AC cover 112, a bottom cooling plate 113, a bottom cover, and/or screws 120. As used herein, the top of the signal hub 100 is defined by the top surface of the top shell 101, and the bottom of the signal hub 100 is defined by the bottom surface of the bottom cover. The top and bottom surfaces of the each of the afore mentioned components are defined by the surface facing the top or bottom cover when in the assembled position. A recitation of downward or upward conveys a direction toward the bottom surface or top surface, respectfully.

As the volume of the signal hub 100 decreases, the impedance of airflow increases, as elements of the signal hub 100 are moved closer to each other. This impedance inhibits heat transfer through air conduction, creating hotspots where air moves slowly or not at all. To combat this problem, the signal hub 100 cooling system features impedance reducing features that enable sufficient cooling for the signal hub 100 components.

Figure 3:
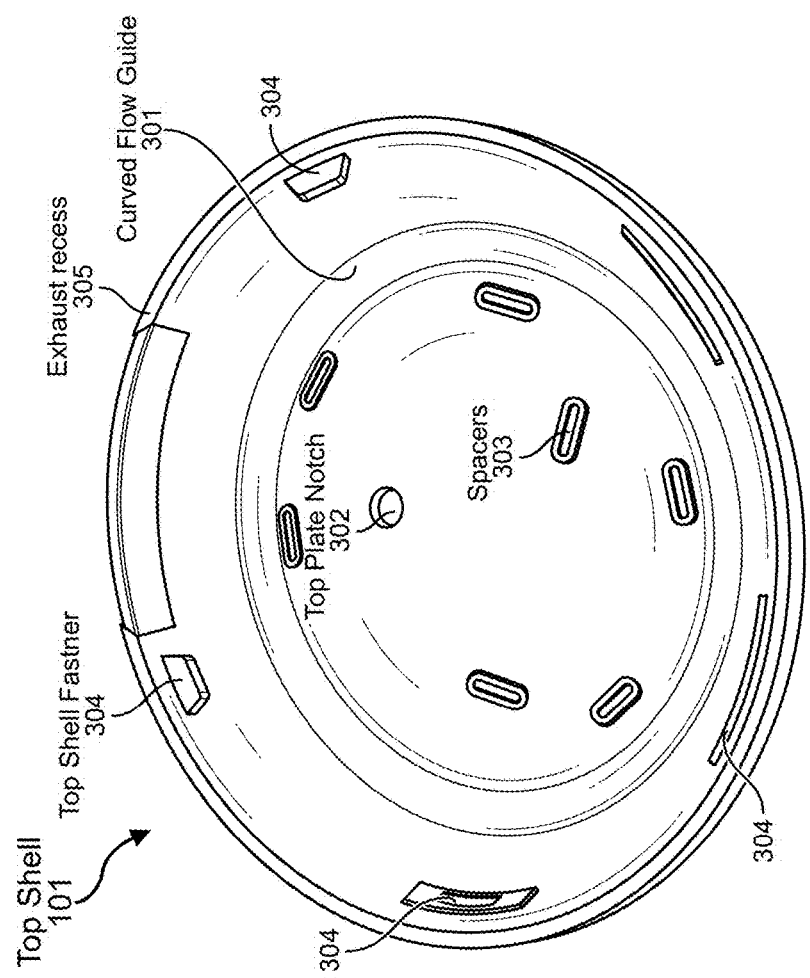
FIG. 3 shows a bottom portion of the cover in accordance with some embodiments.
Figure 2:
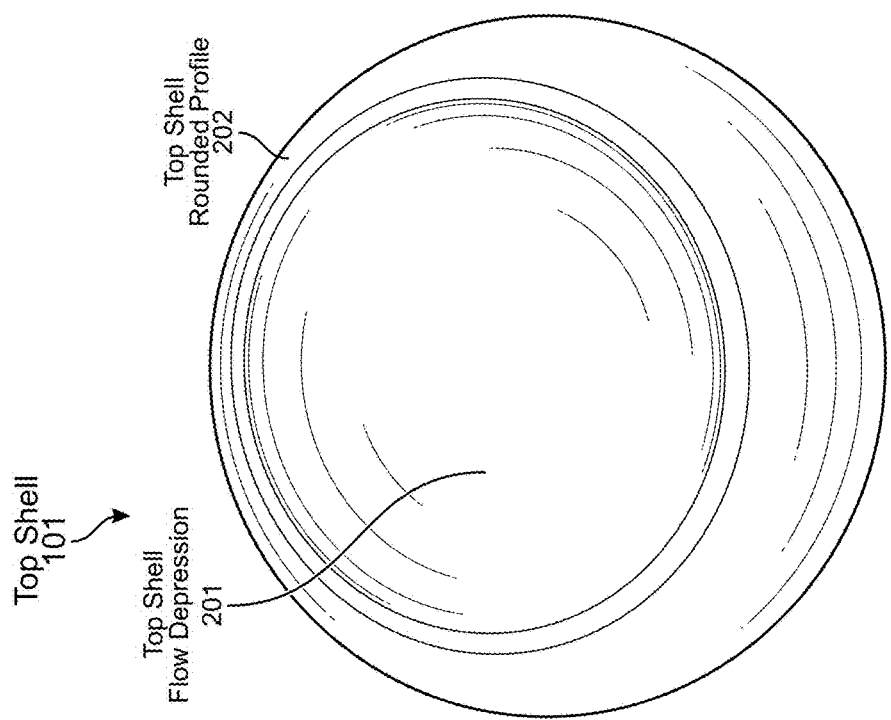
FIG. 2 shows the top shell in accordance with some embodiments.

For example, with regard to FIG. 2, in some embodiments, the top shell 101 includes a top shell rounded profile 202. In some embodiments, the rounded profile 202 does not include any sharp edges and/or angled changes in direction, which acts to maintain flow velocity and reduce energy losses due to friction and turbulence. In some embodiments, the top shell 101 includes a flow depression 201 extending downward from an upper most surface of the rounded profile 202, where the lowest portion of the flow depression 201 is offset from the center of the rounded profile 202 of the top shell 101. As shown in FIG. 3, the flow depression 201 creates a curved flow guide 301 configured to direct airflow to a flow depression 201 of the top cooling plate 103, discussed further infra.

In some embodiments, the bottom surface of flow depression 201 may include one or more spacers 303 configured to maintain an air flow gap between the flow depression bottom surface and an upper surface of the top cooling plate 103. In some embodiments, a top plate notch 302 is configured to mate with a first mating projection 608 extending from the top cooling plate upper surface. The first mating projection 608 acts to properly align the top cooling plate 103 to the top shell 101 during assembly, and/or acts to maintain a proper gap for airflow. In some embodiments, the top shell 101 includes one or more top shell fasteners 304 (e.g., tabs, protrusions, recesses) configured to mate with one or more respective bottom cover fasteners, further details of which are described below. In some embodiments, the top shell 101 includes an exhaust recess 305 configured to form an exhaust gap with an exhaust recess in the bottom shell 114.

In some embodiments, the top shell 101 includes an exhaust recess configured to cooperate with the flow blade to provide directional exhaust away from the bottom surface of the signal hub 100, where the flow blade and/or exhaust recess is configured to direct a majority of exhausted air away from a wall and/or electrical outlet when the signal hub 100 is plugged into the electrical outlet via the plug 115. the flow blade and/or exhaust recess is configured to direct a majority of air from the exhaust recess at an angle range of 3° to 50° toward the upper surface of the signal hub 100 relative to the exhaust recess and/or intake gap. In some embodiments, the angle range of the majority of exhaust flow is between 5° to 45°. This unique directional exhaust feature reduces particle buildup on the wall and/or electrical outlet that is carried by the exhausted air: further details are provided below with regard to assembled views of the signal hub 100.

Figure 4:
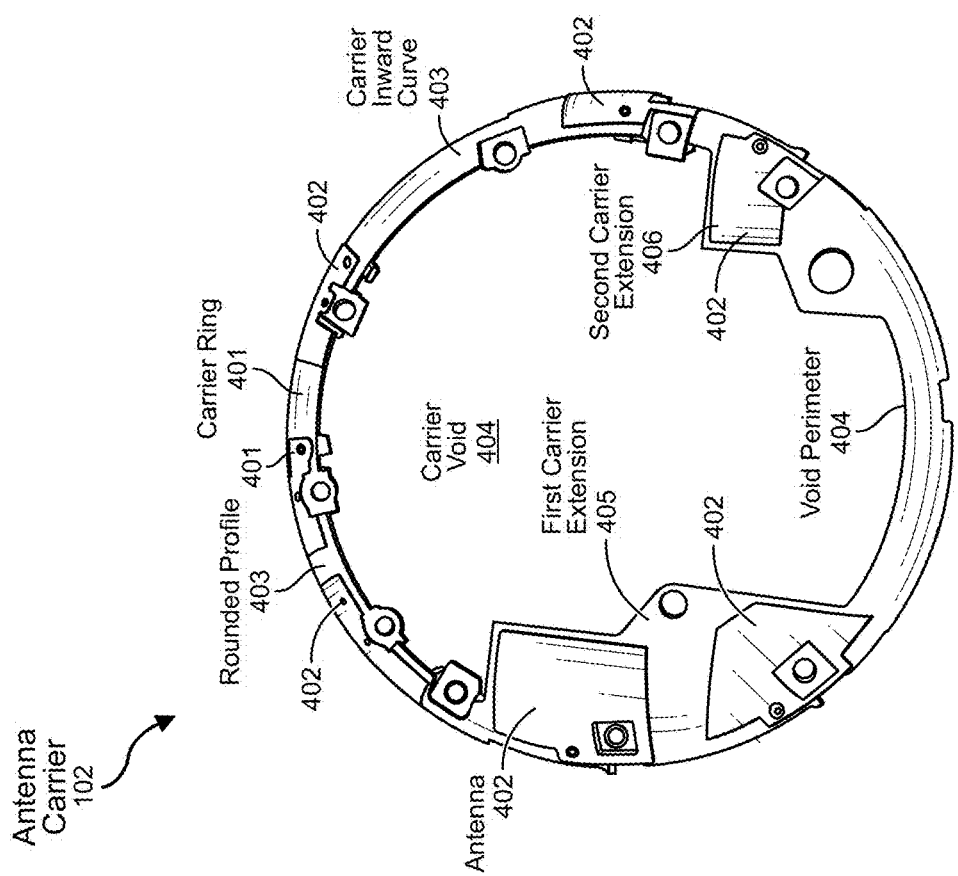
FIG. 4 depicts a top view of the antenna carrier in accordance with some embodiments.

Turning now to FIG. 4, a top view of the antenna carrier 102 is depicted in accordance with some embodiments. In some embodiments, the antenna carrier 102 includes a carrier ring that includes a carrier rounded profile configured to substantially follow and/or contour to (meaning formed to follow the shape of when assembled, as opposed to being flexible) the profile of the top shell rounded profile and/or the top cooling plate rounded profile. In some embodiments, the carrier ring 401 includes a carrier inward curve 403 configured to substantially match the contour of the curved flow guide 301, resulting in a contour fit with the bottom surface of the top shell 101, providing the benefit of less impedance to flow as discussed above. In some embodiments, the shape of the void perimeter of the carrier void 404 is configured to cooperate with the spacers 303 to ensure proper alignment when inserted into the top shell 101.

In some embodiments, the carrier ring 401 includes a first carrier extension 405. In some embodiments, the first carrier extension 405 is configured to be a continuation of the carrier contour of the flow guide, where the first carrier extension 405 provides an extension surface for an antenna pattern to extend. In some embodiments, the first carrier extension 405 is configured to provide a surface large enough for two antenna patterns to extend, where a total area of the antennas 402 defined by the two antenna patterns covers at least 50% of a top surface the first carrier extension 405. In some embodiments, the first carrier extension 405 includes a first mating aperture 504 as discussed, supra.

In some embodiments, the carrier ring 401 includes a second carrier extension 406. In some embodiments, the second carrier extension 406 is configured to be a continuation of the carrier ring 401 following the contour of the flow guide, where the second carrier extension 406 provides an extension surface for an antenna pattern to extend. In some embodiments, a total area of the antenna 402 defined by the antenna pattern on the second carrier extension 406 is configured to cover at between 30% and 50% of the top surface the second carrier extension 406. In some embodiments, the second carrier extension 406 includes a second mating aperture 505 as discussed above.

Figure 5:
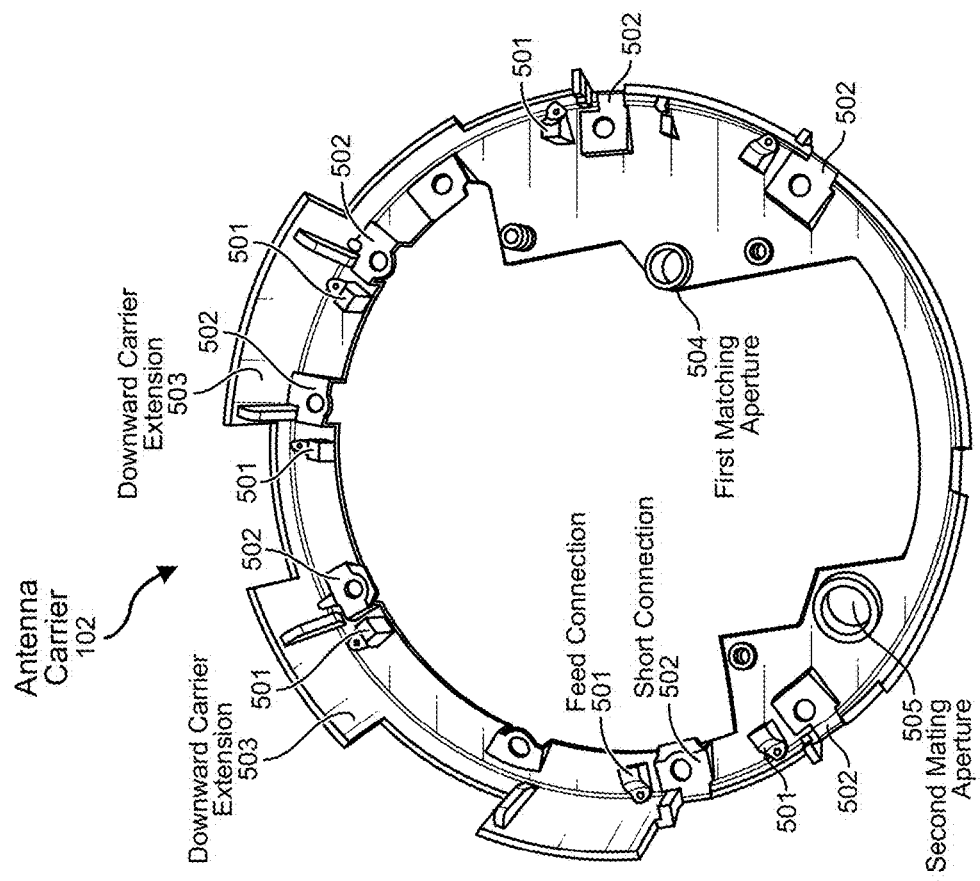
FIG. 5 illustrates a bottom view of the antenna carrier in accordance with some embodiments.

The antenna carrier 102 includes a plurality of antennas 402 distributed about the upper surface of the carrier ring 401. In some embodiments, one or more (e.g., all) of the plurality of. include a conductive plate conformed to the shape of the upper surface of the carrier ring 401. In some embodiments, the carrier ring 401 includes one or more downward extending carrier extensions, where each downward carrier extension 503 is configured to create additional surface area in a downward direction. In the non-limiting example provided in the figures, seven different antennas 402 are provided. In some embodiments, each antenna is spaced from a respective adjacent antenna, where each antenna includes a respective feed connection 501 and a short connection 502 located along the bottom surface, as shown in FIG. 5.

Figure 7:
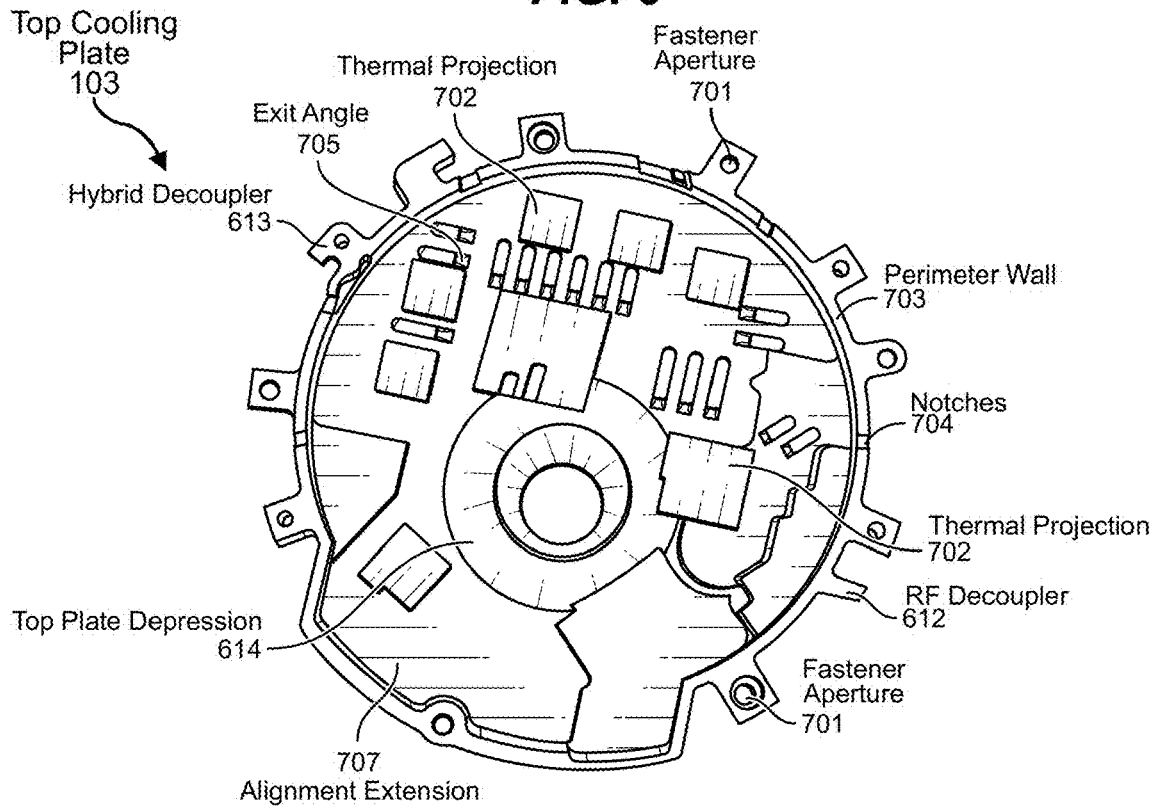
FIG. 7 depicts a bottom view of the top cooling plate in accordance with some embodiments.

In some embodiments, the short of one or more (e.g., all) of the plurality of antennas 402 is configured to align with and/or be coupled to a corresponding short fastener projecting from the top cooling plate 103. In some embodiments, screws 121 are configured to provide an electrical connection between a respective short and short fastener, where one or more short fasteners include a fastener aperture 701, as shown in FIG. 7, configured to mate with an RF board fastener aperture 807 on the RF board 104. In some embodiments, screws 122 are configured to fix together and/or make an electrical connection between RF board 104 and the middle cooling plate 105. In some embodiments, the electrical connections are configured to enable the top plate to function as an RF shield, reducing RF noise generated by other signal hub 100 components. In some embodiments, the shape of the short fastener is configured to add to and/or cooperate with a respective antenna to tune the antenna to a specific frequency.

In order to achieve a smaller signal hub 100 footprint, the antennas 402 on the carrier ring 401 are brought closer together. When two antennas 402 are placed close to each other, they can interfere with each other due to mutual coupling, which impacts their performance. This interference can occur through electrical coupling (via currents in the connected circuit provided by the top plate) and over-the-air coupling (via electromagnetic waves). Current coupling occurs in the near-field region, where the electrical and magnetic fields generated by one antenna induce currents in the other. This interaction can modify the impedance of each antenna, leading to detuning, reduced efficiency, and altered radiation patterns. Over-the-air coupling occurs in the far-field region, where the radiated electromagnetic waves from one antenna interact with the other, causing unwanted signals or noise to be received. To overcome the problem with antenna interference, in some embodiments, the top cooling plate 103 includes one or more RF decouplers 612, further described in relation to FIGS. 6 and 7.

In some embodiments, the RF decouplers 612 are configured to reduce and/or substantially eliminate RF coupling between two adjacent antennas 402. In some embodiments, one or more decouplers are configured to reduce current coupling between adjacent antennas 402. In some embodiments, one or more decouplers are configured to limit the flow of unwanted induced currents between antennas 402 by introducing impedance in the shared electrical path. In some embodiments, one or more decouplers are configured to provide impedance matching to reduce reflections and detuning caused by antenna proximity.

In some embodiments, one or more decouplers are configured to reduce over-the-air coupling between adjacent antennas 402. In some embodiments, one or more decouplers are configured to redirect electromagnetic energy to prevent it from radiating directly into the neighboring antenna. In some embodiments, one or more decouplers are configured to introduce out-of-phase signals to cancel over-the-air coupling through destructive interference. In some embodiments, one or more decouplers are configured to provide shielding by incorporating metallic and/or grounded structures that act as a barrier to electromagnetic waves.

In some embodiments, one or more decouplers are configured to be positioned at specific locations relative to the antennas 402 to maximize the decoupling effect. In some embodiments, one or more decouplers are configured to be positioned at locations relative to the antennas 402 to optimize their ability to block mutual coupling. In some embodiments, one or more decouplers are configured to be placed equal distance between two antennas 402, for example when such placement maximizes signal isolation. In some embodiments, one or more decouplers are configured to be offset from a midpoint between two antennas 402, for example to target specific directions of electromagnetic field propagation. In some embodiments, one or more decouplers are configured to have their proximity to the antennas 402 tuned based on the system's signal requirements and/or coupling characteristics. In some embodiments, multiple RF decouplers are configured to be strategically positioned between antennas 402 to block different coupling pathways. In some embodiments, one or more RF decouplers 612 include a hybrid decoupler 613. In some embodiments, a hybrid decoupler 613 includes a fastener aperture 701, where the hybrid decoupler 613 is configured to act as both a decoupler and a fastener for the antenna carrier 102 and or one or more other signal hub 100 components.

Figure 6:
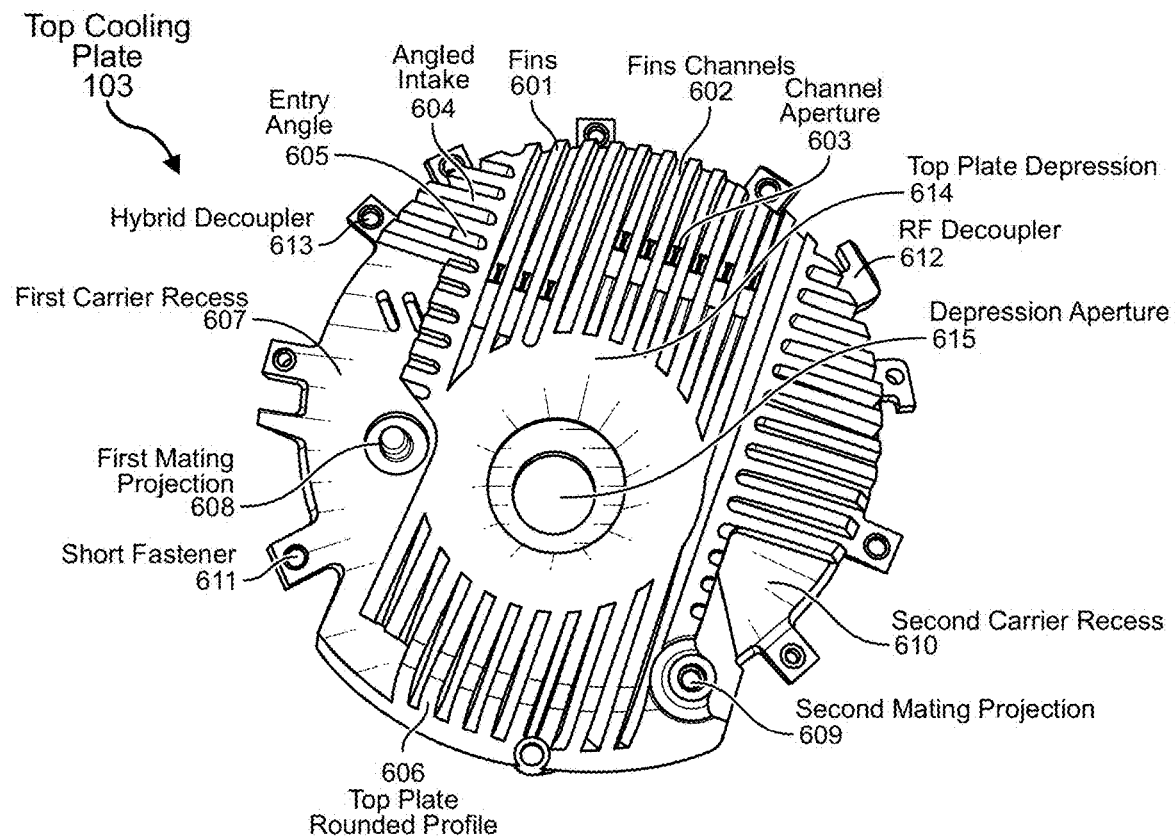
FIG. 6 shows a top view of the top cooling plate in accordance with some embodiments.

Still referring to FIG. 6, the top cooling plate 103 may include a top plate rounded profile 606 configured to contour to the shape of the bottom of the antenna carrier 102, as discussed above. The top plate rounded profile 606 may, at least in part, be formed from the fins 601 projecting up from a lower surface, where the fins' projections follow with and/or contour to the top shell flow depression 201, which reduces airflow resistance. In some embodiments, the fins 601 form fin channels 602 that extend along the lower surface, where one or more fin channels 602 extend from the top plate rounded profile 606 to an upper edge of a top plate depression 614, where the top plate depression 614 is configured to direct air from multiple directions down toward a depression aperture 615. When the signal hub 100 is assembled, in some embodiments, the depression aperture is configured to substantially align with a lowest portion of the top shell flow depression 201. In some embodiments, the spacing between a surface of the top plate depression 614 and the bottom surface of the top shell 101 increases from the edge of the top plate depression 614 to the depression aperture 615, enabling control of the velocity of the collective air coming from all directions.

In some embodiments, one or more fin channels 602 include one or more angled intakes 604. In some embodiments, each angled intake 604 is configured to direct air flow at an angle to a portion of the RF board 104 and/or a specific component of the RF board 104 positioned below when signal hub 100 is assembled. In some embodiments, each angled intake 604 includes a downward sloping entry angle 605 on the air upstream side, visible from the top view of FIG. 6, and a corresponding downward sloping exit angle 705 on the air downstream side of the angled intake 604, as shown in the bottom view in FIG. 7. In some embodiments, these angled intakes reduce air resistance due to abrupt changes, further improving the air flow and/or heat transfer characteristics of the cooling system described herein.

In some embodiments, the upper surface of the of the top cooling plate 103 may include a first carrier recess 607 configured to mate with and/or conform to a first carrier extension 405 of the antenna carrier 102. In some embodiments, the upper surface of the of the top cooling plate 103 may include a second carrier recess 610 configured to mate with and/or conform to a second carrier extension 406 of the antenna carrier 102. This allows the contours of the carrier extensions to be maintained while allowing the top cooling plate 103 to provide the aforementioned RF shielding. In some embodiments, the first carrier recess 607 includes a first mating projection 608 configured to engage with a first mating aperture 504 of the carrier ring 401 and/or the top plate notch 302 for alignment and/or support. In some embodiments, the second carrier recess 610 includes a second mating projection 609 configured to engage a second mating aperture 505 of the carrier ring 401, ensuring proper placement and support for the antenna carrier 102.

Referring now to FIGS. 7 and 8, the top plate cover may include an alignment extension 707 configured to mate with and/or contour to a board extension 808 portion of the RF board 104, ensuring proper alignment between components. In some embodiments, the bottom surface of the top cooling plate 103 includes one or more thermal projections 702 configured to decrease the distance between the bottom surface and a heat generating components of the RF board 104. In some embodiments, the thermal projections 702 are configured to decrease the distance to one or more board components and/or thermal shields covering one or more board components.

In some embodiments, a perimeter wall 703 projects from a perimeter of the bottom surface of the top cooling plate 103. In some embodiments, the perimeter wall 703 is configured to mate and/or make contact with an outer portion of the RF board 104 adjacent a perimeter of the RF board 104. In some embodiments, the perimeter wall 703 is configured to cooperate with one or more grounding planes positioned along the outer portion of the RF board 104. In some embodiments, one or more grounding planes may comprise a connection for an antenna short, be configured to tune an antenna to a specific frequency, and/or be configured to cooperate with the top cooling plate 103 to tune an antenna frequency.

In some embodiments, the perimeter wall 703 includes one or more notches 704 to provide space for components (e.g., traces) on the circuit board, where the one or more notches 704 may allow a relatively small amount of air flow into the cavity formed by the perimeter, compared to the plurality of channel apertures 603. The depression aperture 615, in some embodiments, includes a lower outer surface configured to make contact with a depression contact area 1003 on the top of the RF board 104, where air drawn in through one or more channel apertures 603 is configured to flow around a lower and upper surface of the top plate depression 614, driven by vacuum force provided by the fan 1306.

In some embodiments, the vacuum force of the fan is configured to pull the air from one or more sides of the top cooling plate 103 over the top plate depression 614, where heat from the Wi-Fi chip and/or CPU chip is transferred to the top cooling plate 103 by conduction for distribution, and/or away from the depression aperture 615 by air convection and/or the one or more channel apertures through the air flow aperture 802 in the RF board 104. This allows for an additional board contact point for dissipating heat from the top of the RF board 104. In some embodiments, one or more angled apertures are configured to direct airflow to the airflow aperture, where the angled apertures are configured to cooperate with the fin channels 602 to cause a directional air flow toward the air flow aperture 802 in the RF board 104 and/or around the top plate depression 614, further reducing air resistance caused by drastic changes in direction. In some embodiments, the top plate depression 614 is positioned such that the air flow to the depression aperture 615 is directed to an area of the board that produces the most heat, such as an area at or adjacent to the CPU chip and/or the Wi-Fi chip.

In some embodiments, the top of an RF board 104 includes one or more of a Bluetooth Integrated Circuit (BT IC) 801, an embedded MultiMediaCard (eMMC) 803, a 2G/6G Power Amplifier (PA) 804, a 1G Physical Layer Integrated Circuit (PHY IC) 805, and a 5G Power Amplifier (PA) 806. In some embodiments, the BT IC 801 is configured to connect to a compact omnidirectional antenna configured for short-range wireless communication using Bluetooth® protocols for frequencies in the 2.4 GHz band.

In some embodiments, the eMMC 803 serves as non-volatile storage and supports the data management needs of the RF board's communication systems. In some embodiments, the 2G/6G PA 804 is configured to connect to dual-band or wideband antennas, where in some embodiments the antennas 402 are capable of handling both 2G frequencies (e.g., 800-1900 MHZ) and/or 6G frequencies (e.g., 30-300 GHz range).

In some embodiments, the 5G PA 806 is configured to connect to highly directional millimeter-wave (mmWave) antennas for 5G's high-speed, low-latency communication at frequencies between 24 GHz and 52 GHz. In some embodiments, these antennas are configured for beamforming and precise signal directionality for enhanced performance in dense urban environments. In some embodiments, the 1G PHY IC 805 is configured to connect to an ethernet port, enabling wired communication via ethernet cables for high-speed data transfer.

In some embodiments, as shown in FIG. 9, includes one or more of a central processing unit (CPU) chip 904, a Wi-Fi chip 903, and a tool-free wire connection 905 (e.g., POKE-HOME) for the ethernet board 109.

a bottom of the RF board 104 includes a Wi-Fi chip 903, which may be part of a Wi-Fi Integrated Circuit (Wi-Fi IC), configured to connect to a patch antenna array located on the antenna carrier 102, where the array comprises seven patch antennas in this non-limiting example. These antennas are optimized for the dual-band (2.4 GHz and 5 GHZ) or tri-band (2.4 GHz, 5 GHZ, and 6 GHz) frequencies used for Wi-Fi communication, providing directional or omnidirectional coverage depending on the configuration, in accordance with some embodiments. In some embodiments, one or more antennas compatible with both Bluetooth (BT IC) and Wi-Fi (Wi-Fi IC) components, as these devices operate on the same or overlapping frequencies. In some embodiments, the 5G PA and 6G PA use patch antennas for the specific frequency bands of those components. In some embodiments, the 2G PA may be coupled to a whip or dipole antenna.

Figure 10:
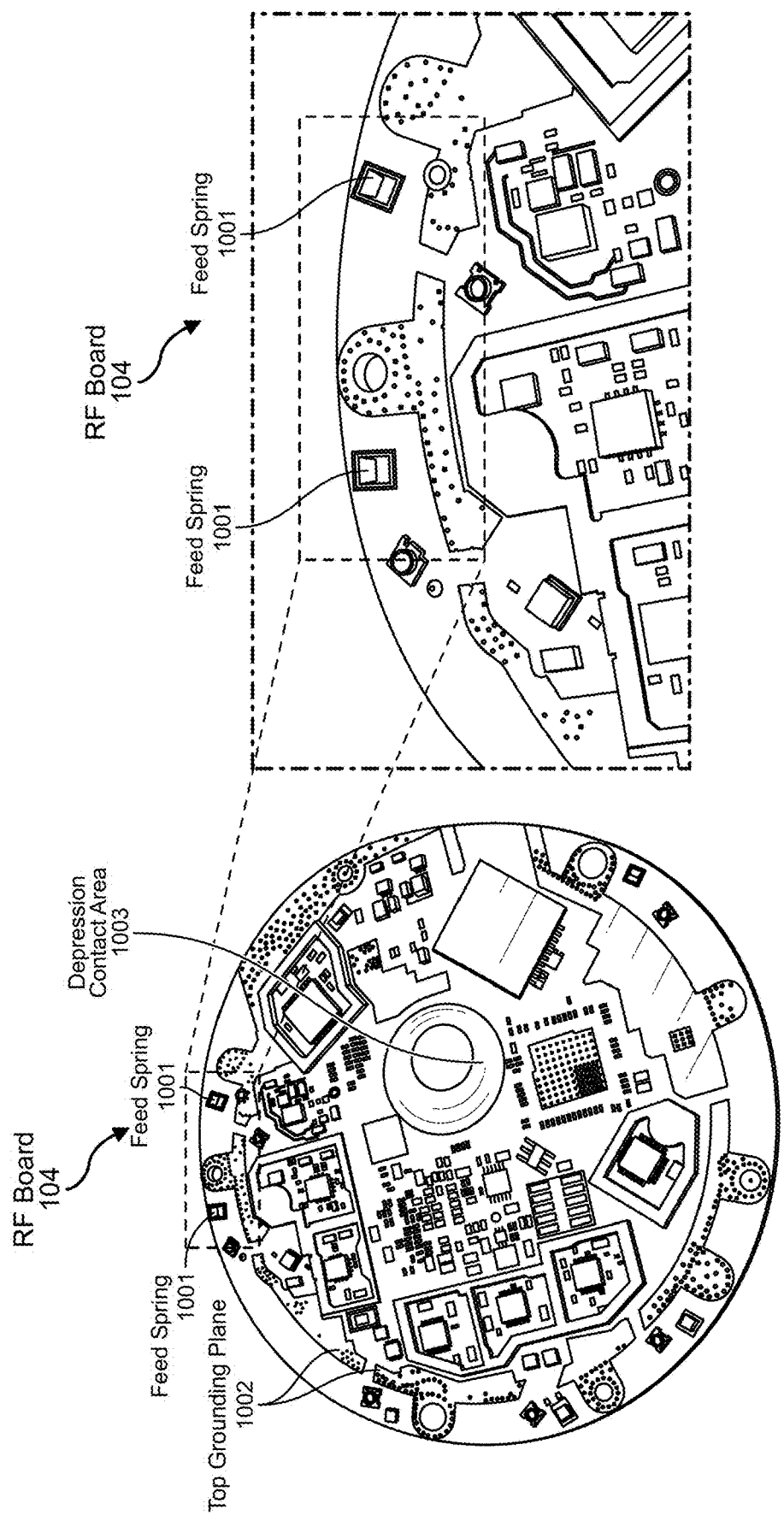
FIG. 10 illustrates a zoomed view of the top of the RF board shown in FIG. 8 according to some embodiments.

FIG. 10 shows a zoomed view of the feed springs 1001 of the top of the RF board 104 of FIGS. 8 and 9 in accordance with some embodiments. Feed springs 1001, while effective for maintaining electrical contact, are particularly vulnerable to deformation when subjected to inadvertent force or mishandling. During assembly, operators may unintentionally catch the edge of the feed spring 1001 with their fingers or tools, causing the feed spring 1001 to bend, misalign, or lose its elasticity. Such damage can prevent the feed spring 1001 from maintaining proper contact with the antenna feed, resulting in unreliable connections or complete disconnection. Additionally, bending the feed spring 1001 can exert stress on the solder joints or pads on the RF board 104, potentially damaging these connections or cracking the PCB substrate.

To solve this problem, in some embodiments, an edge and/or end of the feed spring 1001 is configured to face an inner portion of the board. In a C-shaped feed spring 1001, the open end of the C-shape is substantially directed to the center of the board, and/or a curved portion of the feed spring 1001 is substantially directed to an outer edge of the RF board 104. In some embodiments, the orientation of the feed spring 1001 on the RF board 104 is configured to prevent an object or user from pulling the edge of the feed spring 1001 upward when holding the edge of the RF board 104.

Figure 11:
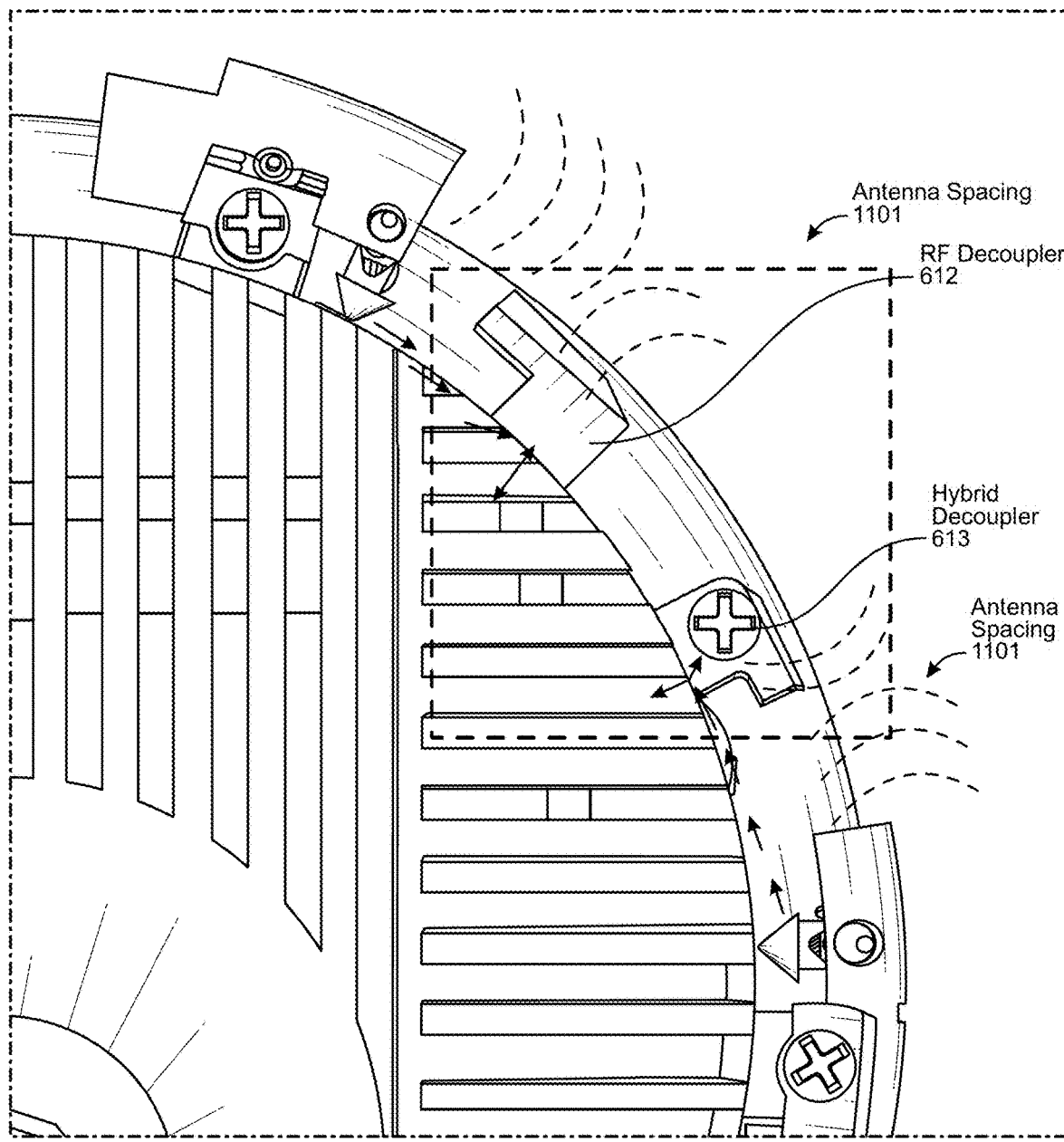
FIG. 11 shows an assembled view of antennas coupled to the top cooling plate and RF board in accordance with some embodiments.

FIG. 11 shows an assembled view of antennas 402 coupled to the top cooling plate 103 and RF board 104 in accordance with some embodiments, where the carrier ring 401 has been hidden to illustrate the different points of connection. In this non-limiting example, multiple decouplers separate the two antennas 402, where one of the antennas 402 is a hybrid decoupler 613 securing a portion of the carrier ring 401 to the top cooling plate 103 while also providing one or more of the decoupling functions as described above. In some embodiments, antennas 402 are spaced from an adjacent decoupler at an antenna spacing 1101 of $\lambda/4$, where the wavelength (2) is inversely proportional to the frequency of operation, as well as a decoupler size proportional to this wavelength, to achieve a desirable parasitic resonance. This parasitic resonance is configured to effectively cancel coupling mechanisms between antennas 402 by leveraging the decoupler's "weak" resonance properties. By aligning the decoupler's resonance characteristics with the operating frequency of the antennas 402, the decoupler can reduce both over-the-air coupling and current-induced coupling, improving isolation and overall system performance.

Figure 13:
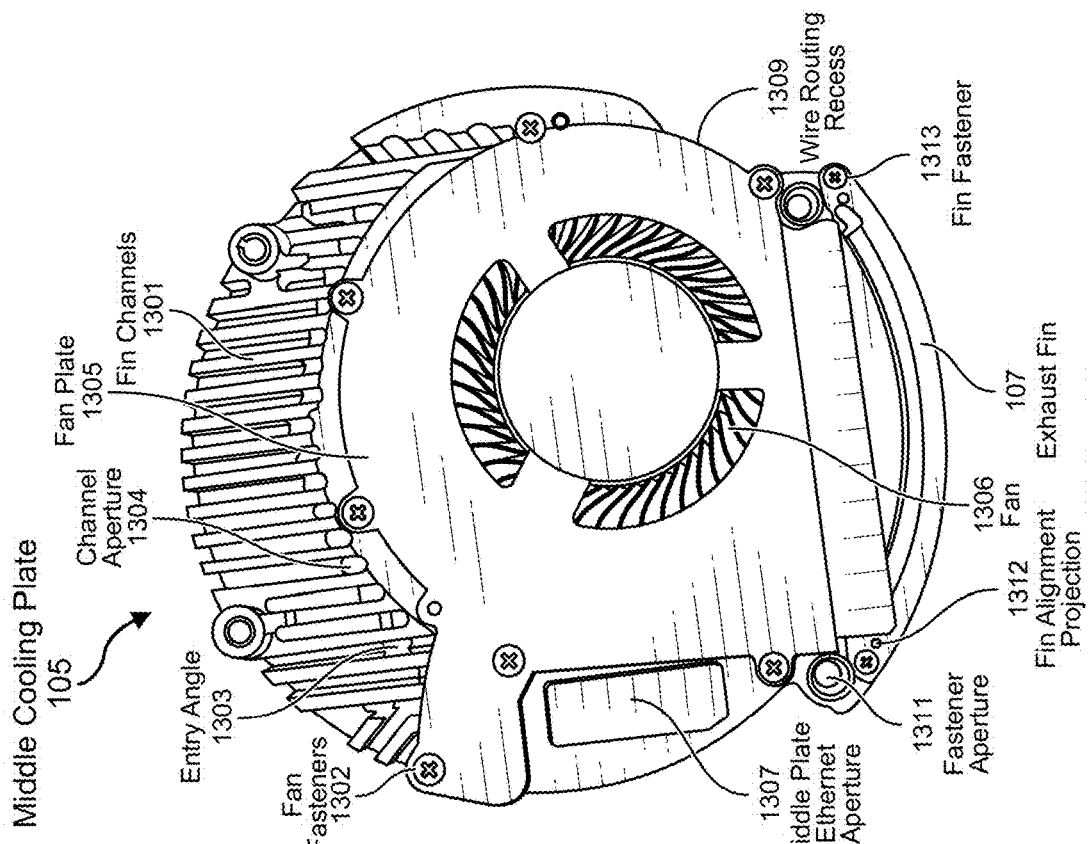
FIG. 13 depicts a bottom view of the middle cooling plate in accordance with some embodiments.
Figure 12:
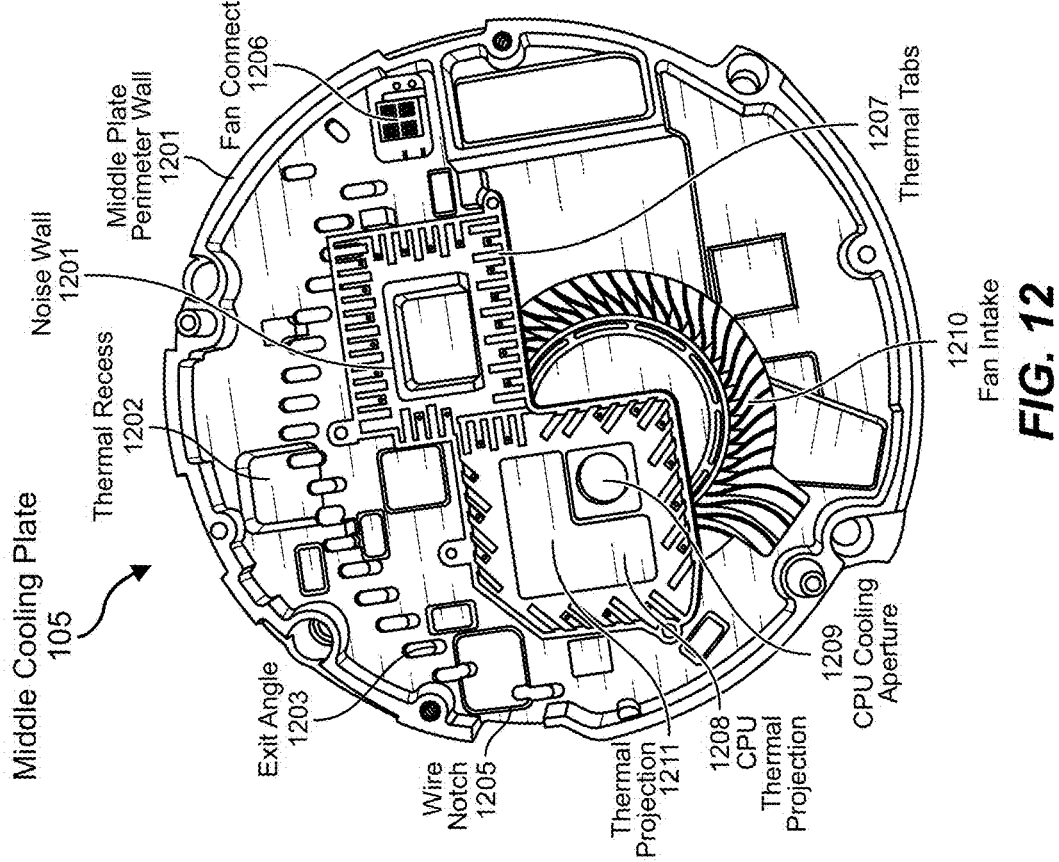
FIG. 12 depicts a top view of the middle cooling plate in accordance with some embodiments.

Turning now to FIGS. 12 and 13, a top and bottom view, respectively, of the middle cooling plate 105 is depicted in accordance with some embodiments. In some embodiments, the top of the middle cooling plate 105 includes one or more thermal projections 1211 and/or thermal recesses 1202. In some embodiments, the bottom portion of the middle cooling plate 105 includes a CPU thermal projection 1208, where the CPU thermal projection 1208 is configured to extend downward with the location of two perimeter sides substantially matching two perimeter sides of the CPU chip. In this non-limiting example, the CPU thermal projection 1208 includes a substantially L-shaped profile, where approximately three-quarters of the CPU thermal projection 1208 is configured to absorb heat produced by the CPU chip through conduction, such as through a thermal pad.

In some embodiments, at least one area of the middle cooling plate 105 in an area above the CPU chip, and/or defined by a perimeter of the CPU chip, when assembled, includes a CPU cooling aperture 1209. In some embodiments, the CPU cooling apertures include a diameter of 2-10 mm (e.g., 5 mm) depending on the size of the CPU chip and/or cooling requirements. In some embodiments, the CPU cooling aperture 1209 is configured to draw air produced by the vacuum force of the fan 1306 directly over at least a portion of the CPU chip, increasing the thermal efficiency of the system. In some embodiments, the middle cooling plate includes an aperture for a fan connector 1206 configured to make an electrical connection to the AC board 111. In some embodiments, in accordance with the cooling system described herein, at least a first portion of the upper surface of the CPU chip (the portion not facing the board) is configured to be cooled by conduction, where at least a second portion of the upper surface of the CPU chip is configured to be cooled by air flow and/or convection. In some embodiments, the area of the first portion is larger than the second portion. In some embodiments, the area of the second portion is larger than the area of the first portion.

In some embodiments, one or more thermal projection and/or recesses are at least partially surrounded by a plurality of thermal tabs 1207. In some embodiments, the thermal tabs 1207 provide additional thermal transfer, protection of debris, and/or RF shielding for one or more board components, which include the CPU chip and Wi-Fi chip in this non-limiting example. In some embodiments, a thermal tab 1207 can be positioned underneath a thermal contact block of noise wall 1204, which can be utilized for thermal conduction. For example, the die of a CPU chip 904 (discussed infra) may be a hottest portion of the CPU chip 904, but its size is not the largest within such chip; therefore, a contact block can increase and/or expand, and/or squeeze a thermal pad 1207 to follow a contact block's shape to have more contact, which can include sides of the die, and/or enhance thermal conduction, inter alia.

In some embodiments, one or more middle plate fin channels include one or more angled intakes. In some embodiments, similar to the top cooling plate 103, each angled intake is configured to direct air flow at an angle to a portion of the RF board 104 and/or a specific component of the RF board 104. In some embodiments, each angled intake includes a downward sloping entry angle 1303 on the air upstream side, visible from the bottom view of FIG. 13, and a corresponding downward sloping exit angle 1203 on the air downstream side of the angled intake, as shown in the top view in FIG. 12. In some embodiments, the middle plate fin channels 1301 and/or angled channel apertures 1304 are configured to direct air to the fan intake 1210. To ensure directional follow around and/or over one or more RF board 104 components, in some embodiments, the middle cooling plate 105 includes a middle plate perimeter wall 1201, which make cooperated with a with one or more bottom grounding planes (e.g., a single grounding plane in this non-limiting example) positioned at or near the perimeter of the bottom surface of the RF board 104, to create an enclosure for the bottom of the RF board 104, similar to the enclosure created by the top cooling plate 103. Also like the top cooling plate 103, the middle cooling plate 105 is electrically coupled to the bottom grounding plane 902 shown in FIG. 9, and/or is configured to provide RF shielding for the RF board 104 and/or the one or more antennas 402, serving a dual function of a heat dissipator and an RF shield. In some embodiments, the middle cooling plate 105 includes one or more fastener apertures 1311 to fix the plate in a fixed position.

Referring now to the bottom view of the middle cooling plate 105 shown in FIG. 13, the fan 1306 is coupled to the fan plate, which is in turn coupled to the middle cooling plate 105 by one or more fan fasteners 1302. A middle plate ethernet aperture 1307 enables the connection of the ethernet board 109 (which may be generally referred to herein as a signal port board) to the ethernet board 109. In some embodiments, the ethernet board 109 (e.g., RJ45) is configured to make a tool-free rigid connection 901 to the ethernet board 109, where the ethernet board 109 is configured to plug into a receptacle of the ethernet board 109 (or vice versa) in accordance with some embodiments. In some embodiments, the middle plate includes an AC board wire notch 1205 configured to draw enable tool free electric coupling of the RF wires 2501 from the AC board 111 to the RF tool-free connection 905 when the middle cooling plate 105 is coupled to the RF board 104. In some embodiments, relatively small amount of space provided by the wire notch 1205 may cooperate with one or more apertures in the top protective cover and/or bottom protective cover, promoting airflow across the AC board components.

Figure 14:
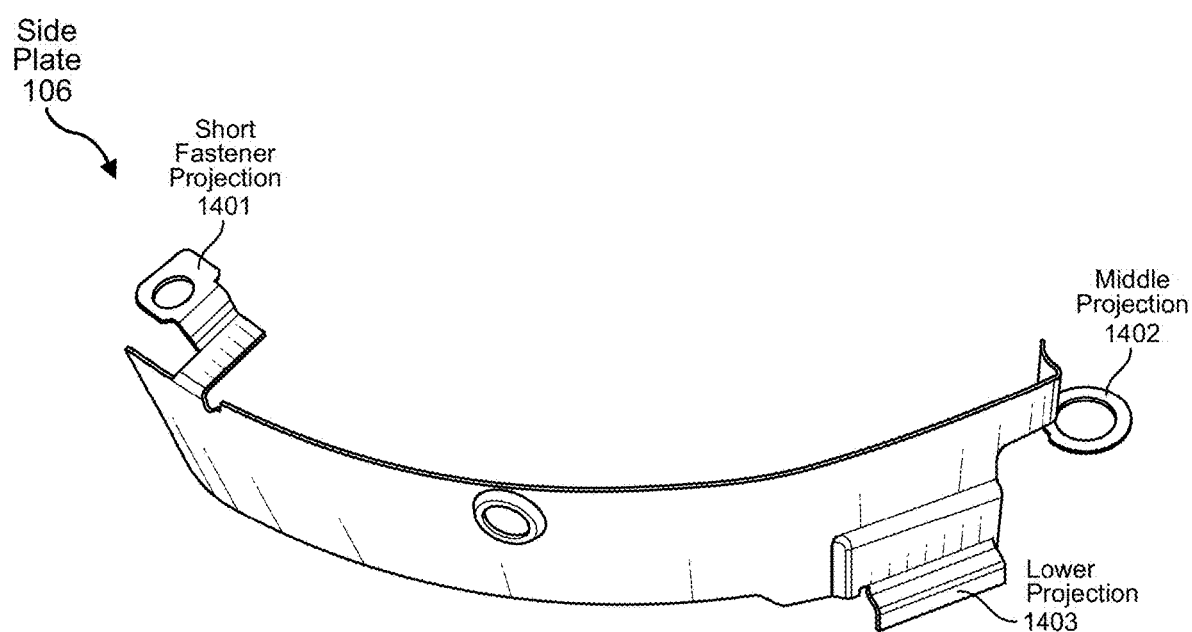
FIG. 14 shows the side plate configured to cover the wire routing recess in accordance with some embodiments.

In some embodiments, the middle cooling plate 105 may include a wire routing recess 1309 configured to contain and/or guide RF wires 2501 extending from the AC board 111 to the tool-free connection 905 on the lower surface of the RF board 104. In some embodiments, the middle cooling plate 105 includes a detachable side plate 106, illustrated in FIG. 14, where the detachable side plate 106 is configured to secure the RF wires 2501 in the wire routing recess 1309. In some embodiments, the side plate 106 is configured to provide electrical shielding for the RF board 104 and/or antenna carrier 102 to reduce noise induced from the current flow through the RF wires 2501. In some embodiments, the side plate 106 includes a short fastener projection 1401 configured to electrically couple the side plate 106 to one or more of a short fastener 611, a hybrid decoupler 613, and a top grounding plane 1002. In some embodiments, the electrical coupling enables the side plate 106 to become part of an antenna, and/or be used for tuning an antenna, coupled to the same short fastener 611. In some embodiments, the side plate 106 includes a middle projection 1402 configured to couple the side plate 106 to the middle plate, securing the side plate 106 in position and/or creating an electrical connection for shielding and/or tuning. In some embodiments, the side plate 106 may include a lower projection 1403 extending from a bottom portion of the side plate 106, where the lower projection 1403 is configured to guide at least a portion of the wires from the AC board 111 into the wire routing recess 1309.

Figure 15:
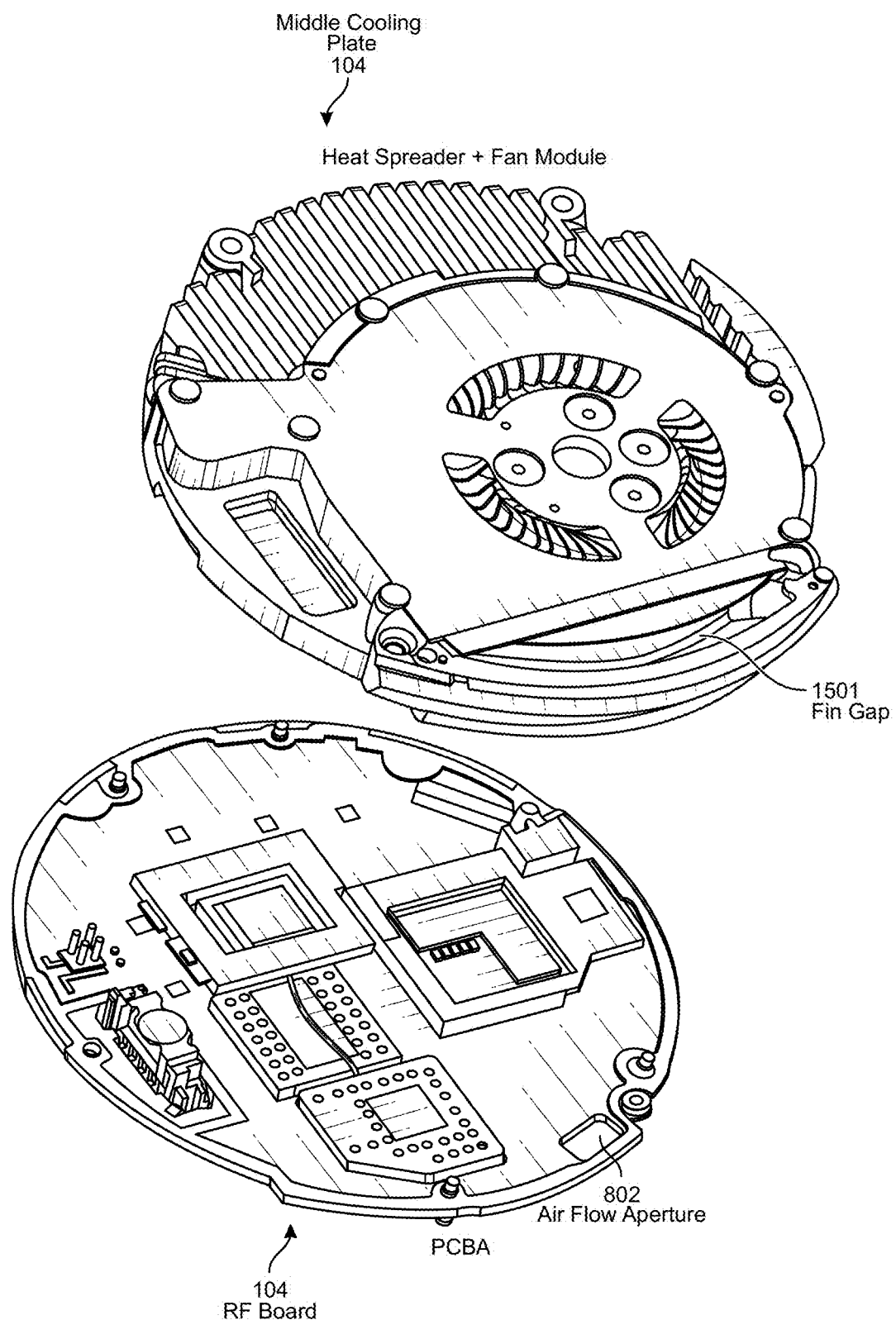
FIG. 15 illustrates the middle cooling plate alignment with the RF board in accordance with some embodiments.
Figure 16:
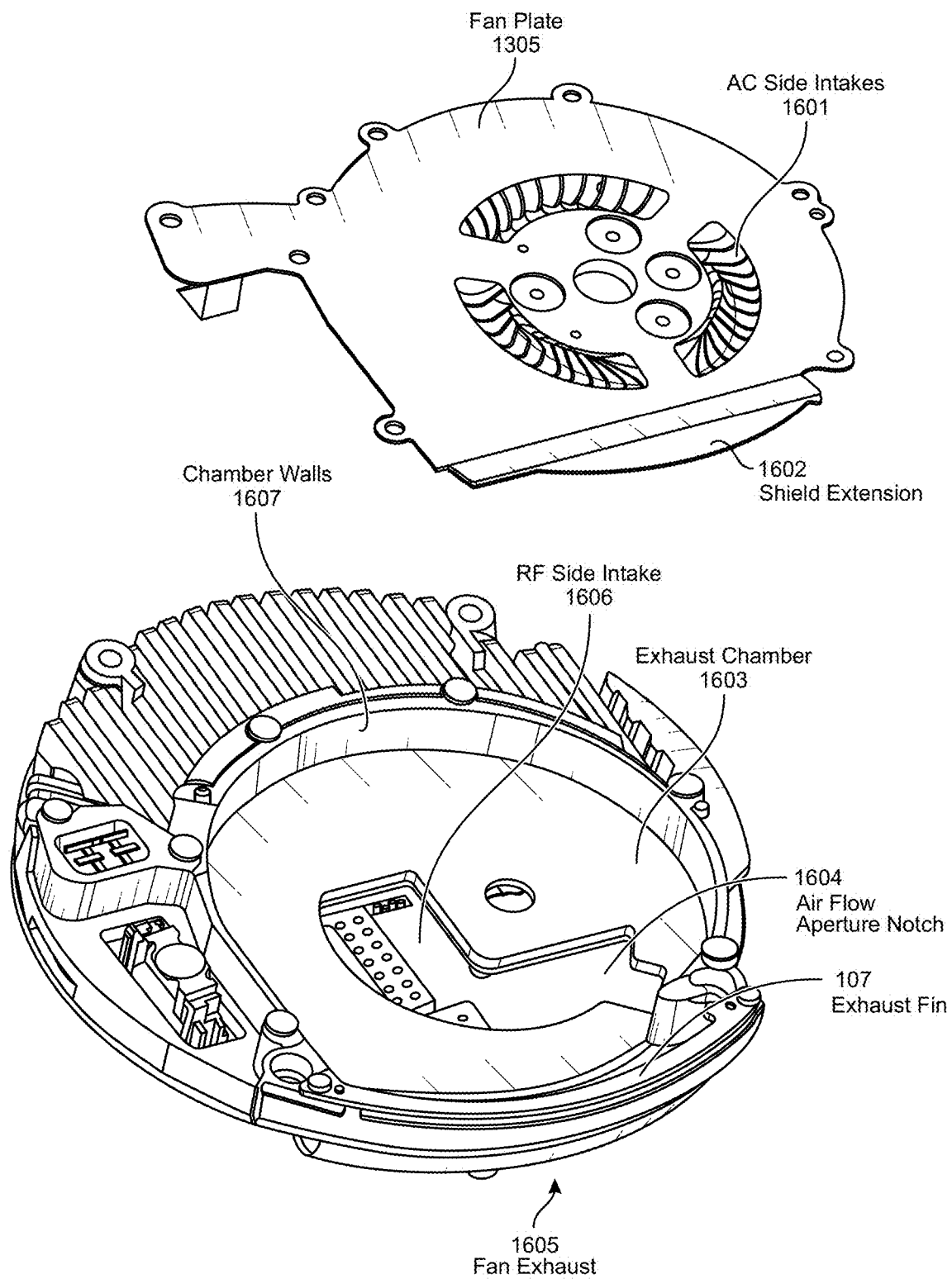
FIG. 16 shows the fan separated from the middle cooling board in accordance with some embodiments.

In some embodiments, the middle cooling plate 105 may include one or more middle plate apertures to secure the middle cooling plate 105 in a fixed position. The alignment of the middle cooling plate 105 over the RF board 104 is illustrated in in the exploded view of FIG. 15. FIG. 16 shows the fan 1306 separated from the middle cooling board in accordance with some embodiments. In some embodiments, chamber wall(s) 1607 are configured to surround at least a portion of the fan 1306 to form an exhaust chamber 1603, where a bottom surface of the exhaust chamber 1603, when assembled, is formed by the fan plate 1305. In some embodiments, the fan 1306 is coupled to the fan plate 1305, where the fan plate 1305 includes one or more AC side intakes 1601 configured to draw air from the middle of the signal hub 100, which is further discussed infra. In some embodiments, the fan plate includes a shield extension 1602 configured to conform to and/or make direct contact with the BTB shield 108 for conductive heat transfer, where the shield extension 1602 is configured to direct flow out of the fan exhaust 1605 toward the exhaust fin 107.

Figure 17:
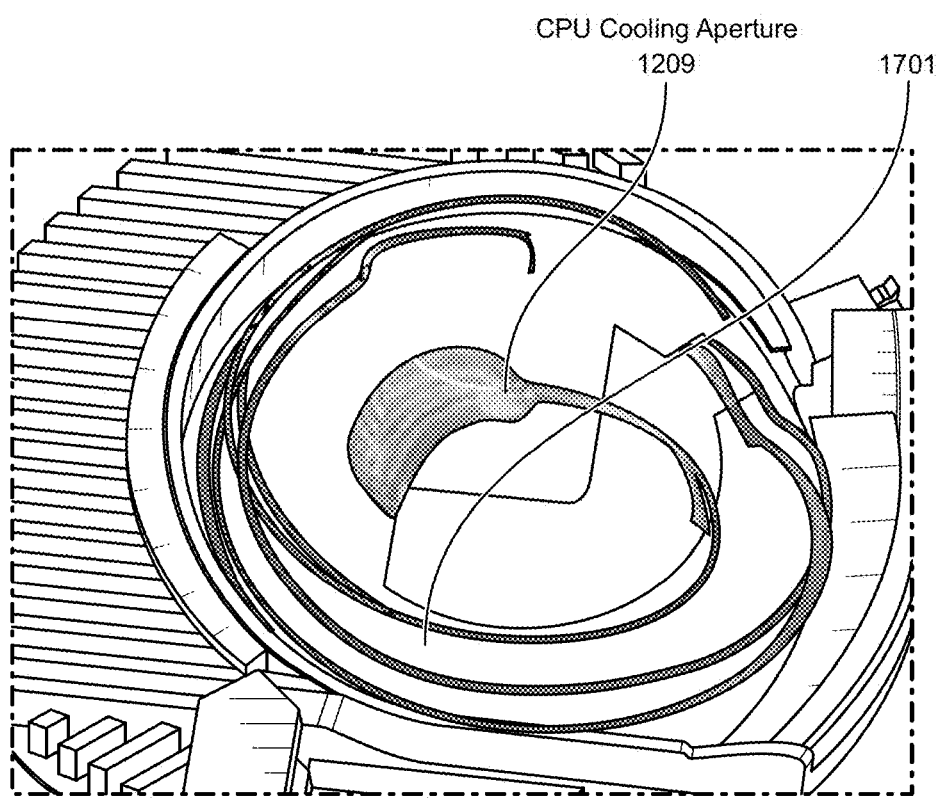
FIG. 17 shows air flow circulation within the exhaust chamber according to some embodiments.

In some embodiments, top surface of the exhaust chamber 1603 includes RF side intake 1606, where the RF side intake 1606 for the fan includes an air flow aperture notch 1604 configured to enable the RF side intake 1606 to pull air from a direction perpendicular to the area defined by the air flow aperture 802. FIG. 17 shows air flow circulation 1701 within the exhaust chamber 1603 according to some embodiments. In some embodiments, the exhaust chamber 1603 is configured to at least partially recirculate air before exhausting the air from the fan exhaust 1605.

Figure 18:
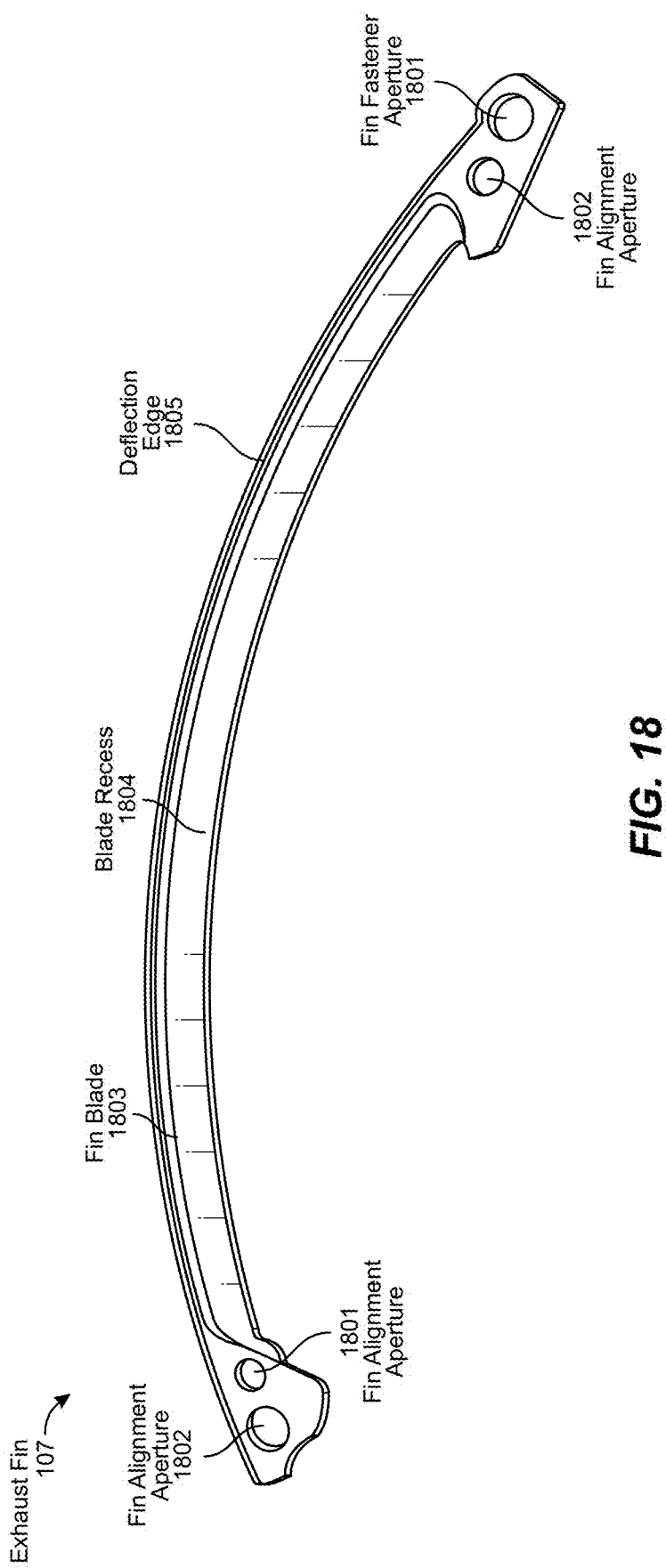
FIG. 18 depicts the exhaust fin detached from the middle cooling plate according to some embodiments.

Turning now to FIG. 18, the detachable exhaust fin 107 is depicted separated from the middle cooling plate 105 in accordance with some embodiments. In some embodiments, the exhaust fin 107 includes one or more fin alignment apertures 1801 each configured to engage a fin alignment projection 1312 on a side of the fan exhaust 1605. In some embodiments, the exhaust fin 107 is secured to the middle cooling plate 105 via a fin fastener 1313 configured to engage a fin fastener aperture 1802 on the exhaust fin 107. In some embodiments, a fin blade 1803 of the exhaust fin 107 includes a blade recess 1804 configured to direct air to a deflection edge 1805 of the fin blade, where the deflection edge 1805 is configured, at least in part, to impart a directional flow away from a bottom surface of the signal hub 100, as described supra. In some embodiments, the exhaust fin 107 is configured to provide directional airflow out of the signal hub 100 exhaust gap while also serving to block a portion of the exhaust gap. This feature, discussed further infra, allows the exhaust port to be larger than 1 mm while simultaneously blocking objects greater than 1 mm from entering the exhaust port. This exhaust fin 107 configuration solves a problem in the art where regulations require that objects greater than 1 mm not be able to pass through an outer opening, while allowing a larger than 1 mm exhaust port.

Figure 19:
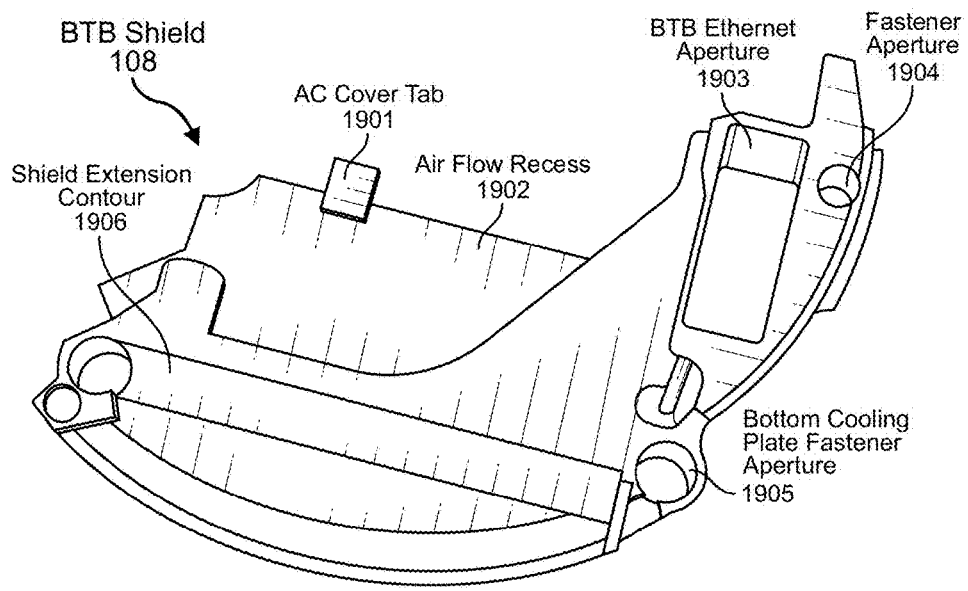
FIG. 19 shows a top view of the BTB shield in accordance with some embodiments.
Figure 20:
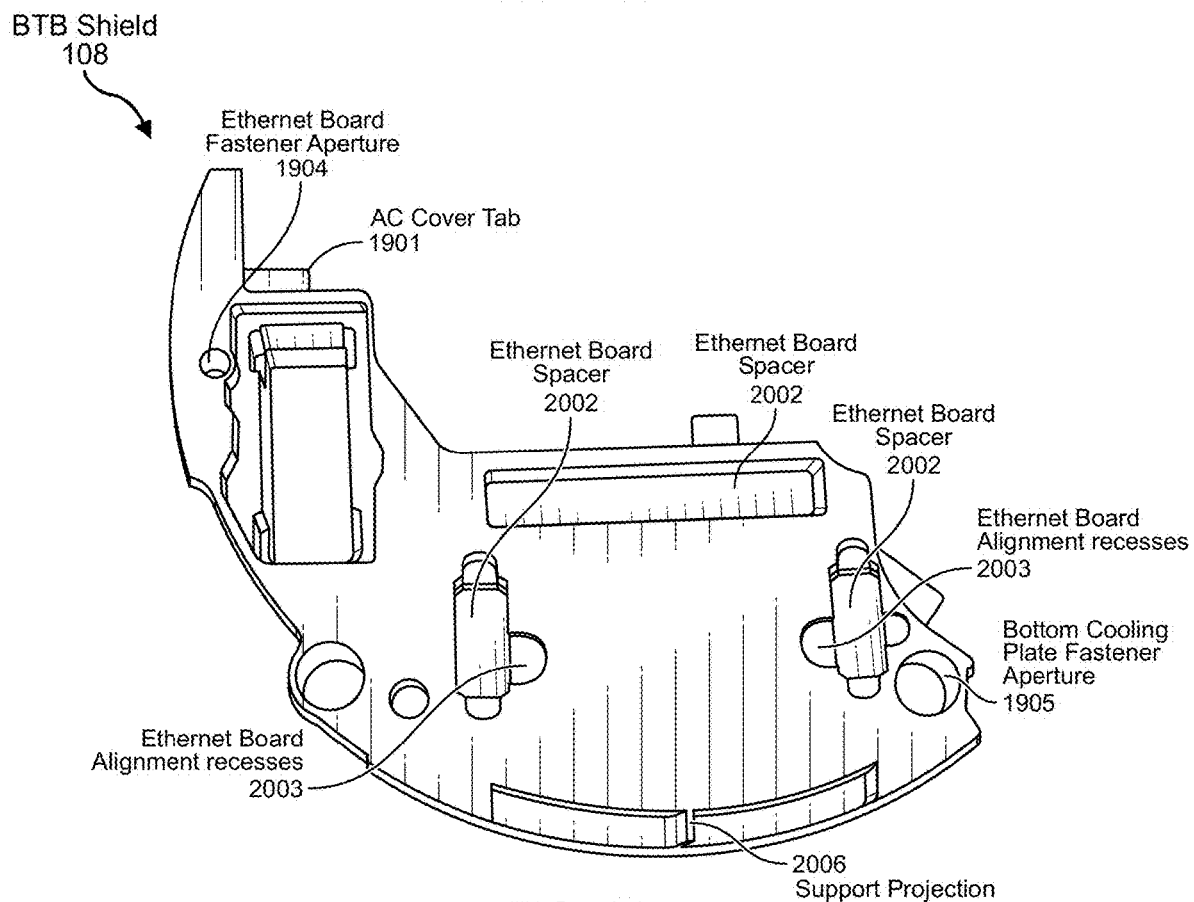
FIG. 20 shows a bottom view of the BTB shield in accordance with some embodiments.

FIGS. 19 and 20 show a top view and bottom view, respectively, of the BTB shield 108 in accordance with some embodiments. In some embodiments, the board-to-board (BTB) shield is configured to provide electromagnetic interference (EMI) protection and ensure the signal integrity of the one or more antennas 402 and/or the RF board 104 from the AC board 111, where the AC board 111 is position below the RF board 104 and/or the one or more antennas 402 in the signal hub 100 when assembled. In some embodiments, the BTB shield 108 is configured to prevent unwanted electromagnetic signals from external sources and/or the AC board 111 from interfering with circuits on the RF board 104. In some embodiments, the BTB shield 108 is configured reduce radiated emissions and ensuring compliance with electromagnetic compatibility (EMC) standards. In some embodiments, the BTB shield 108 is further configured to isolate signal paths between the RF board 104 and the AC board 111, which minimizes crosstalk and maintains a clean, stable communication between the boards.

In some embodiments, the BTB shield 108 is configured to function as a grounding plane for dissipating electromagnetic energy from both the RF and AC boards. Additionally, in some embodiments, the BTB shield 108 is configured to assist in thermal management by acting as a heat spreader, transferring thermal energy away from critical components on the RF board 104 and/or AC board 111, where the BTB shield 108 is configured to collect more thermal energy from the AC board 111 than from the RF board 104. In some embodiments, the BTB shield 108 includes a shield extension contour 1906, where the shield extension contour 1906 is configured to provide a mechanical support for the shield extension 1602 of the fan plate. In some embodiments, the shield extension contour 1906 is configured to contour to the fan shield extension 1602, where the fan plate and/or shield extension 1602 includes a copper layer configured to increase heat transfer to the BTB shield 108.

In some embodiments, the BTB shield 108 includes an air flow recess 1902 configured to provide a volume space sufficient for one or more AC side air intakes to drawing in air from a middle section of the signal hub 100, described later with regard to assembled views. In some embodiments, the BTB shield 108 includes a BTB ethernet aperture 1903 configured to enable the portion of the ethernet tool free connection to pass therethrough. In some embodiments, BTB shield 108 includes an ethernet board contour is configured to follow a shape of the RF board 104. In some embodiments, the BTB ethernet aperture 1903 is configured to mate with the ethernet board contour when assembled.

Figure 21:
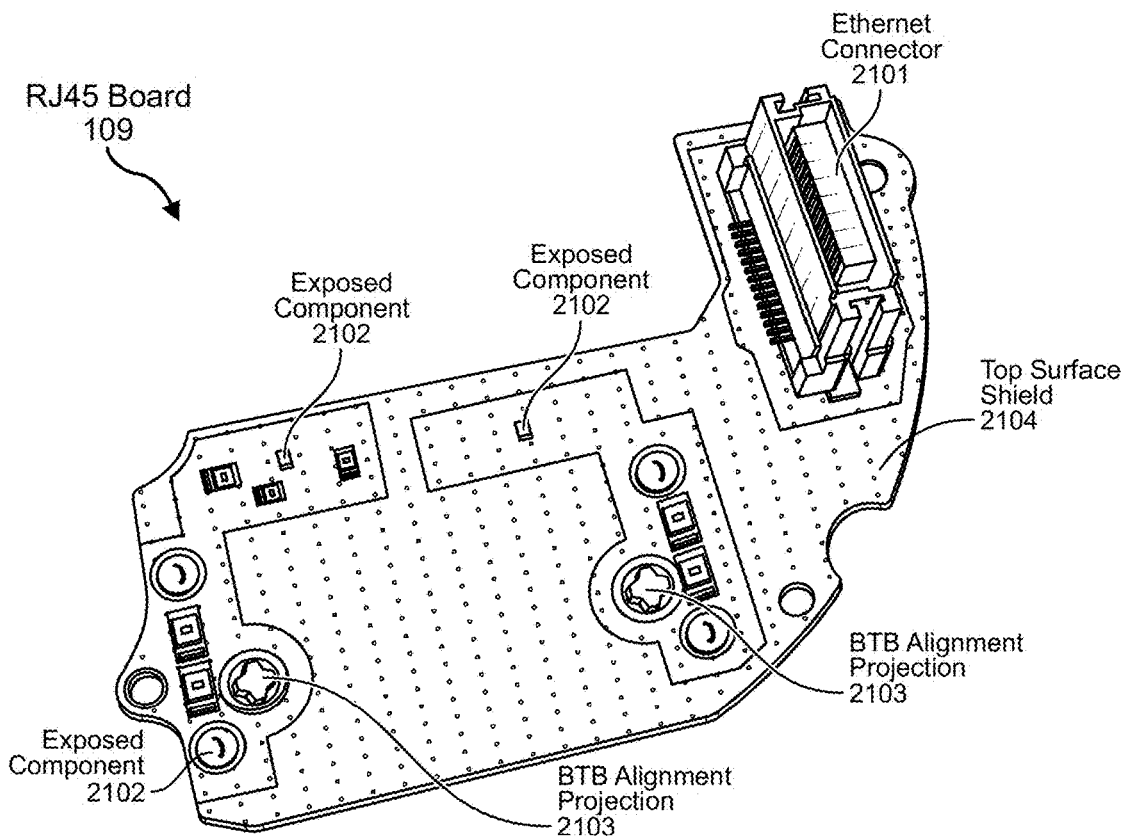
FIG. 21 illustrates a top view of the ethernet board in accordance with some embodiments.
Figure 22:
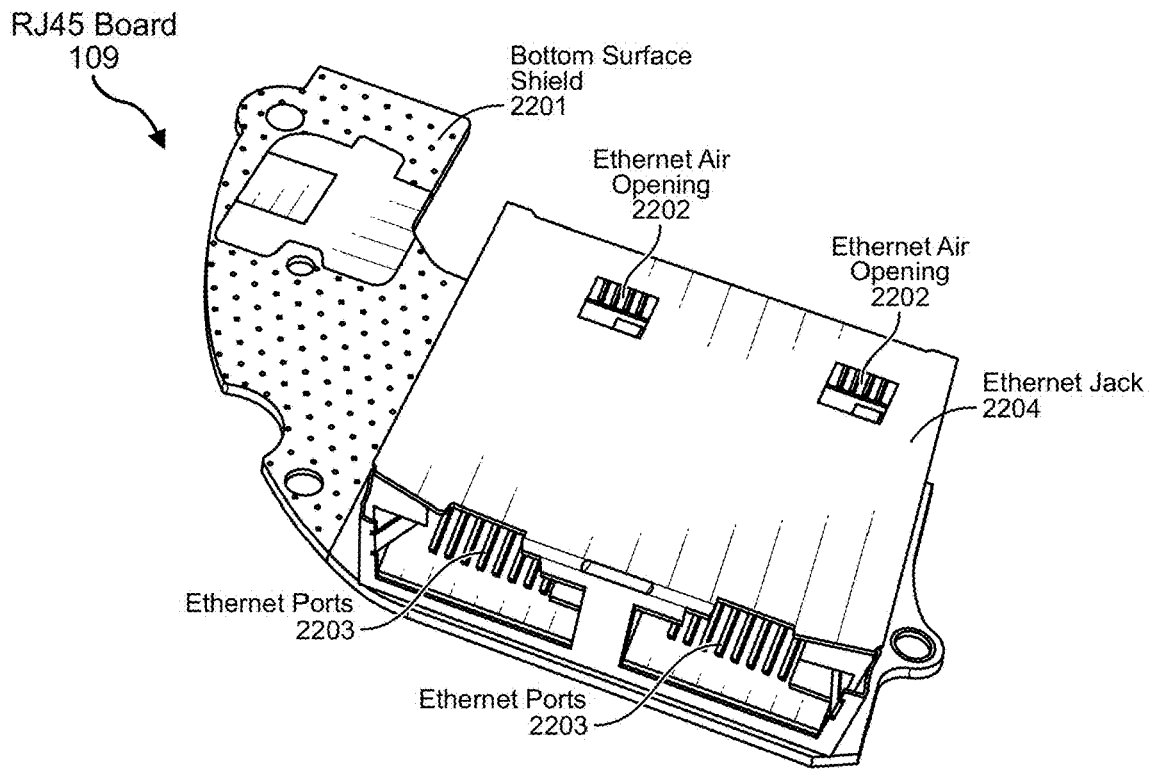
FIG. 22 illustrates a bottom view of the ethernet board in accordance with some embodiments.

In some embodiments, the BTB shield 108 includes one or more AC cover tabs 1901 configured to mate with a respective BTB tab recess 2301 formed on the top AC cover 110. In some embodiments, a bottom of the BTB shield 108, as shown in FIG. 20, includes one or more ethernet board spacers 2002, which include recesses formed into the BTB shield 108 to prevent the BTB shield 108 from making physical contact with one or more exposed board components, where the exposed board components need to be electronically separated from other metal surfaces. In some embodiments, the bottom surface of the BTB shield 108 includes one or more ethernet board recesses 2003 configured to engage a respective BTB alignment projection 2103 extending from a top surface of the ethernet board 109, ensuring all exposed board components properly align with each ethernet board spacer. In some embodiments, the BTB shield 108 includes one or more bottom cooling plate fastener apertures 1905 configured to mate with one or more bottom cooling plate fastener projections projecting from a perimeter of the top surface of the bottom cooling plate 113. In some embodiments, the BTB shield 108 includes an ethernet board fastener aperture 1904 configured to enable physical and/or electrical connection to a portion of the RF board 104. In some embodiments, the BTB shield 108 includes a support projection 2006 configured to engage a BTB shield support 3402 located on the bottom shell 114 between the two ethernet port apertures FIGS. 21 and 22 show a top view and bottom view of the ethernet board 109 according to some embodiments. As stated previously, while terms such as RF board 104, AC board 111, and/or ethernet board 109 are used in the non-limiting example depicted in the figures, the cooling system described herein can be applied to any arrangement of heat producing boards and/or PCBs. Similarly, the signal isolation system described herein may be applied to any components susceptible to and/or capable of producing electromagnetic interference (EMI). Therefore, any structure described herein may be referred to as a first structure, second structure, etc., when defining the metes and bounds of the system in accordance with some embodiments. In some embodiments, specific recitation of components in the non-limiting example (e.g., RF board 104, AC board 111, and/or ethernet board 109) are given the plane meaning of their descriptive name and/or are defined by recited substructures.

Figures 31, 32:
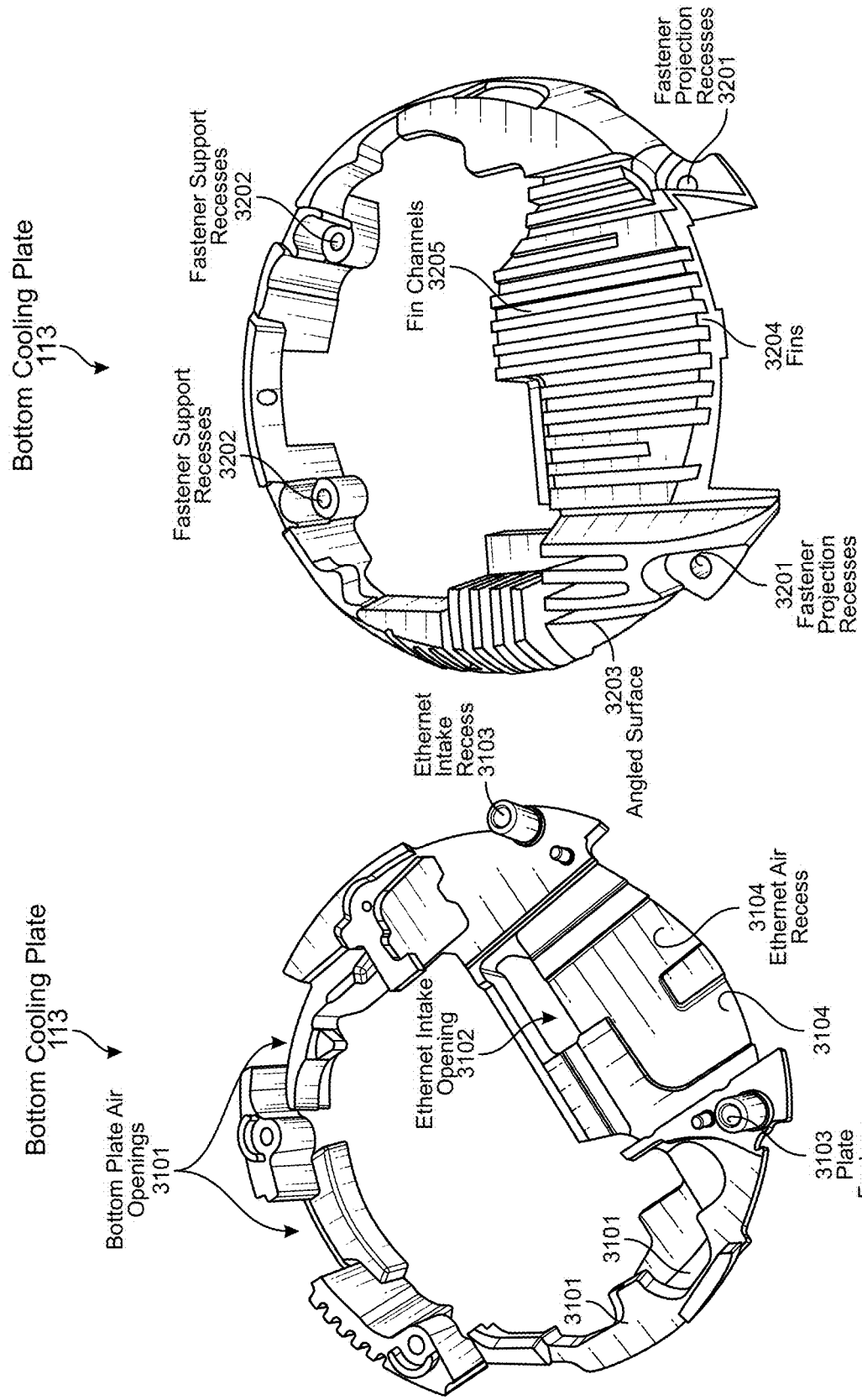
FIG. 31 depicts a top view of the bottom cooling plate in accordance with some embodiments.
FIG. 32 shows a bottom view of the bottom cooling plate in accordance with some embodiments.

Turning back to FIG. 21, the top of the RF board 104 includes a number of exposed components 2102. In some embodiments, a majority of the top surface includes a top surface shield 2104, where the top surface shield 2104 may be configured to function as an electrical connection (e.g., grounding plane), RF shield, and/or thermal conductive layer. Spaces in the top surface shield 2104 are provided for the one or more exposed components 2102, which include an ethernet connector 2101 (tool-free connection portion) configured to pass through the BTB ethernet aperture 1903 as discussed, supra. As shown in FIG. 22, the bottom side of the ethernet board 109 also includes a bottom surface shield 2201, as well as an ethernet jack 2204 that includes one or more ethernet ports 2203. In some embodiments, the ethernet jack 2204 includes one or more ethernet air openings 2202 configured to cooperate with an ethernet intake opening on the bottom cooling plate 113 to enable additional ambient air to be drawn through a respective ethernet port, providing additional ambient air is configured to cool the bottom cooling plate 113. As shown in FIG. 31, the bottom cooling plate 113 includes one or more ethernet air recesses 3104 configured to draw air from between the bottom cooling plate 113 and a bottom surface of the ethernet jack 2204 to which the bottom cooling plate 113 is mated. In some embodiments, the bottom shell 114 includes a jack surface air inlet 3302 formed in a bottom portion of the ethernet port aperture 3301 configured to direct air to the one or more ethernet air recesses 3104, making full use of all external openings for air intake purposes.

Figure 23:
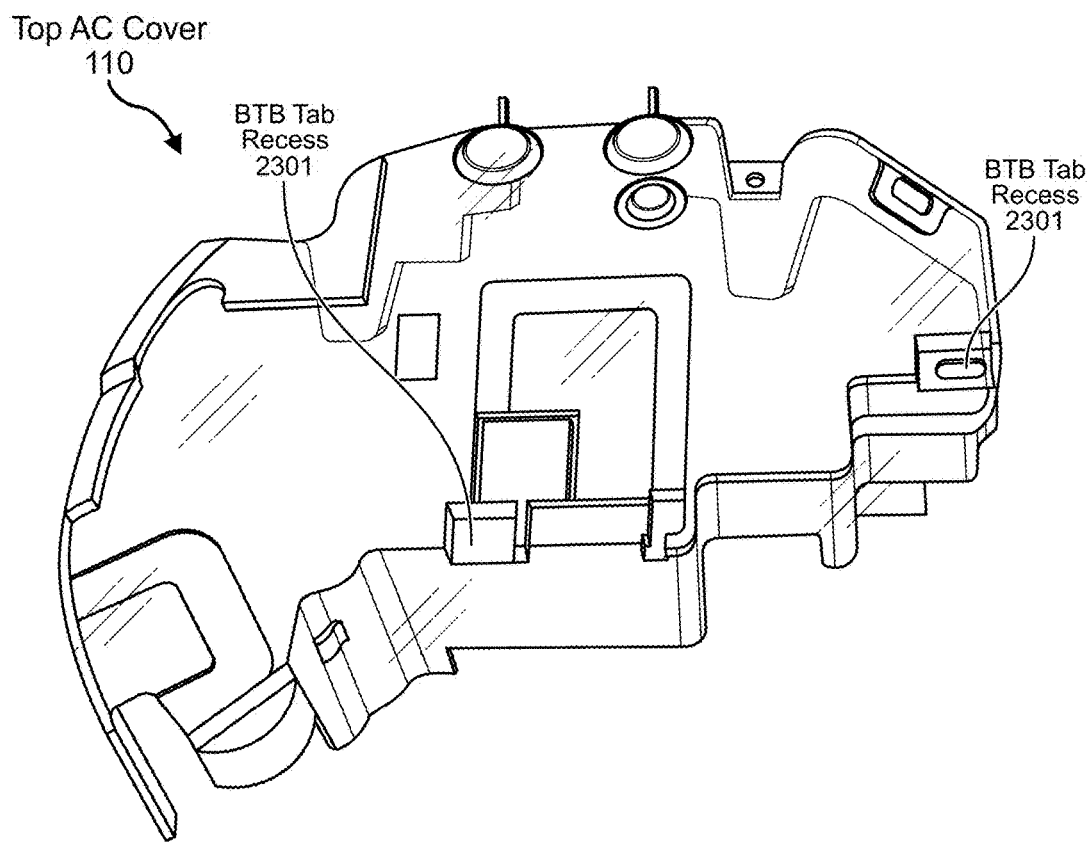
FIG. 23 depicts a top view of the top AC cover in accordance with some embodiments.
Figure 24:
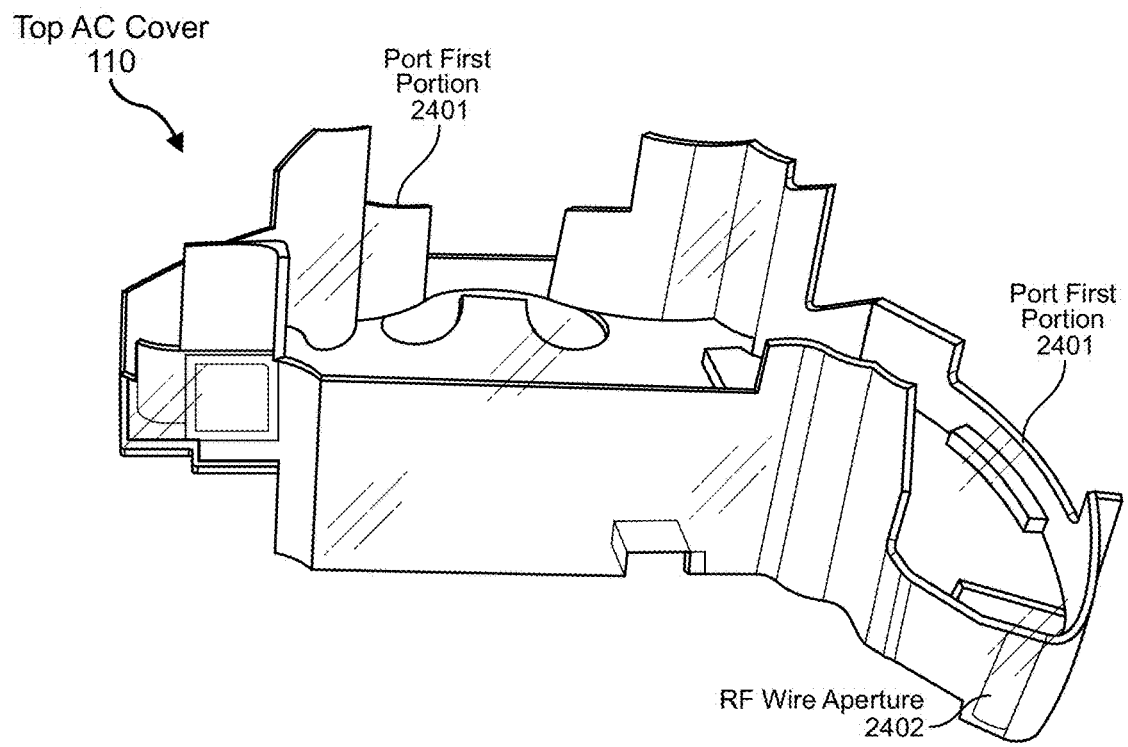
FIG. 24 shows a bottom view of the top AC cover in accordance with some embodiments.

Depicted in FIGS. 23 and 24 are a top view and a bottom view, respectively, of the top AC cover 110 in accordance with some embodiments. As previously described, in some embodiments, the top surface of the top AC cover 110 includes a one or more BTB tab recesses 2301 configured to engage the BTB shield 108. In some embodiments, the top AC cover 110 is formed from a non-conductive material and/or is configured to electrically isolate the AC board 111 from one or more metallic components. In some embodiments, the top AC cover 110 is configured to mate with the bottom AC cover 112 to form an AC board housing configured to direct airflow, as will be further described in relation to the assembled views. In some embodiments, the top AC cover 110 includes at least a port first portion 2401 of one or more air flow ports, where the bottom AC cover 112 includes a port second portion of a respective air flow port. In some embodiments, the top AC cover 110 includes an RF wire aperture 2402 configured to enable one or more RF wires 2501 fixed to a top surface of the RF board 104 to pass through.

Figure 25:
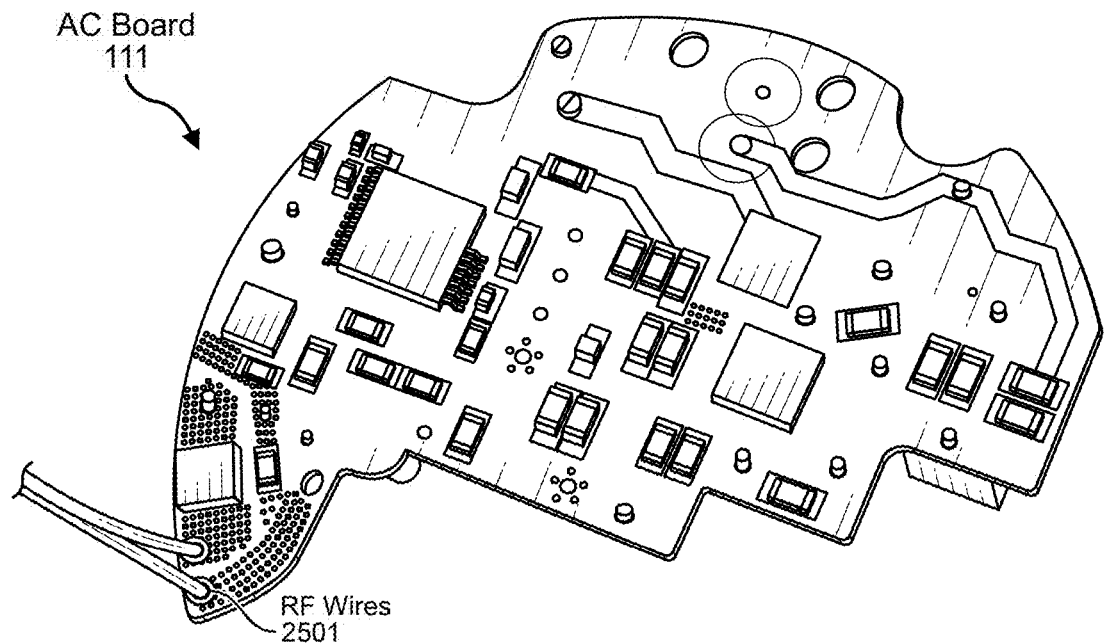
FIG. 25 illustrates a top view of the AC board in accordance with some embodiments.
Figure 26:
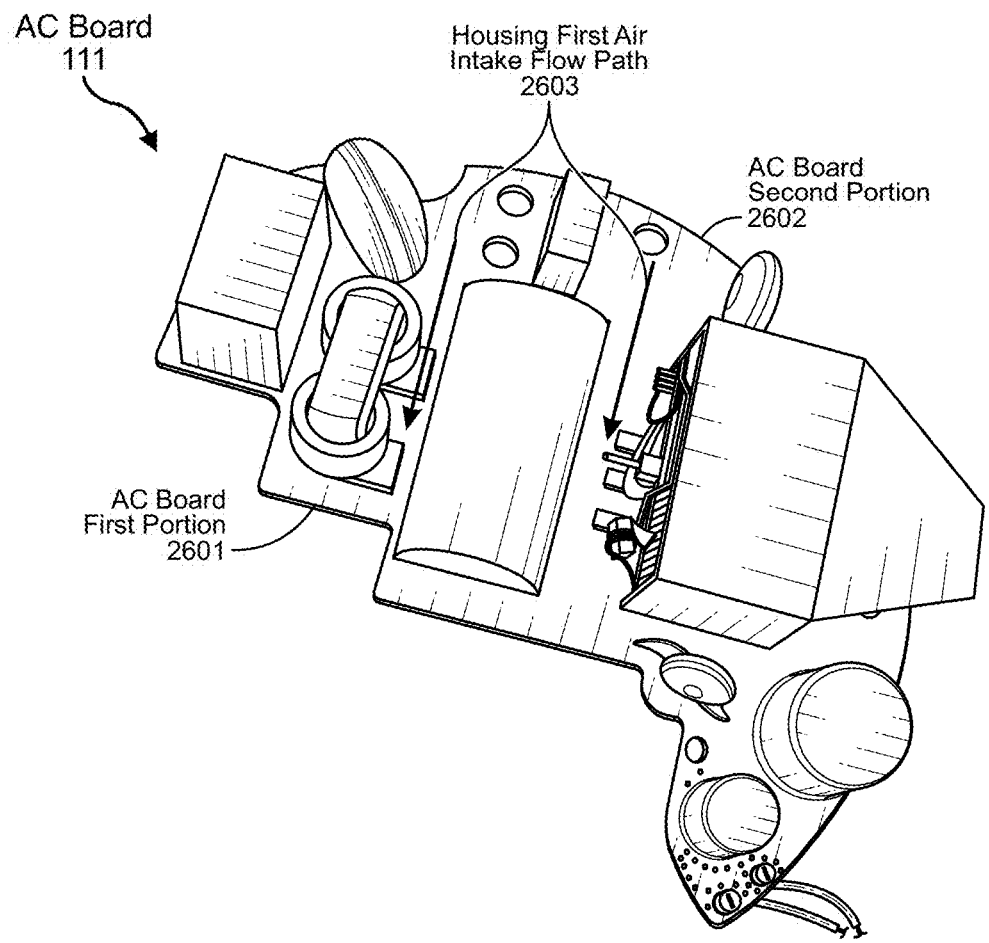
FIG. 26 shows a bottom view of the AC board in accordance with some embodiments.

Turning now to FIGS. 25 and 26, a top view of the AC board 111 is depicted according to some embodiments. In some embodiments, the AC board 111, as in FIG. 26, includes two RF board 104 wires extending from the top surface. In some embodiments, the RF wires 2501 are configured to supply direct current (DC) power to the RF board 104. In order to allow flexibility in RF board 104 component configuration, the RF wires 2501 are configured to mate with the RF tool-free connection on the bottom on the RF board 104. The use of RF wires 2501 overcome the problem of how to connect the AC board 111 to different RF boards that have an RF wire connection at different locations, as the RF wires 2501 allows for routing to different locations along the RF board surface. In some embodiments, the AC board 111 does not use a rigid board-to-board connection with the RF board 104 for this reason. As mentioned previously, and discussed further infra, the shielding system includes the use of the side plate 106 to shield one or more boards and/or components from electromagnetic interference caused by the RF wires 2501.

As shown in FIG. 26, in some embodiments, at least an AC board first portion 2601 of the perimeter of the AC board 111 is configured to contour to a shape of and/or match a perimeter of one or more of the top AC cover 110 and bottom AC cover 112 and or the bottom shell 114. In some embodiments, at least a second portion 2602 of the perimeter of the RF board 104 is configured to contour to a shape of one or more of the top AC cover 110 and bottom AC cover 112 and/or follow a perimeter of the BTB shield 108. In some embodiments, one or more components on the AC board 111 are configured to form a housing first air intake flow path 2603, configured to direct air with no substantial change in direction from the housing first air intake to the housing exhaust.

Figure 27:
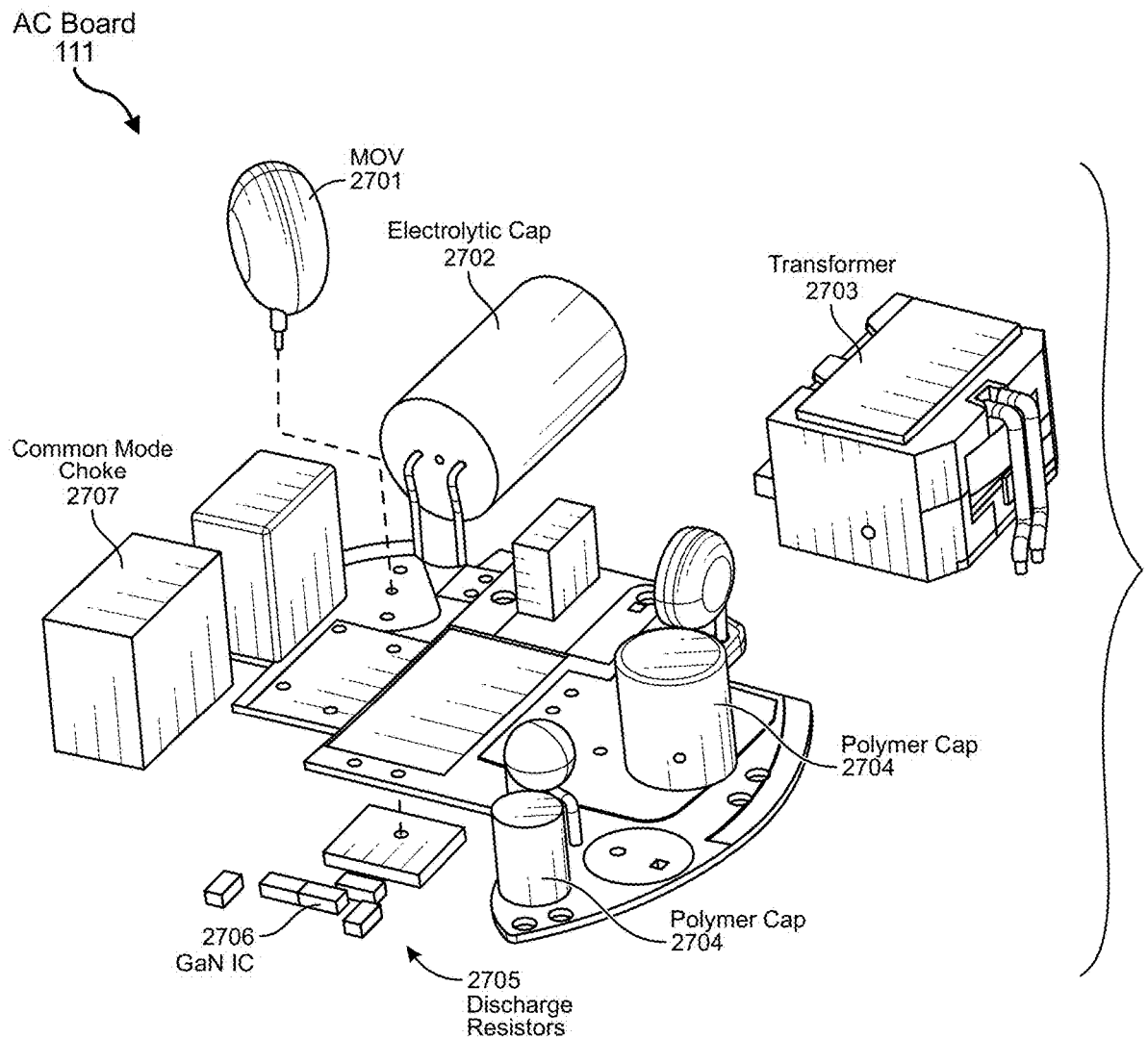
FIG. 27 depicts and exploded view of the AC board in accordance with some embodiments.

FIG. 27 shows an exploded view of the AC board 111 in accordance with some embodiments. In some embodiments, an AC board 111 includes one or more components configured to manage and regulate alternating current (AC) power for the signal hub 100, including a metal oxide varistor (MOV 2701), an electrolytic capacitor 2702, a transformer 2703, polymer capacitors 2704, discharge resistors 2705, a gallium nitride integrated circuit (GaN IC) 2706, and/or a common mode choke 2707.

In some embodiments, the metal oxide varistor (MOV 2701) is configured to protect the circuit by absorbing voltage spikes or surges, such as those caused by lightning or switching transients, preventing damage to sensitive components. In some embodiments, the MOV 2701 is configured to meet regulation standards (e.g., IEC 62368-1:2023) without having to meet the required (13 mm) safeguard distance from other electronic devices and/or mechanical housings. In some embodiments, the MOV 2701 is positioned less than 13 mm from one or more other components on the AC board 111.

In some embodiments, the AC board 111 includes a transformer 2703 that is configured to step up or step down the AC voltage to the required level, as well as provide electrical isolation between different parts of the circuit. In some embodiments, the AC board 111 includes a common mode choke 2707 (CMC) configured to suppress common-mode interference, which includes unwanted electromagnetic signals that appear in the same phase and amplitude on multiple lines, such as the live and neutral wires of an AC power line. In some embodiments, the common mode choke 2707 is configured to block or attenuate high-frequency common-mode noise generated by power electronics, external interference, or coupled noise from nearby devices, preventing the noise from propagating further into or out of the circuit.

In some embodiments, the AC board 111 includes an electrolytic capacitor 2702 configured to smooth out voltage fluctuations by storing and releasing energy, reducing ripple in the rectified AC signal and improving the stability of the power supply. In some embodiments, the AC board 111 may include one or more polymer capacitors 2704, where the polymer capacitors 2704 lower impedance is configured for power filtering. In some embodiments, the board includes a GaN IC 2706 (gallium nitride integrated circuit) configured to act as a high-efficiency power conversion device, which provides superior switching by leveraging GaN to improve power density, reduce losses, and operate at higher frequencies compared to traditional silicon-based components. In some embodiments, the AC board 111 includes discharge resistors 2705 configured to safely discharge residual energy stored in capacitors or other components when the circuit is powered down, preventing electrical shock or damage during maintenance or handling. In some embodiments, the AC board 111 is configured to be embedded and/or housed with the bottom shell 114 of the signal hub 100. In some embodiments, the AC board 111 is configured to produce and/or convert between 20 watts and 30 watts (e.g., 25 watts) of electrical power from AC to DC. Without the cooling system and/or AC board 111 arrangement described herein, the AC board 111 would need to be placed outside the signal hub 100, or the signal hub 100 would need to be increased in size.

Figure 28:
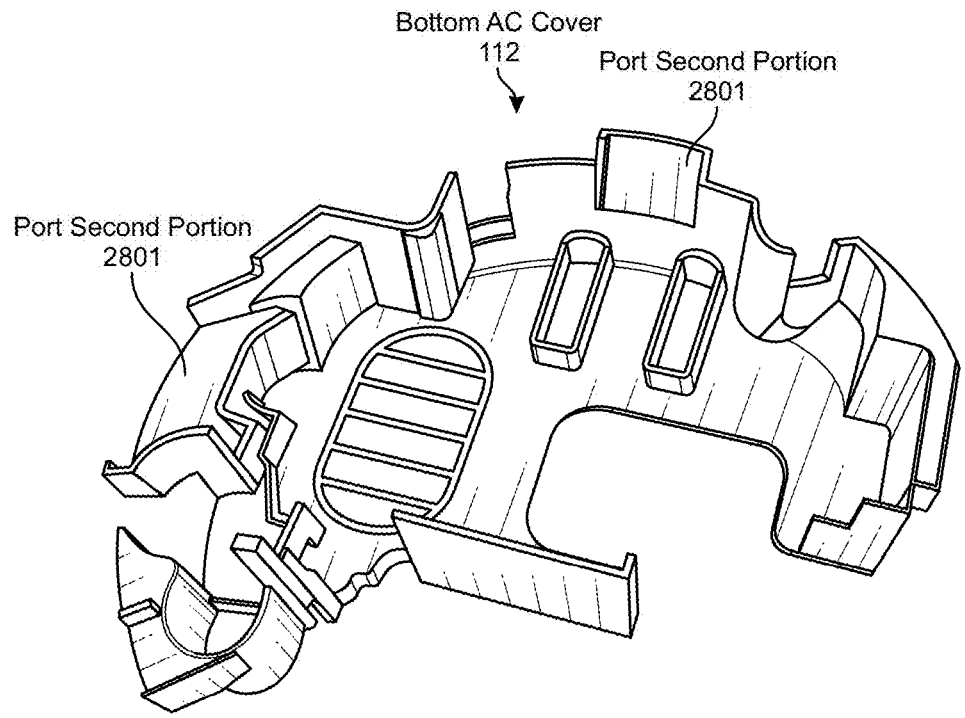
FIG. 28 illustrates a top view of the bottom AC cover in accordance with some embodiments.
Figure 29:
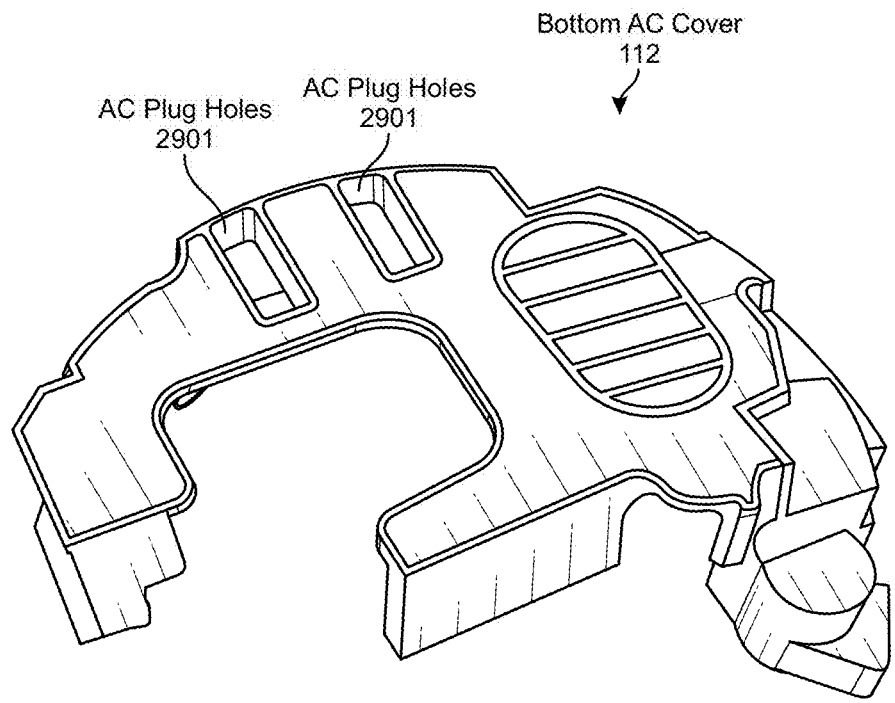
FIG. 29 illustrates a bottom view of the bottom AC cover in accordance with some embodiments.

FIGS. 28 and 29 show a top view and bottom view of the bottom AC cover 112 in accordance with some embodiments. As described previously, one or more (in this case two) bottom cover port second portions 2801 are configured to cooperate with respective top AC cover port first portions 2401 to form one or more AC air intakes and/or exhausts when assembled. In some embodiments, the bottom AC cover 112 includes one or more AC plug holes 2901 in the bottom surface configured to align with a respective AC plug connection 3401 on the inner surface of the bottom shell 114 (see FIG. 34).

Figure 30:
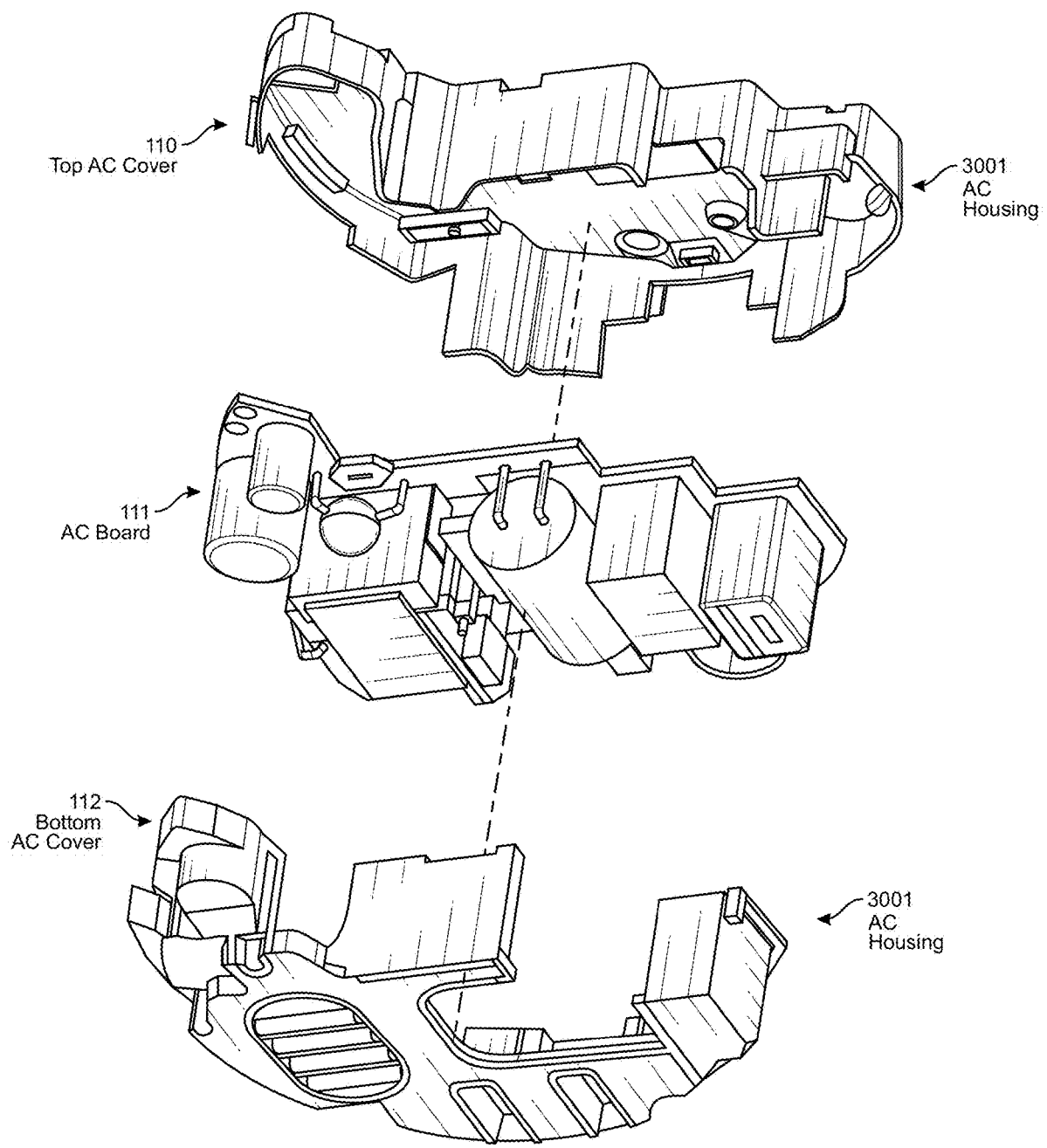
FIG. 30 shows an exploded view of the AC housing in accordance with some embodiments.

FIG. 30 shows an exploded assembly view of the top AC cover 110, AC board 111, and bottom AC cover 112 according to some embodiments. In some embodiments, the top AC cover 110 and the bottom AC cover 112 are configured to join together to form an AC housing 3001. The protection provided by the AC housing 3001 enables the AC board 111 to be placed less than 13 mm from other electrically conductive materials, satisfying creep requirements in a novel way. In some embodiments, a volume occupied by the top side of the AC board 111 is between 22,000 mm3 and 28,000 mm3 (24716 mm3 in this example). In some embodiments, a volume occupied the bottom side of the AC board 111 is between 38,000 mm3 and 44,000 mm3 (4116 mm3 in this example). In some embodiments, the AC board 111 is rated to withstand electrostatic discharges in the range of 10-20 kilovolts (kV) (e.g., 15 kV).

Turning now to FIG. 31, shown in the top view of the bottom cooling plate 113 are one or more bottom plate air openings 3101 configured to direct air to various portions of the signal hub 100. In some embodiments, the bottom cooling plate 113 includes an ethernet intake opening 3102 configured to direct air drawn by the vacuum of the fan into the fan intake 1210. In some embodiments, the ethernet intake opening 3102 is positioned at a location of lowest pressure in the area of the bottom shell 114. In some embodiments, air from the AC housing 3001 is configured to flow into the ethernet intake opening 3102. In some embodiments, the bottom cooling plate includes one or more plate fastener projections 3103 configured to engage one or more board components above.

Figure 34:
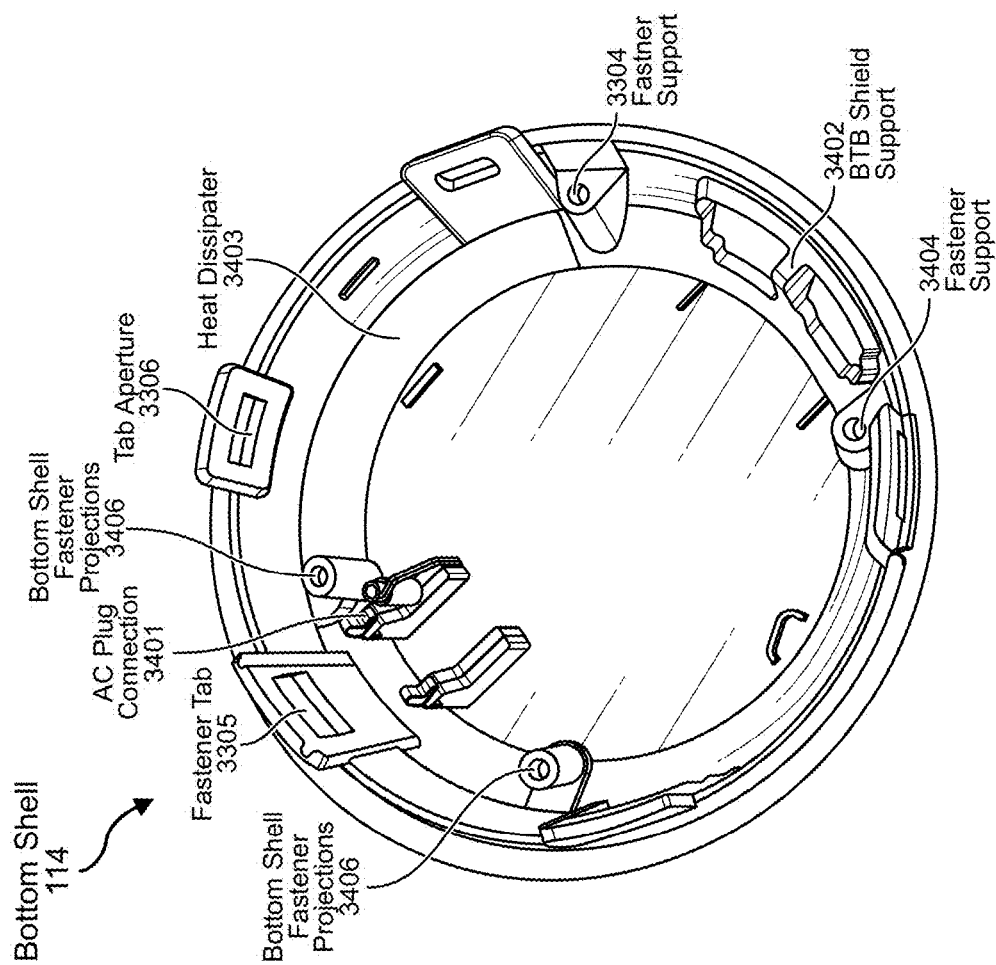
FIG. 34 shows a top view of the bottom shell in accordance with some embodiments.

In some embodiments, the bottom of the bottom cooling plate includes a plurality of fins 3204 forming fin channels 3205 which dissipate heat and direct airflow. As shown in the bottom view of FIG. 32, the bottom surface of the bottom cooling plate 113 includes one or more fastener projection recesses 3201 configured to engage one or more bottom shell fastener projections 3406 projecting from a top surface perimeter of the bottom shell 114. In some embodiments, a plate fastener projection 3103 extends from a top surface of the bottom cooling plate 113, where the plate fastener projection 3103 is configured to align with the fastener projection recesses, where a fastener aperture may extend through each. In some embodiments, the bottom surface of the bottom cooling plate 113 includes one or more fastener support recesses 3202 configured to cooperate with a respective fastener support 3304 formed at the perimeter of the bottom shell 114 adjacent one or more ethernet port apertures 3301, as shown in FIGS. 33 and 34.

Figure 33:
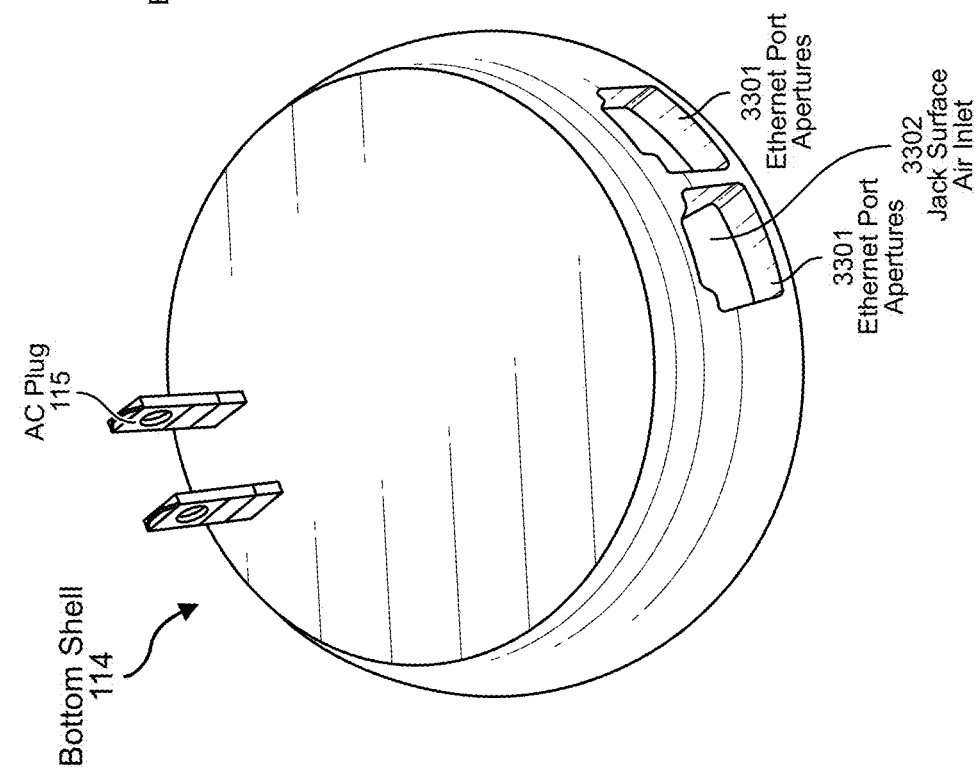
FIG. 33 shows a bottom view of the bottom shell in accordance with some embodiments.

FIG. 33 shows a bottom surface of the bottom shell 114 of the signal hub 100 in accordance with some embodiments. In some embodiments, the bottom surface includes an AC plug 115 projecting therefrom. The non-limiting example shown includes two ethernet port apertures 3301 located on a side opposite of the plug 115, where the location of the ethernet port apertures 3301 is configured to pull the signal hub 100 toward the wall in response to a load applied when wires are coupled to the ethernet jack 2204 (e.g., RJ45 jack)

In some embodiments, a BTB shield support 3402 is formed from a projection extending inward from between the two ethernet ports 2203. In some embodiments, a perimeter of the upper surface (inside surface) of the bottom shell 114 includes a heat dissipater 3403, which in this non-limiting example takes the form of copper plating. In some embodiments, the heat dissipater 3403 is configured to make contact with at least a portion of an angled surface 3203 of the bottom cooling plate 113, enabling a better transfer of heat to the walls of the bottom shell 114 for heat dissipation to the ambient environment. In some embodiments, the bottom shell 114 includes one or more fastener supports 3404 configured to support a corresponding portion of the BTB shield. In some embodiments, the bottom shell 114 includes on or more fastener tabs 3305 configured to secure to a respective top shell fastener 304, where each of the one or more fastener tabs 3305 includes a tab aperture 3306 configured to enable airflow through the ambient air gap 3501 formed substantially in the middle of the signal hub 100, as described in relation to the assembled views discussed below.

Figure 35:
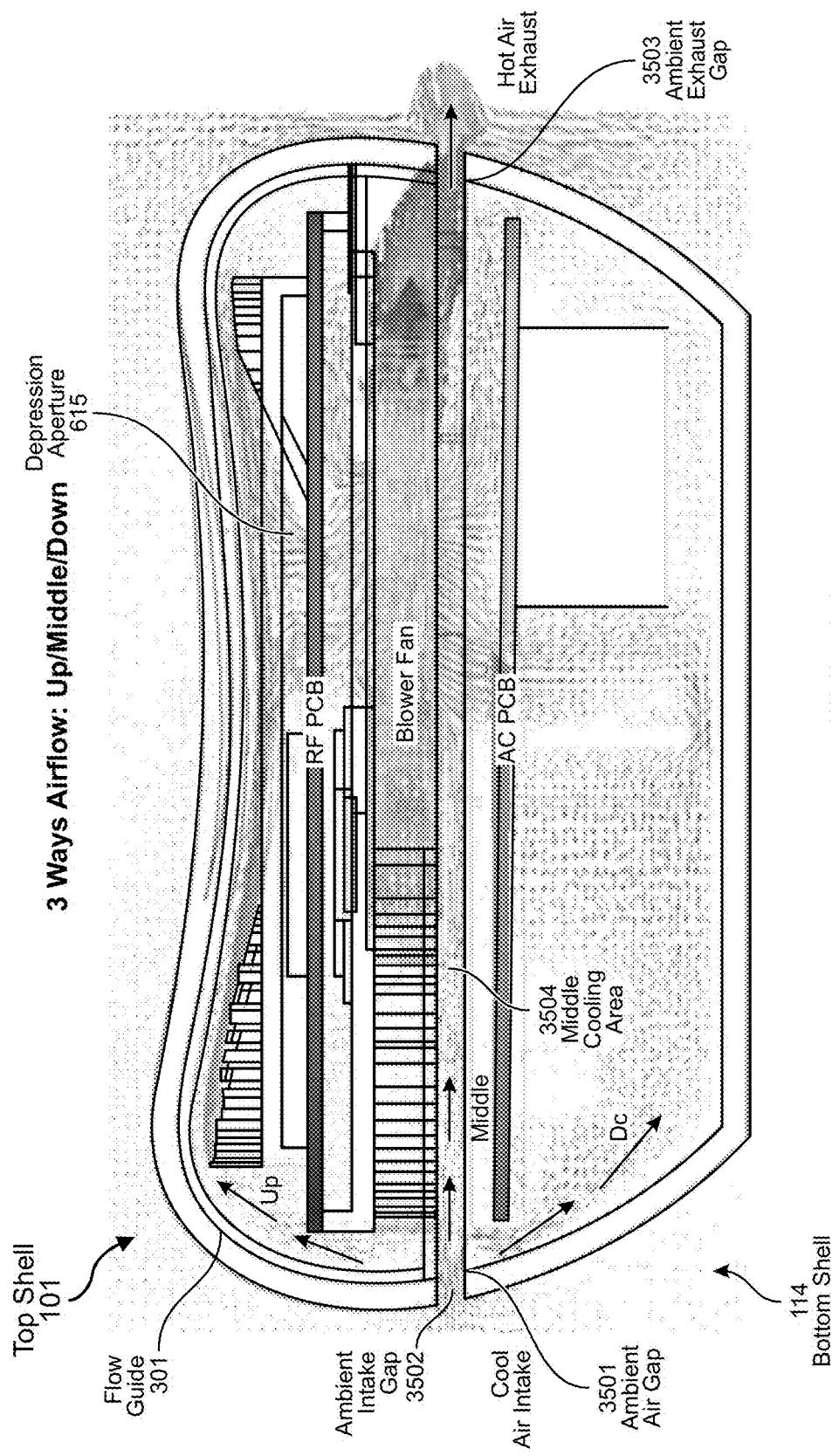
FIG. 35 depicts a side section air flow profile of the signal hub in accordance with some embodiments.

FIG. 35 shows a side sectional view of air flow through an ambient air gap 3501 into the assembled signal hub 100 in accordance with some embodiments. In some embodiments, the ambient air gap 3501 includes a cool air intake, which includes an ambient intake gap 3502 formed between the top shell 101 and the bottom shell 114. In some embodiments, the ambient intake gap 3502 is configured to enable ambient air to be drawn upward around an edge of one or more of the middle cooling plate 105, the RF board 104, the top cooling plate 103, and/or antenna carrier 102 as a result of a vacuum force of the fan. As described supra, the curvature of the flow guide 301 reduces drag caused from sudden changes in direction, where the flow depression 201 guides air across and through the various features associated with the top cooling plate 103, and toward the depression aperture 615.

In some embodiments, the ambient intake gap 3502 is configured to surround between 50%-90% of the perimeter of the signal hub 100, where the ambient intake gap 3502 lies on the same gap plane along the perimeter. In some embodiments, the gap plane defines a middle cooling area 3504, where the middle cooling area is configured to intake ambient air from at 50%-90% of the perimeter of the signal hub 100 and/or the ambient intake gap 3502. In some embodiments, the ambient intake gap 3502 extends substantially around the entire perimeter except in an area of an ambient exhaust gap 3503, where collected warm air is directed out of the signal hub 100. In some embodiments, either end of the ambient intake gap 3502 is separated from a respective end of the ambient exhaust gap 3503 by a divider 3602, which limits the interaction of ambient air and hot air exhaust, as shown in the flow profile 3601 of FIG. 36. In some embodiments, the ambient intake gap 3502 is less than or equal to 1.2 mm (e.g., 1 mm). In some embodiments, the ambient exhaust gap 3503 lies in the same gap plane, where the ambient exhaust gap between the top shell 101 and bottom shell 114 is greater than 1 mm and/or at least 50% larger than the ambient intake gap 3502. In some embodiments, the ambient exhaust gap 3503 is the only exhaust in the signal hub 100. In some embodiments, the ambient exhaust gap 3503 occupies between 20% and 40% of the ambient air gap 3501.

Referring back to FIG. 35, In some embodiments, the ambient intake gap 3502 is configured to enable ambient air to be drawn downward around an edge of one or more of the BTB shield 108, the AC housing 3001, the ethernet jack 2204, and/or the bottom cooling plate 113 as a result of a vacuum force from the fan. In some embodiments, the ambient intake gap 3502 is configured to enable ambient air to be drawn into the AC housing 3001 from a plurality of directions.

Figure 37:
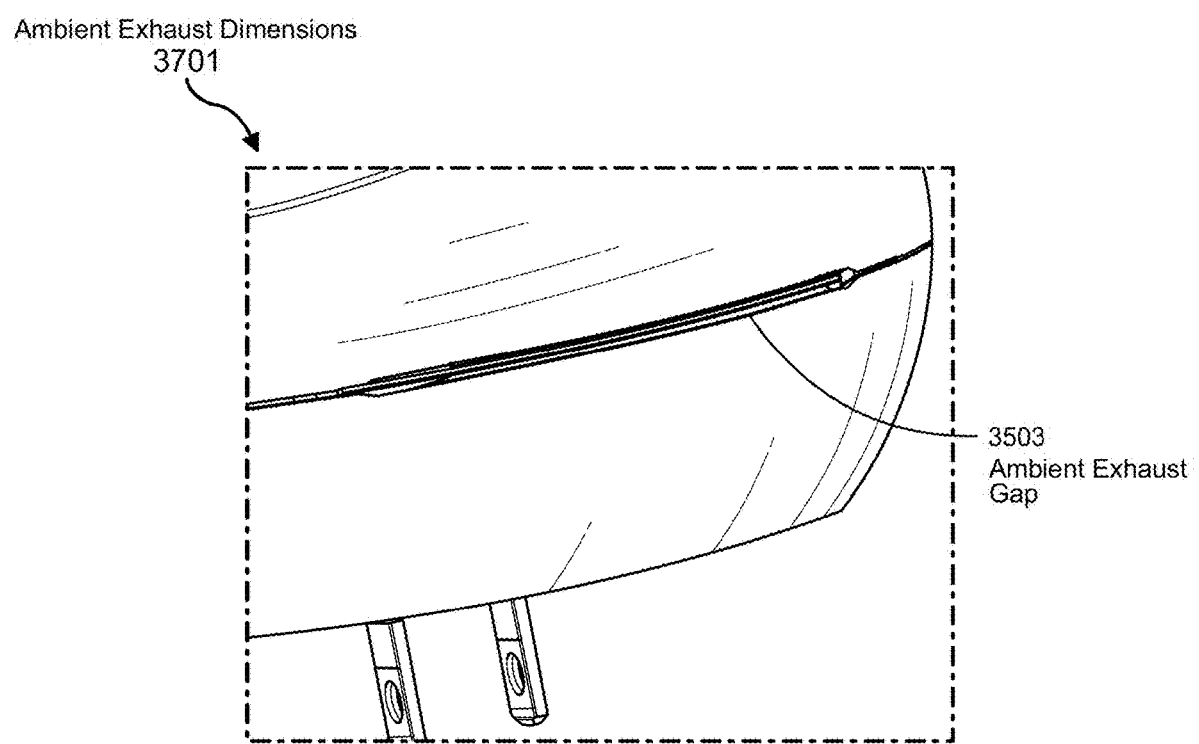
FIG. 37 illustrates dimensions for the ambient exhaust in accordance with some embodiments.
Figure 38:
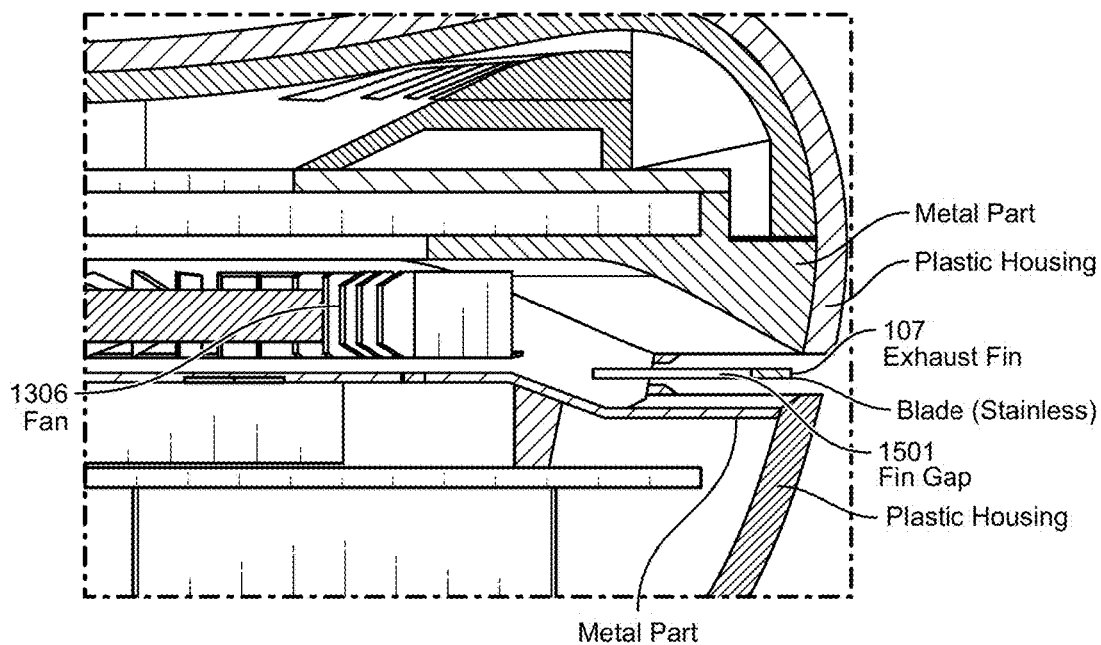
FIG. 38 shows a sectional view of the signal hub showing the exhaust fin in accordance with some embodiments.

Referring now to FIG. 37, ambient exhaust dimensions 3701 are depicted in accordance with some embodiments. In some embodiments, the ambient exhaust gap 3503 is approximately 51 mm wide, and substantially 2 mm in height. As shown in FIGS. 15 and 38, the exhaust fin 107 is attached to the fan plate; however, the exhaust fin 107 is attached such that there is fan fin gap between the shield extension 1602 and the exhaust fin 107 (also referred to herein as a blade). This exhaust fin 107, in some embodiments, is configured to prevent a 1 mm object from passing into an interior region of the signal hub 100 through the 2 mm ambient exhaust gap 3503.

Figure 39:
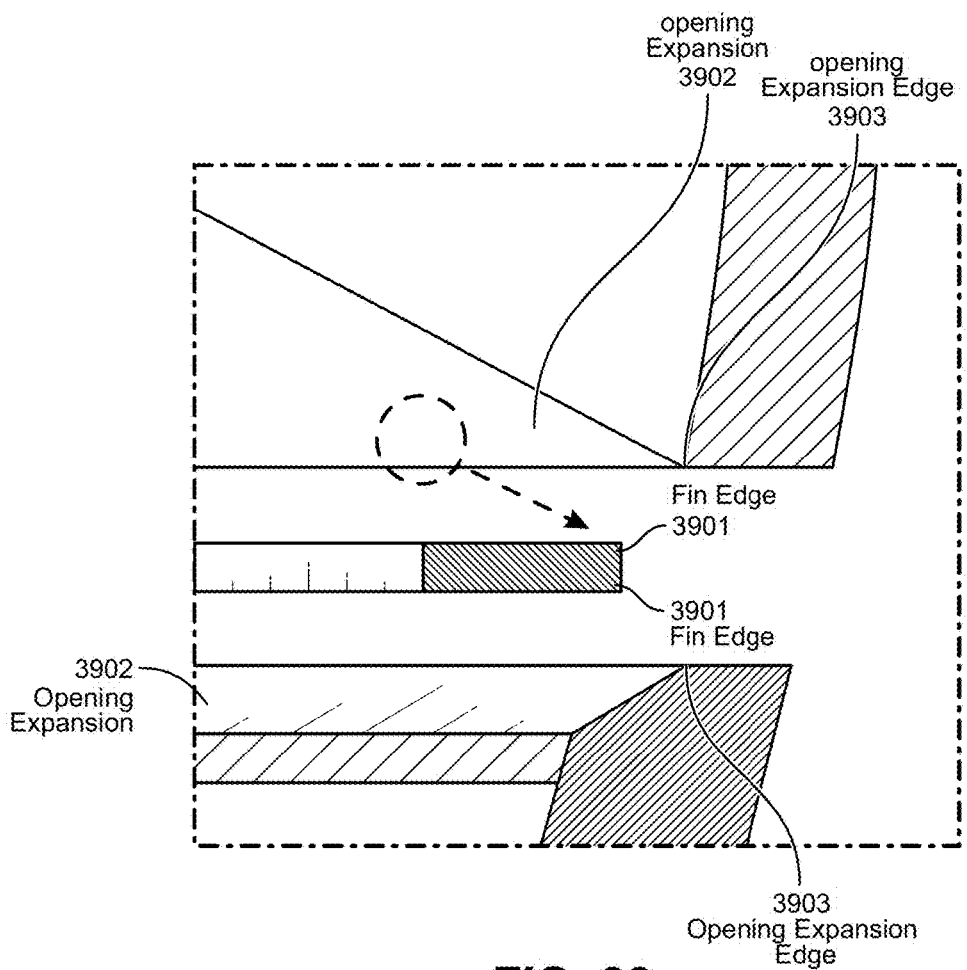
FIG. 39 depicts a zoomed view of FIG. 38 in accordance with some embodiments.
Figure 40:
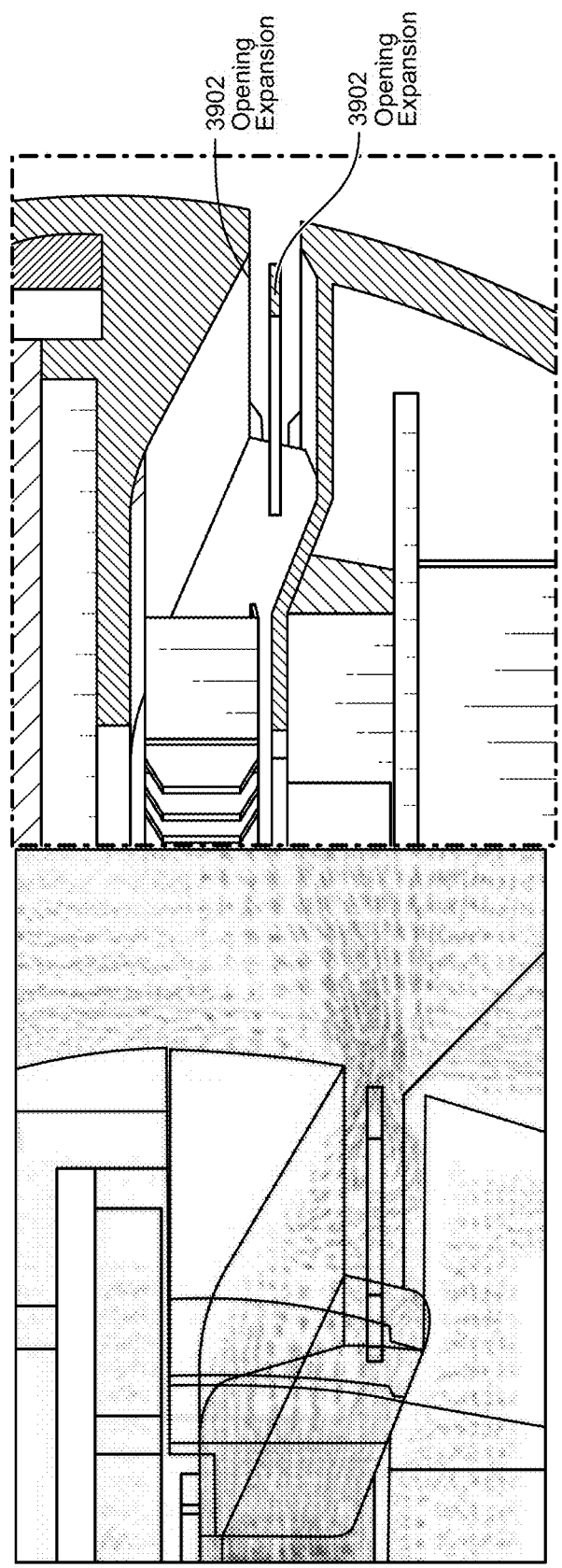
FIG. 40 illustrates air flow pattens on both sides of the exhaust fin in accordance with some embodiments.
Figure 42:
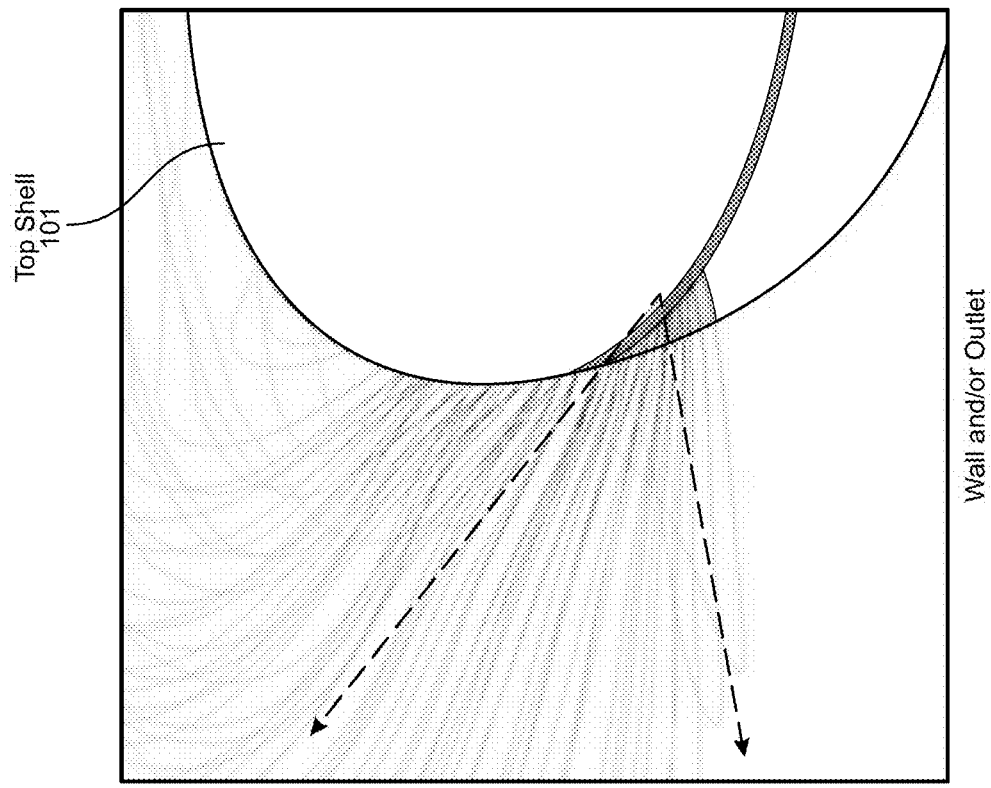
FIG. 42 depicts the air flow in FIG. 41 with a solid view of the signal hub in accordance with some embodiments.
Figure 41:
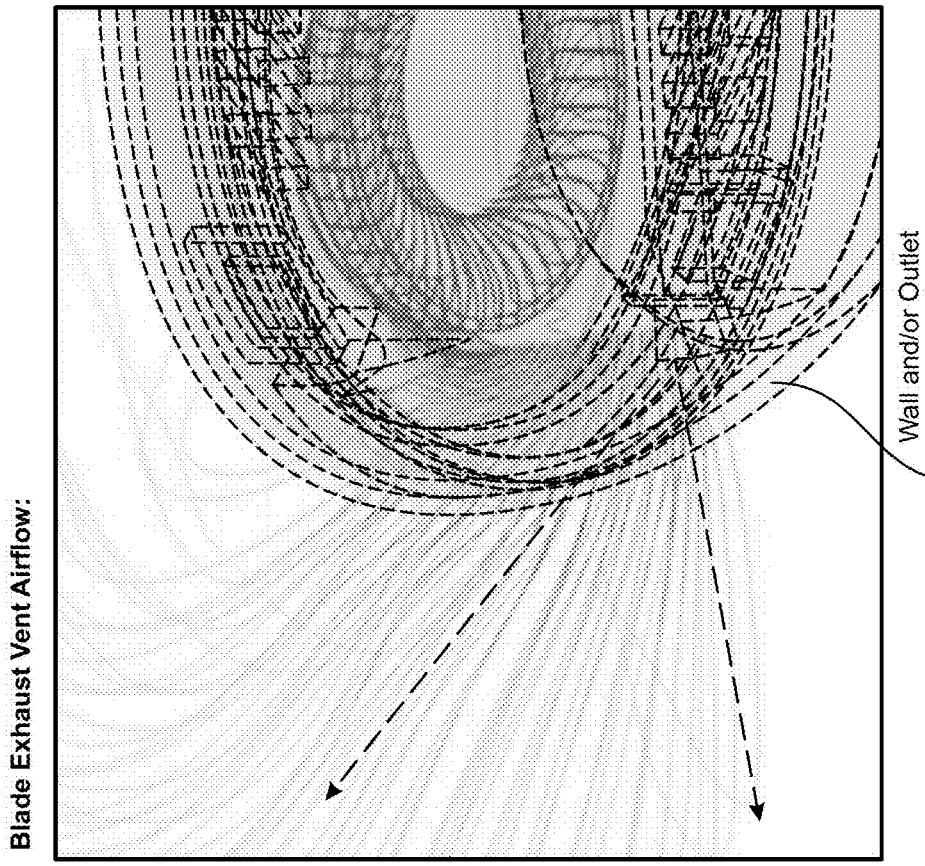
FIG. 41 illustrates a transparent view of the signal hub showing the direction of air flow away from a wall and/or outlet in accordance with some embodiments.

While the exhaust fin 107 position at the outlet would normally reduce the exhaust cross-section air path over the exhaust fin 107 to less than 1 mm, a fin gap 1501 is configured to enable airflow to pass over both sides of the fan, doubling, in this non-limiting example, airflow through the exhaust. As shown in FIG. 39, in some embodiments, the exhaust fin 107 is configured to be set back from the 2 mm gap within an opening expansion 3902 such the distance between an opening expansion edge 3903 and a fin edge 3901 is less than or equal to 1 mm, preventing a 1 mm steel ball from passing through the distance between when assembled. FIG. 40 show air flow passing over both side of the exhaust fin 107 in accordance with some embodiments. As shown in FIGS. 41 and 42, the majority of exhaust air is blown away from the bottom shell 114, a wall, and/or an outlet, preventing accumulation of debris on those surfaces. As discussed previously, in some embodiments, the exhaust fin 107 is configured to direct 80% or more of exhausted air away from the bottom shell 114 and/or toward a direction of the top shell 101.

Figure 44:
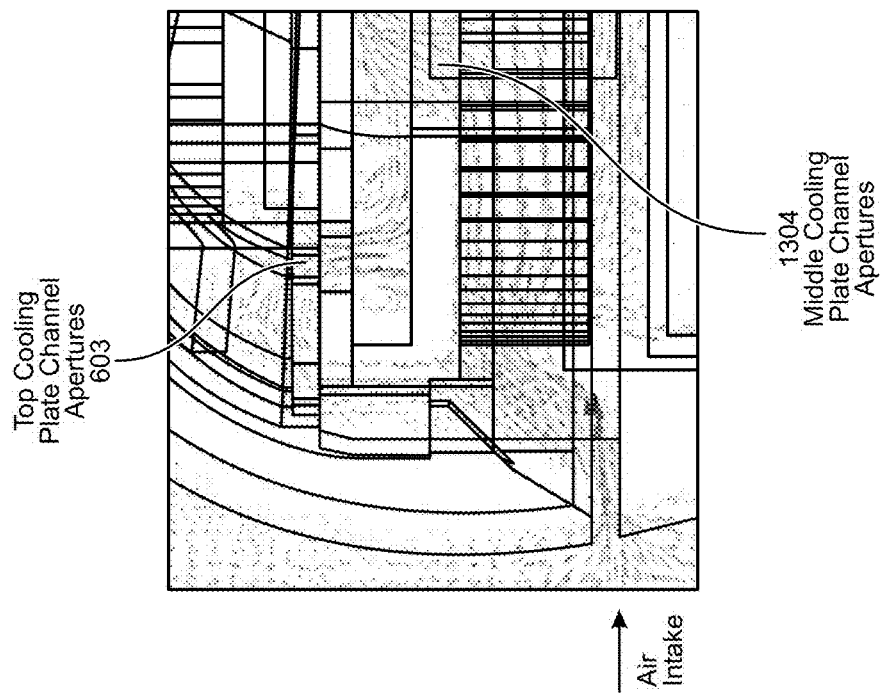
FIG. 44 shows details of air flow into the ambient intake gap in accordance with some embodiments.
Figure 43:
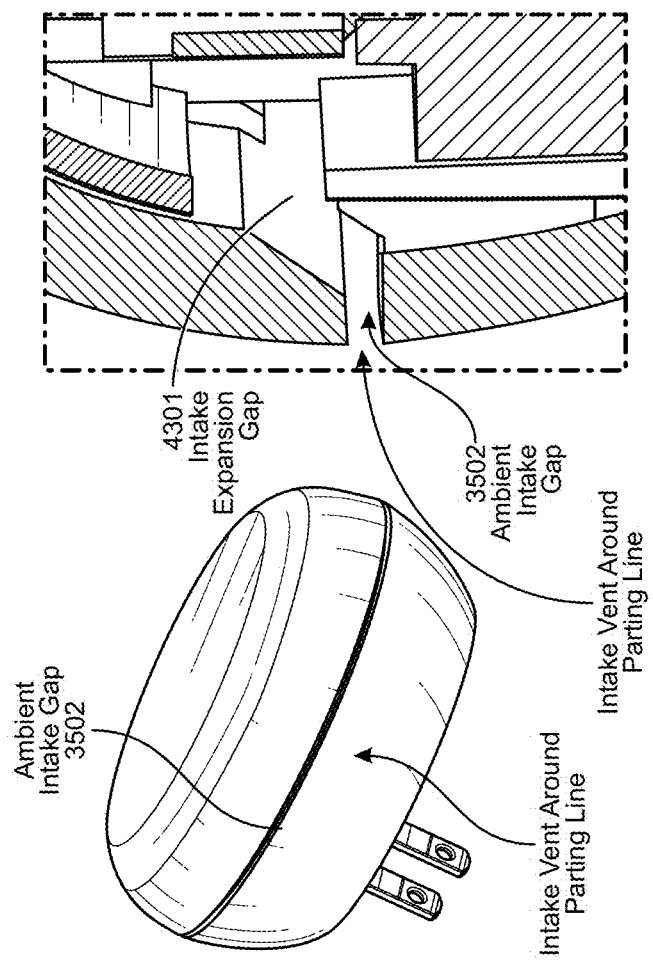
FIG. 43 shows details of the ambient intake gap in accordance with some embodiments.

Turning now to FIG. 43, the ambient intake gap 3502 is substantially 1 mm for safety reasons as previously described but gives way to an expansion gap 4301 which decreases the velocity of the incoming air for increased directional control. FIG. 44 shows air flowing through the expansion gap and into various apertures such as top cooling plate channel apertures 603 and middle plate channel apertures 1304.

Turning now to FIG. 45, air flow into the bottom side of the RF board 104 through the ambient air gap 3501 is depicted according to some embodiments. As illustrated, air is drawn in through a portion of the ambient intake gap 3502 and guided by the fin channels 1301 to the channel apertures 1304, which include an entry angle 1303 configured to direct air flow toward the air flow aperture 802 in the RF board 104 as previously described.

Figure 46:
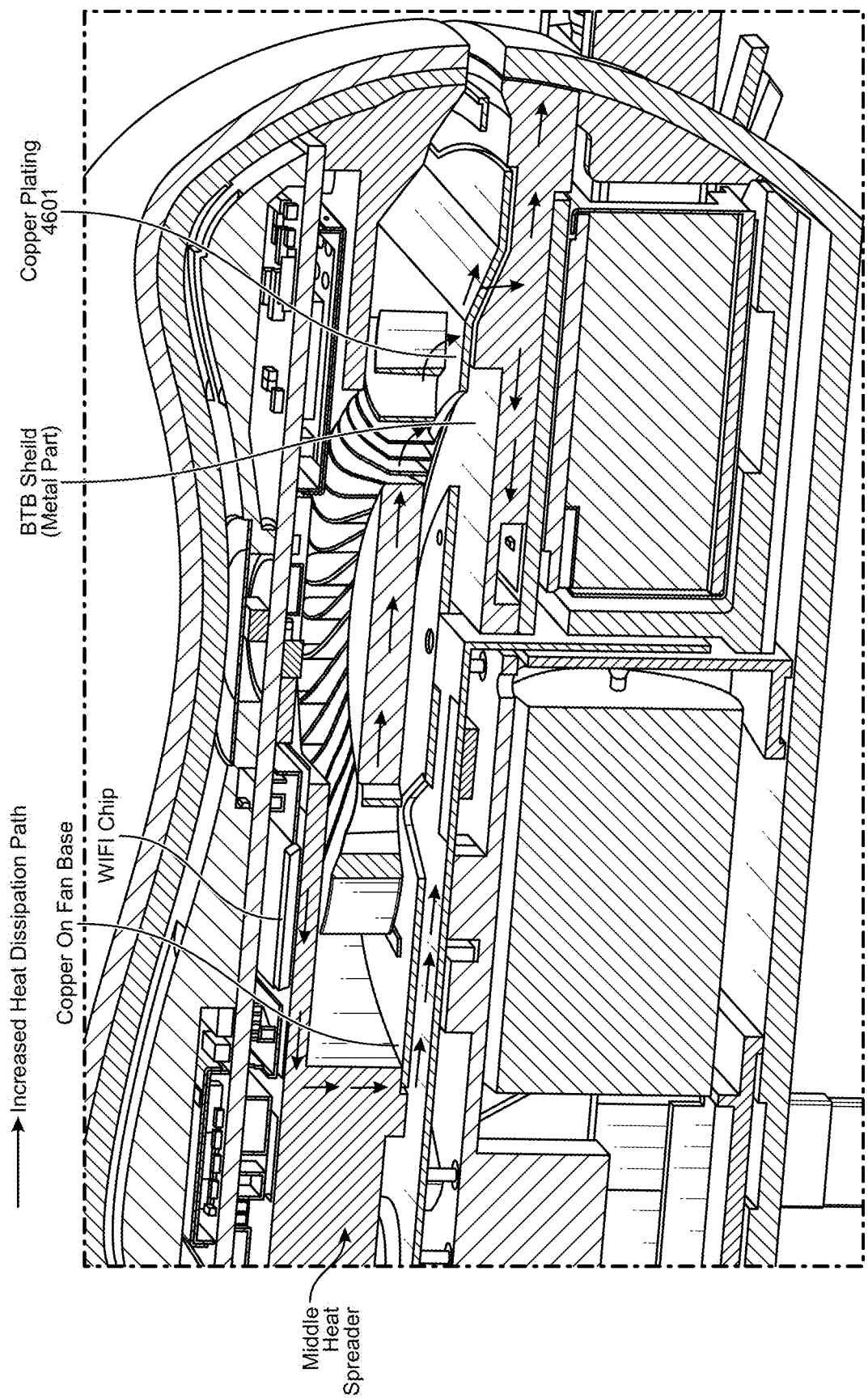
FIG. 46 illustrates a conduction heat path through the middle cooling plate in accordance with some embodiments.

FIG. 46 shows a heat transfer path for the Wi-Fi chip 903, CPU chip 904, or other board components, where, in some embodiments, the middle cooling plate 105 and or fan plate 1305 include a copper platting 4601 configured to increase the rate and/or distance of heat transfer. In some embodiments, the fan plate 1305 and/or copper plating 4601 is configured to conduct heat to and/or transfer heat to the BTB shield 108, creating a larger, more effective area to dissipate heat.

Figure 47:
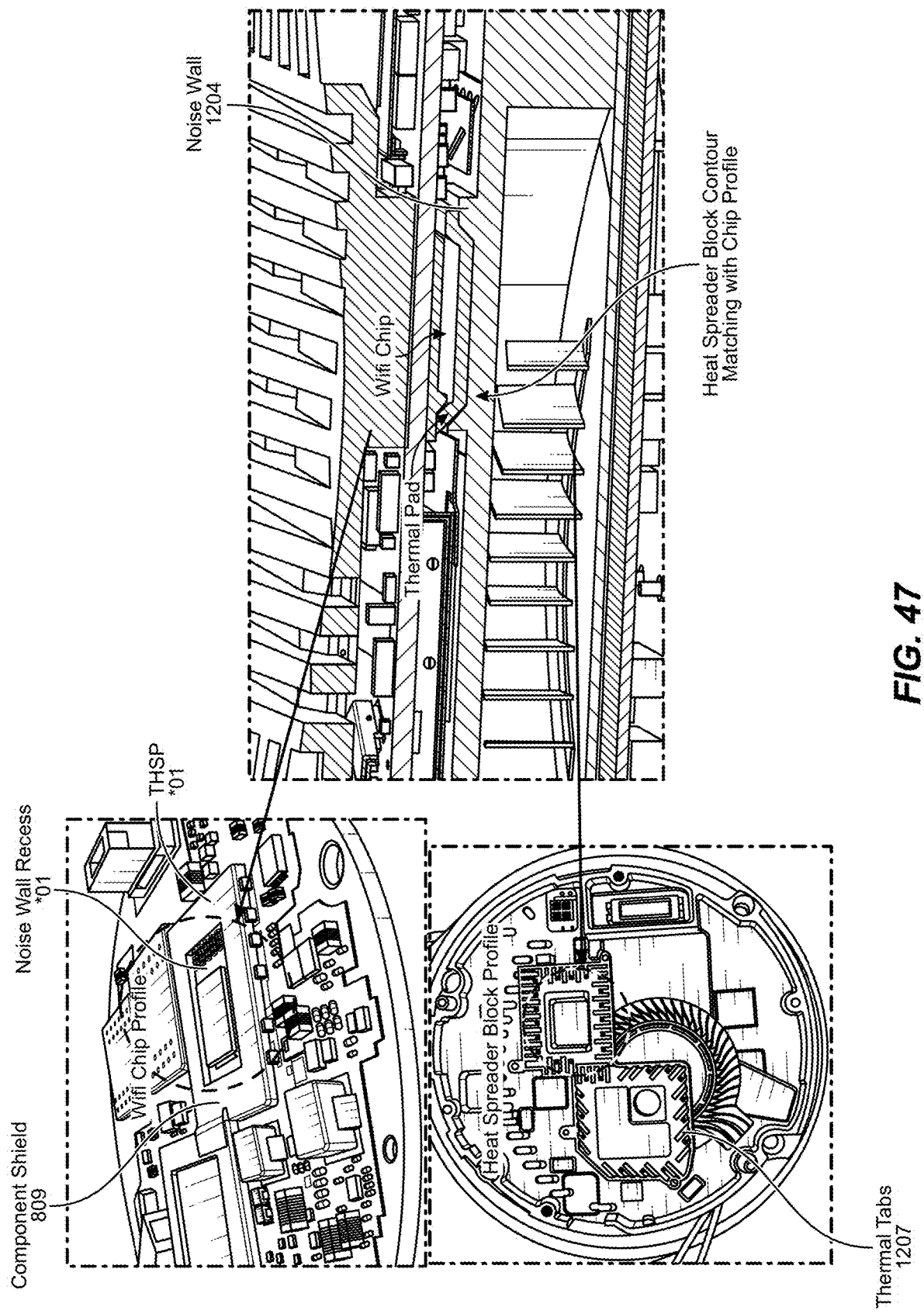
FIG. 47 depicts a section view of the noise wall in accordance with some embodiments.

Wi-Fi chips are highly susceptible to noise because they operate in high-frequency bands (commonly 2.4 GHZ, 5 GHZ, and 6 GHZ) where electromagnetic interference (EMI) and signal degradation are significant challenges. Noise can originate from various sources, both internal and external, and can severely impact the chip's performance by reducing signal integrity, increasing error rates, or causing communication failures. FIG. 47 shows a portion of the cooling system configured to also add noise isolation to the Wi-Fi chip. By extending the middle cooling plate noise wall 1204 into a noise wall recess formed by the noise wall 1204, the noise wall 1204 at least partially surrounds the Wi-Fi chip, and RF noise impacting the Wi-Fi chip is significantly reduced.

Figure 48:
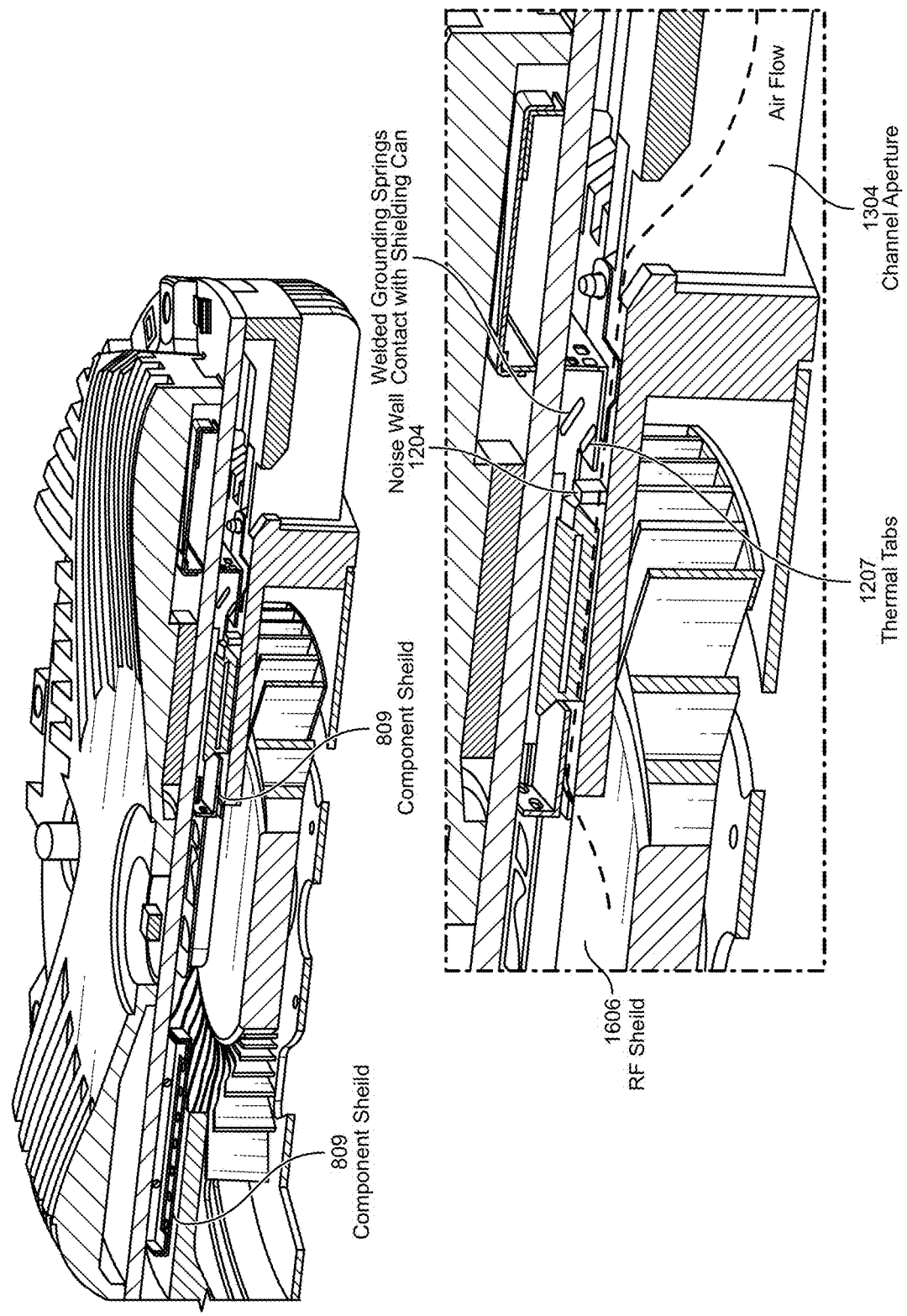
FIG. 48 shows an air flow path around the Wi-Fi chip in accordance with some embodiments.
Figure 49:
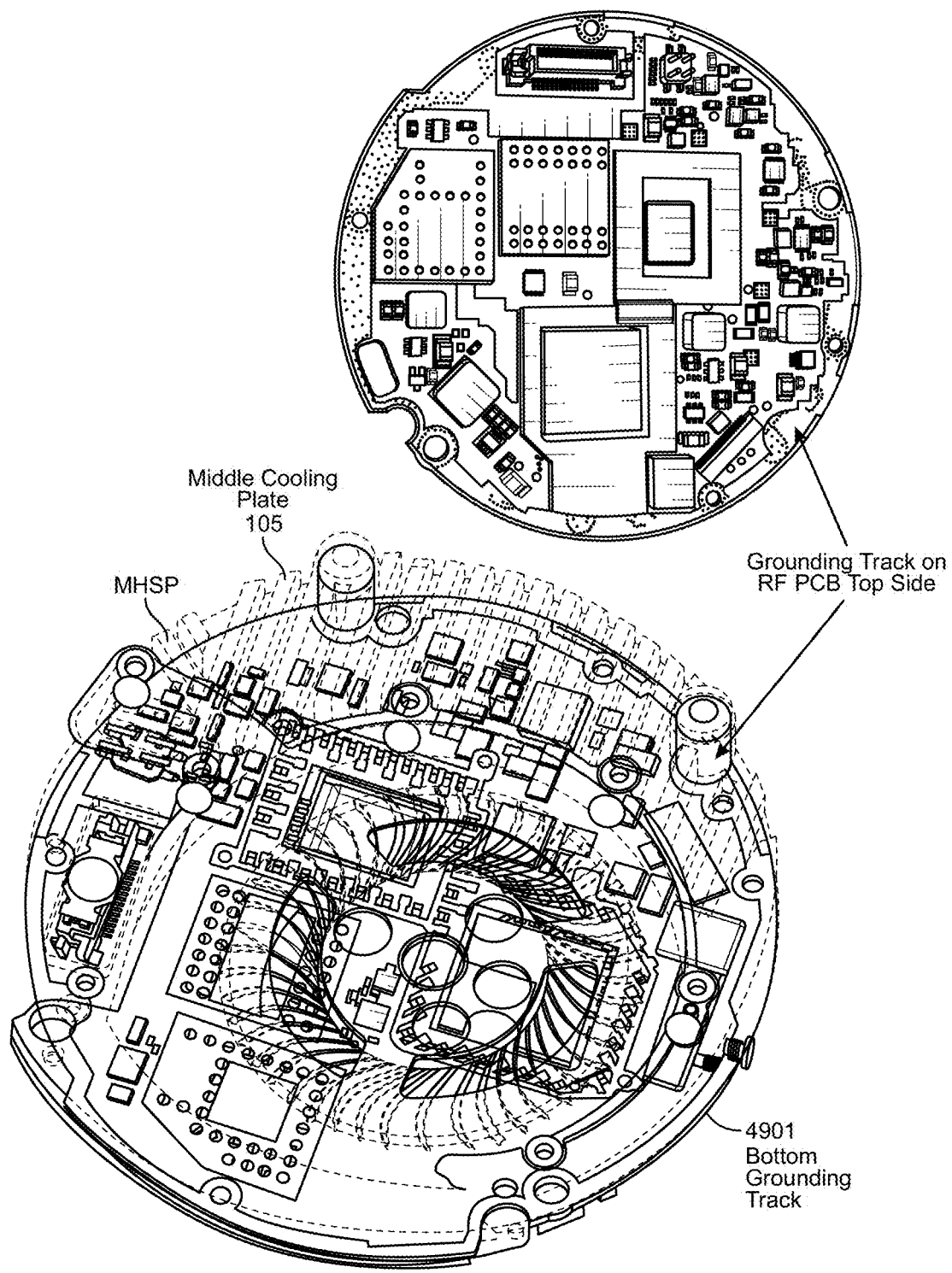
FIG. 49 illustrates the bottom grounding track of the RF board in accordance with some embodiments.
Figure 50:
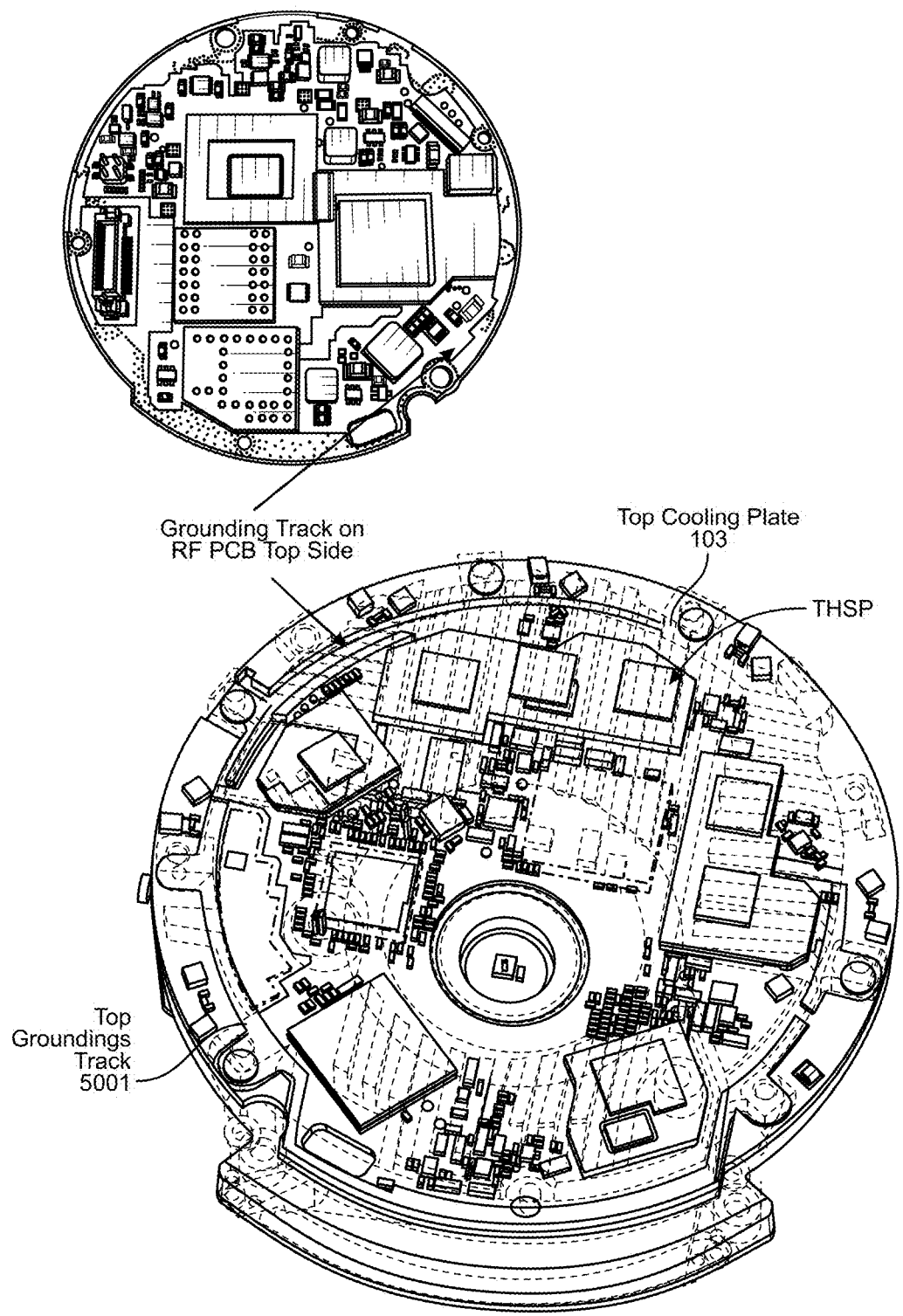
FIG. 50 shows the top bottom grounding track of the RF board in accordance with some embodiments.

FIG. 48 depicts the airflow around the Wi-Fi chip 903 through the thermal tabs 1207 in accordance with some embodiments. In some embodiments, the middle cooling plate 105 includes one or more thermal tabs 1207 are configured to increase heat transfer from a component shield 809, act as a noise shield, and/or function as a mechanical barrier for debris, further increasing the signal isolation and/or protection of the Wi-Fi chip 903 and/or CPU chip 904. FIG. 49 depicts the bottom RF board bottom grounding track 4901 pattern when the middle cooling plate 105 (also referred to as a middle heat spreader; MHSP) is coupled to the bottom of the RF board 104. FIG. 50 depicts the top RF board grounding track 5001 pattern when the top cooling plate 103 (also referred to as a top heat spreader; THSP) is coupled to the top of the RF board 104. In some embodiments, the top grounding track 5001 and the bottom grounding track 4901 are configured to provide enclosure isolation, RF shielding, and/or thermal transfer to a respective cooling plate.

Figure 51:
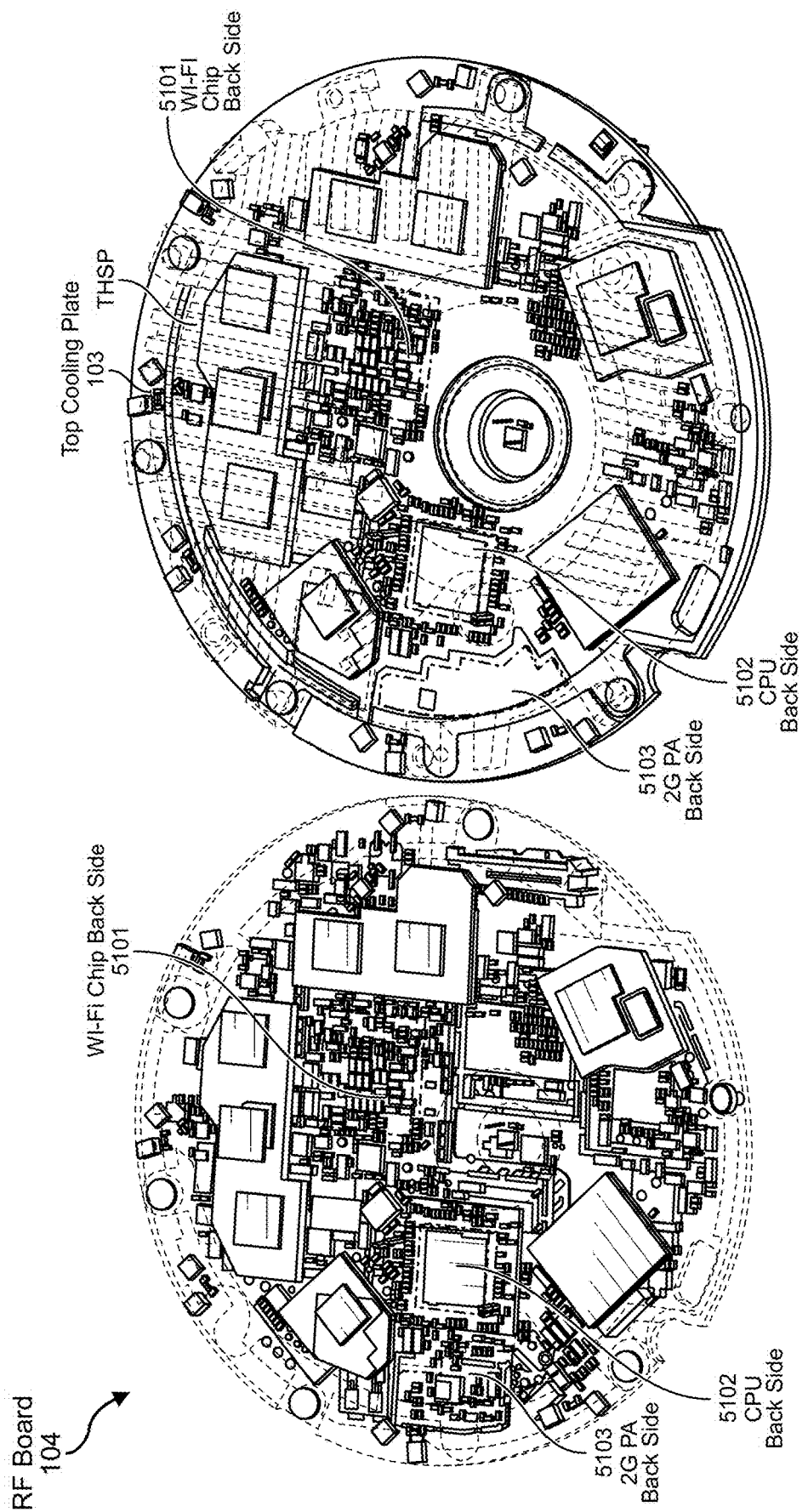
FIG. 51 shows heat dissipation patterns on the top of the RF board in accordance with some embodiments.

FIG. 51 shows additional details relating to the heat transfer from the RF board top surface to the top cooling plate 103 in accordance with some embodiments. In some embodiments, the top cooling plate 103 and/or the air that the top cooling plate 103 directs, is configured to provide cooling to one or more of the Wi-Fi chip back side 5101, the CPU chip backside 5102, and/or the 2G PA backside 5103, as well as other heat producing components. In some embodiments, the CPU, Wi-Fi chip, and 2G Power Amplifier (PA) are placed on the bottom side of the RF PCB, while the Bluetooth chip, 2G PA, 6G PA, and 5G PA are placed on the top side of the RF PCB, with a deliberate misalignment in the z-direction between each board component. By arranging these components in this manner, heat stack-up between the top and bottom sides of the RF PCB is avoided, reducing thermal interference between the components.

Figure 52:
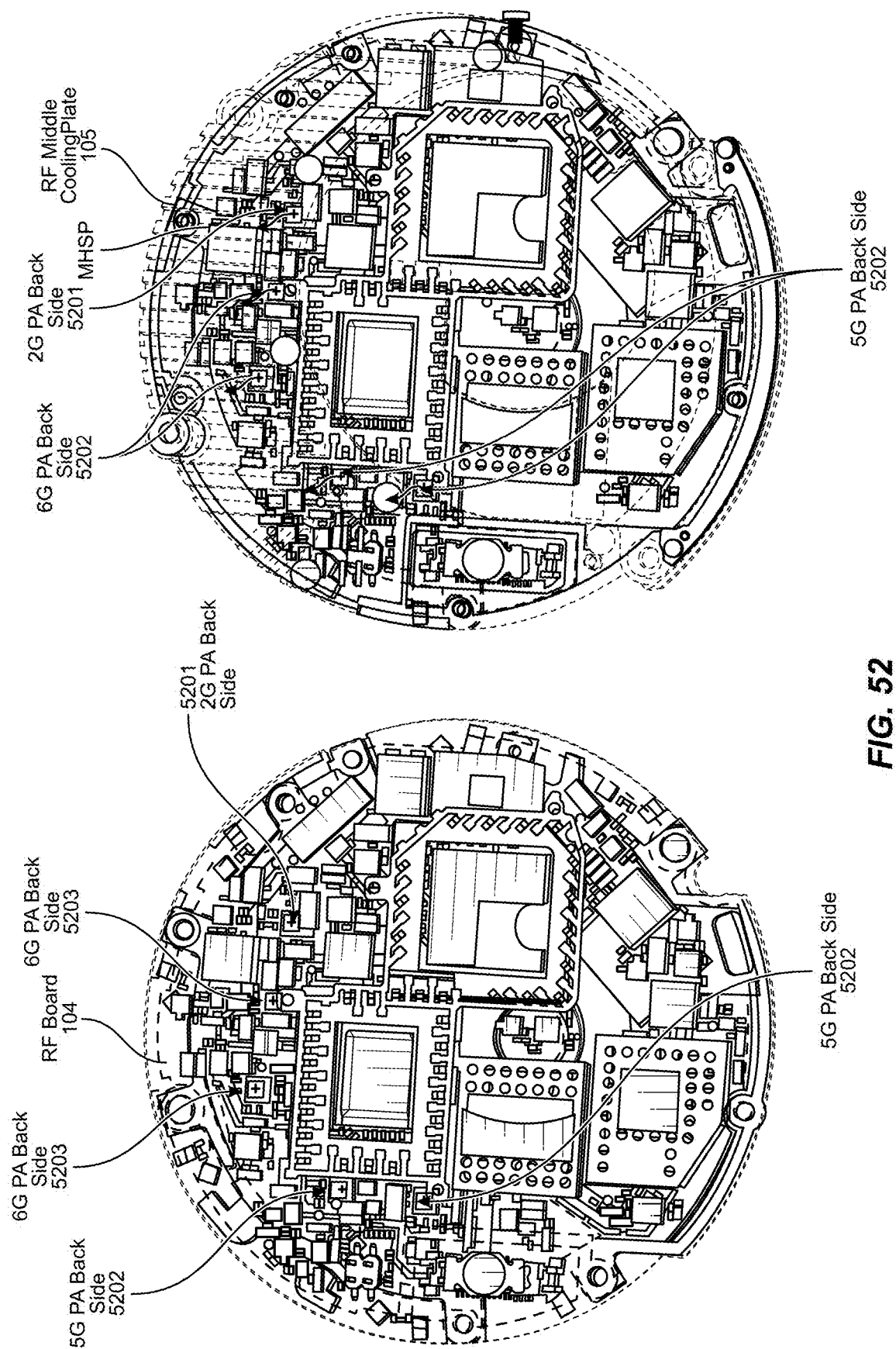
FIG. 52 illustrates heat dissipation patterns on the bottom of the RF board in accordance with some embodiments.
Figure 53:
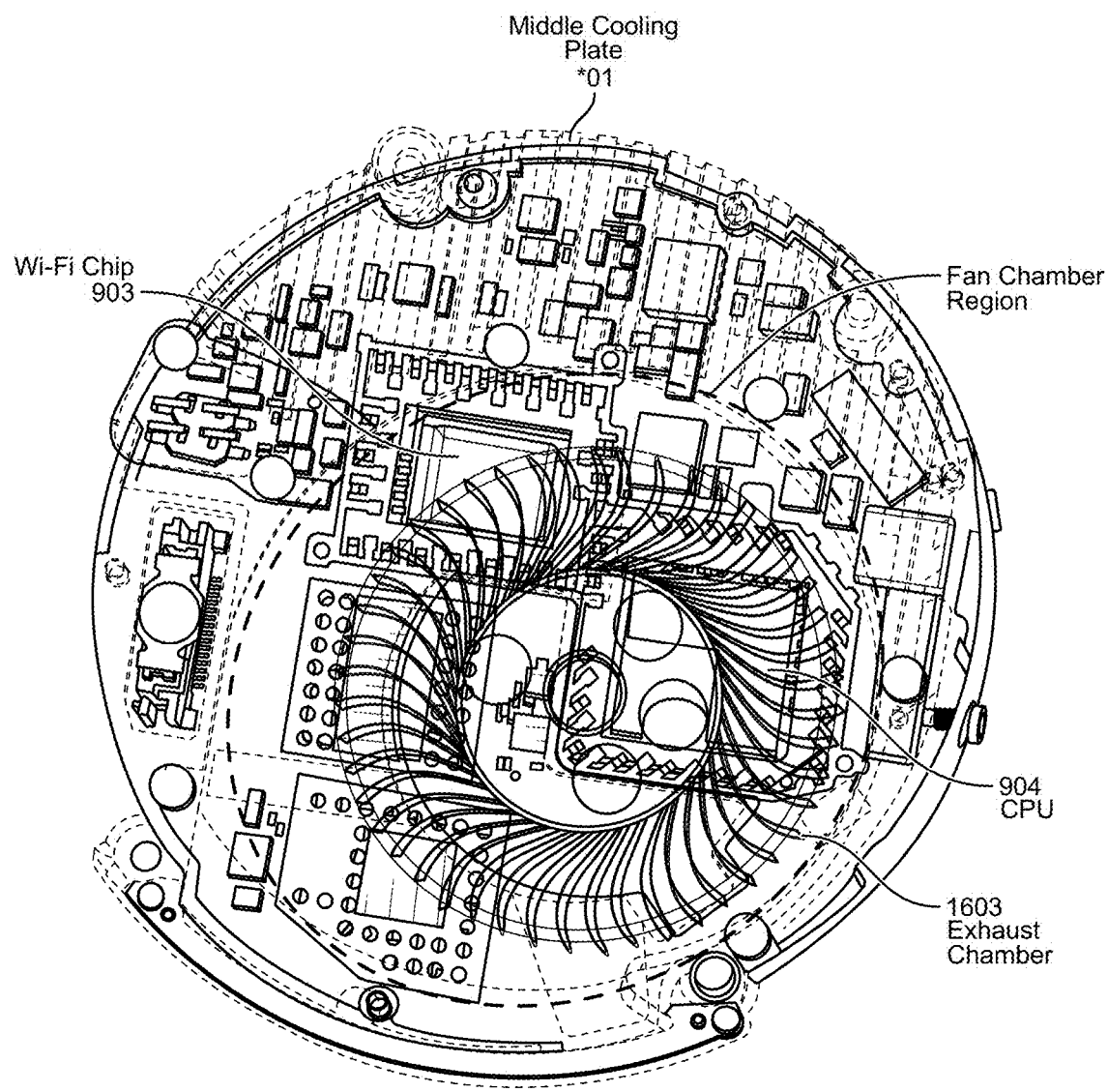
FIG. 53 depicts the Wi-Fi chip and CPU chip position above the exhaust chamber in accordance with some embodiments.

FIG. 52 shows additional details relating to the heat transfer from the RF board bottom surface to the middle cooling plate 105 in accordance with some embodiments. In some embodiments, the misalignment of components also allows heat from the backside of the 2G PAs 5201, 6G PAs 5203, and 5G PAs 5202 on the top side of the RF PCB to be transferred to the middle cooling plate 105, which further benefits the cooling of these high-power components, improving the efficiency and longevity of the RF board 104. FIG. 53 illustrates the location of the CPU chip 904 and Wi-Fi chip 903 within a perimeter defined by the exhaust chamber 1603 (fan chamber region), ensuring maximum heat dissipation by the fan.

Figure 54:
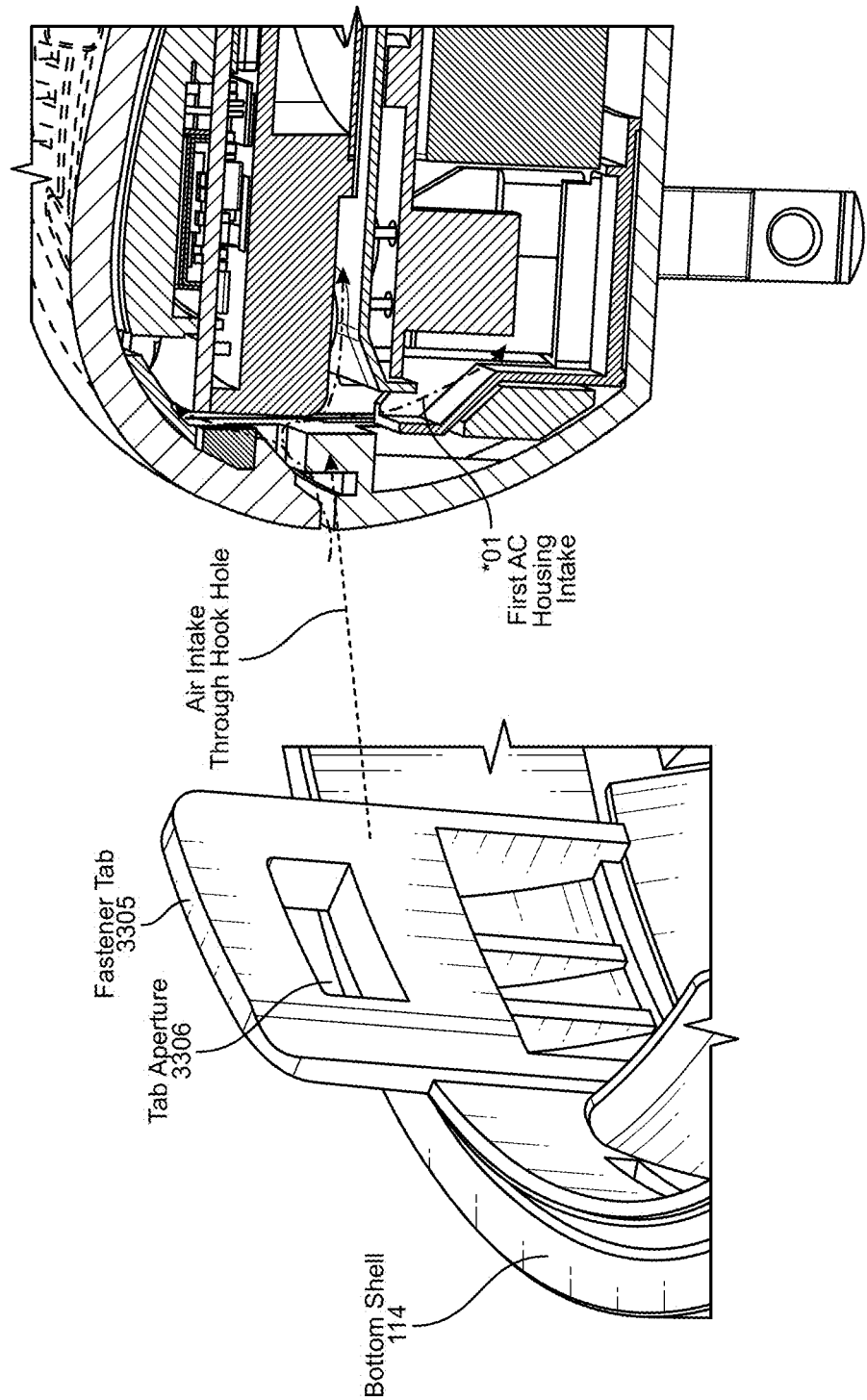
FIG. 54 shows details of air flow through a fastener tab in accordance with some embodiments.

Turning now to FIG. 54, the bottom shell 114 includes one or more fastener tabs 3305 that include a tab aperture 3306 configured to enable intake air to pass through, as described supra. In some embodiments, this allows more airflow as the resistance of the tab structure to airflow is minimized. In some embodiments, one or more tab apertures 3306 are spaced from other signal hub components to enable air passing through the tab aperture to flow to a top, middle, and lower section of the signal hub 100.

Figure 55:
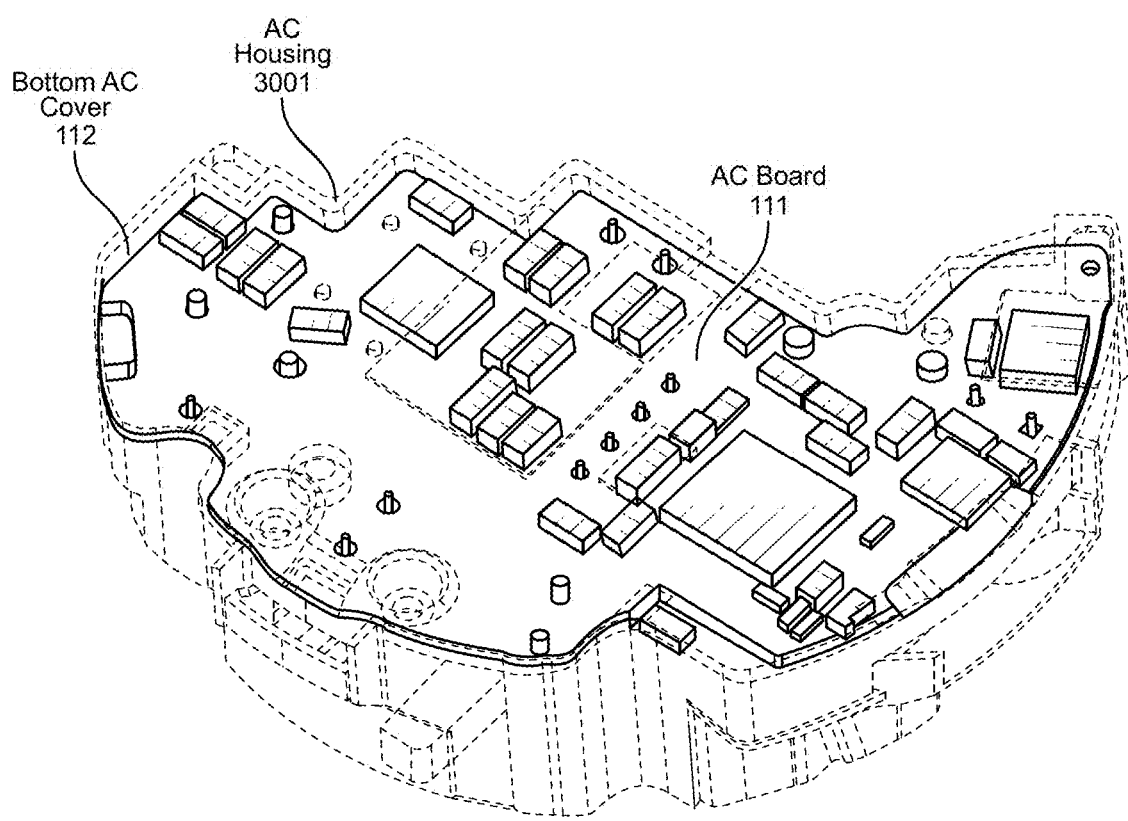
FIG. 55 shows a transparent view of the AC housing in accordance with some embodiments.
Figure 56:
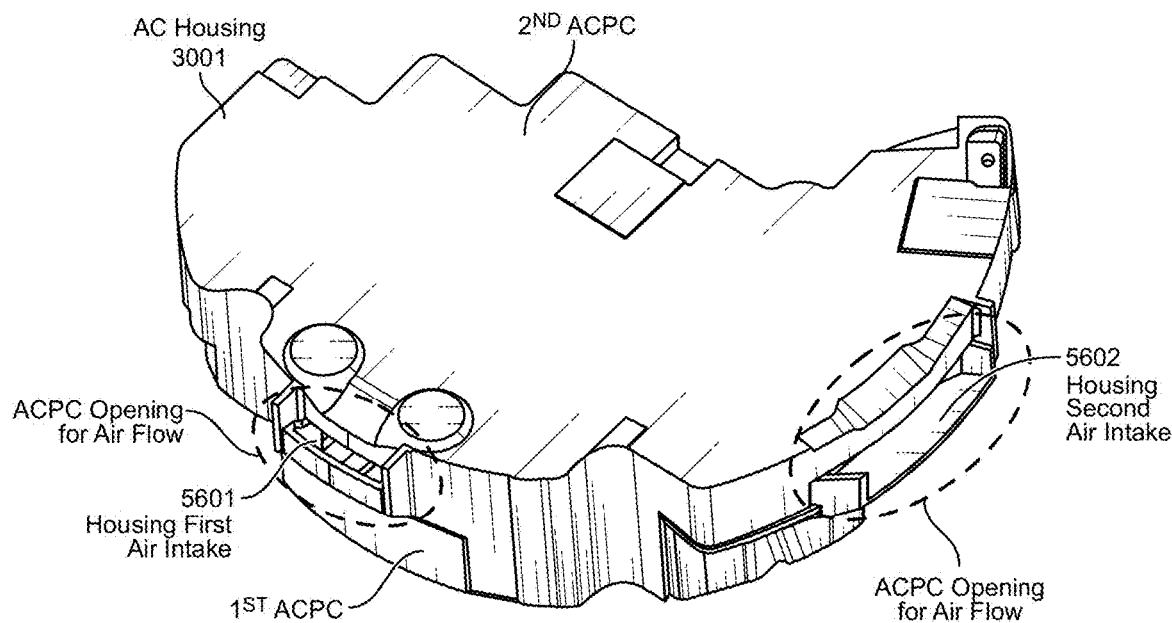
FIG. 56 illustrates a first solid perspective view of the AC housing in accordance with some embodiments.
Figure 57:
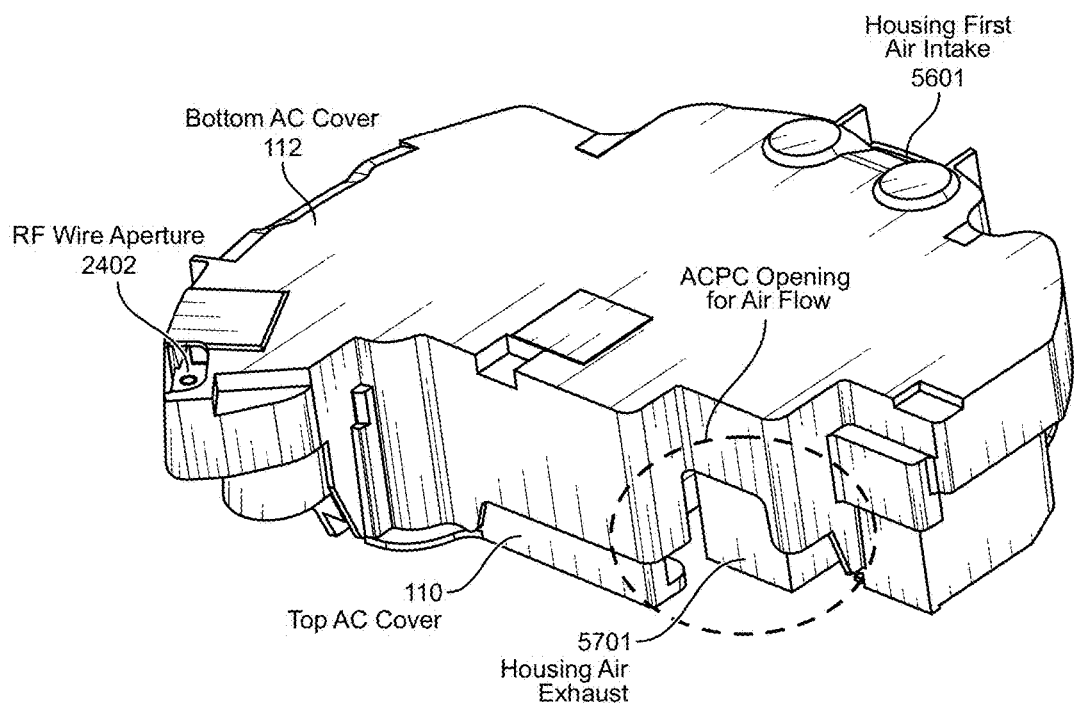
FIG. 57 illustrates a second solid perspective view of the AC housing in accordance with some embodiments.
Figure 58:
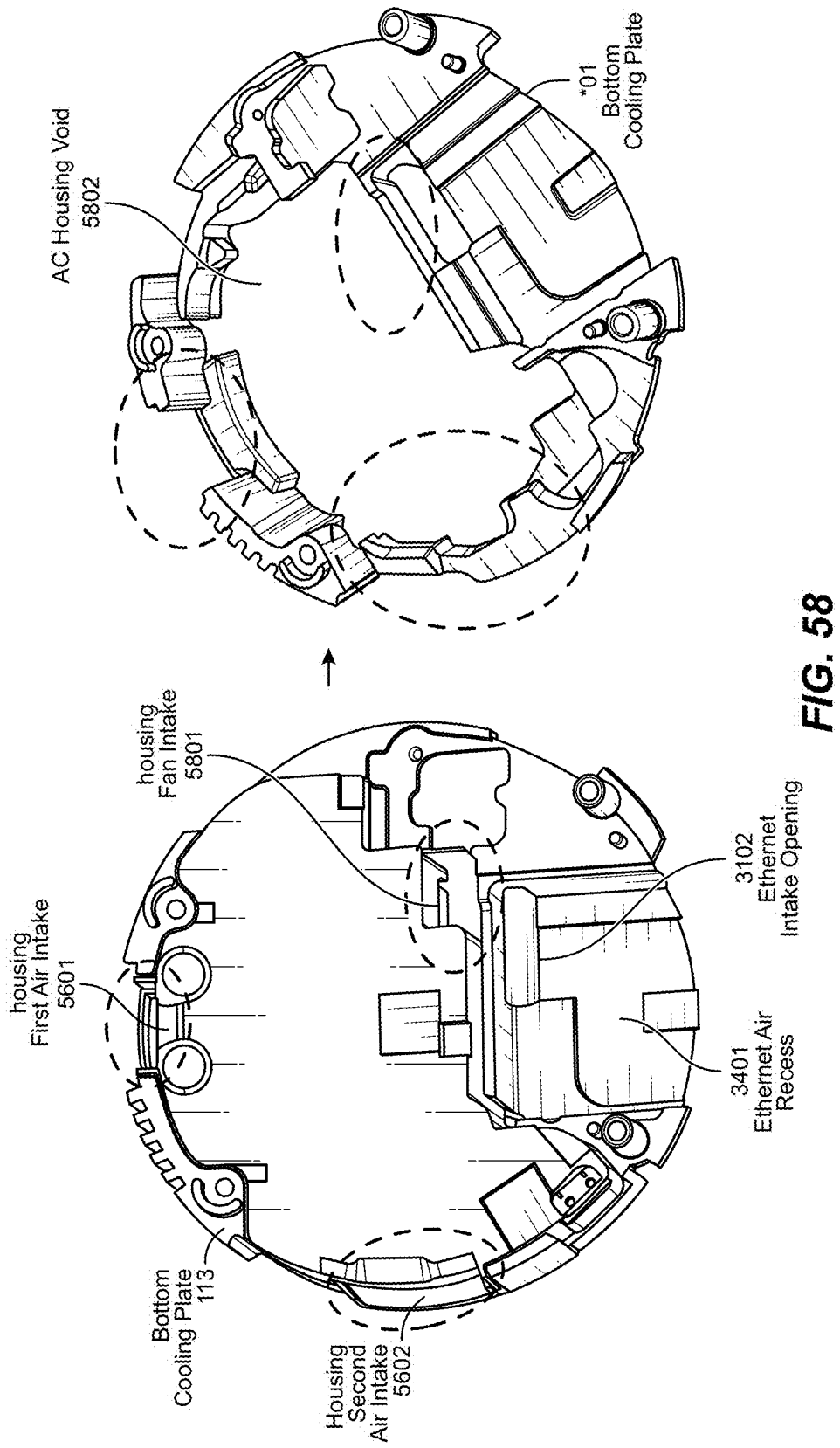
FIG. 58 show the AC housing positioned within the bottom cooling plate AC housing void in accordance with some embodiments.

FIG. 55 shows the AC board 111 encased in the AC housing 3001 in accordance with some embodiments, with the bottom AC cover 112 (2nd ACPC) shown on top in accordance with some embodiments. FIG. 56 shows a rear (towards the plug 115) perspective view of the AC housing 3001, including the housing first intake 5601 and a housing second intake 5602 circled for emphasis. The housing air exhaust 5701, as shown in FIG. 57, is formed in part by missing portion of the side wall of the bottom AC cover 112, and/or is formed in part by a missing portion of the top surface of the top AC cover 110 (1st ACPC), in accordance with some embodiments. In some embodiments, the housing air exhaust 5701 is configured to cooperate with the bottom cooling plate 113 to form a housing fan intake 5801 as illustrated in FIG. 58. FIG. 58 also shows the bottom cooling plate 113 (also referred to herein as a bottom heat spreader; BHSP) with the AC housing 3001 removed from the AC housing void 5802, with the air intake and exhaust regions associated with the AC housing 3001 identified with circles on the bottom cooling plate 113.

Figure 59:
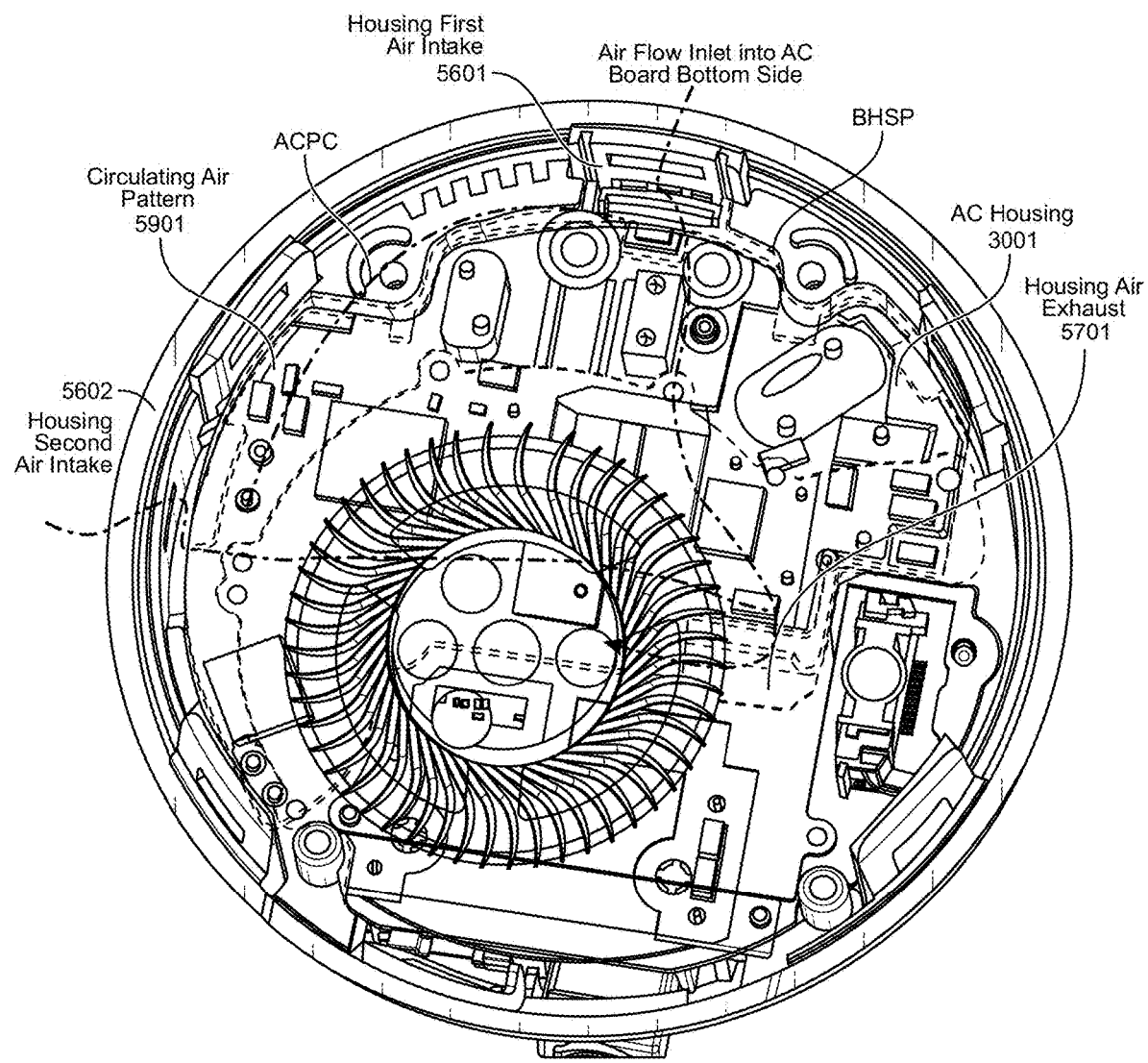
FIG. 59 depicts airflow through the AC housing in accordance with some embodiments.

FIG. 59 shows the air path through the AC housing 3001 in accordance with some embodiments. In some embodiments, the flow through the AC housing from the two directions provided by the housing first air intake 5601 and the housing second air intake 5602 are configured to create a circulating air pattern 5901 within the AC housing, thereby minimizing dead air space within the housing when the AC board 111 is producing heat.

Figure 60:
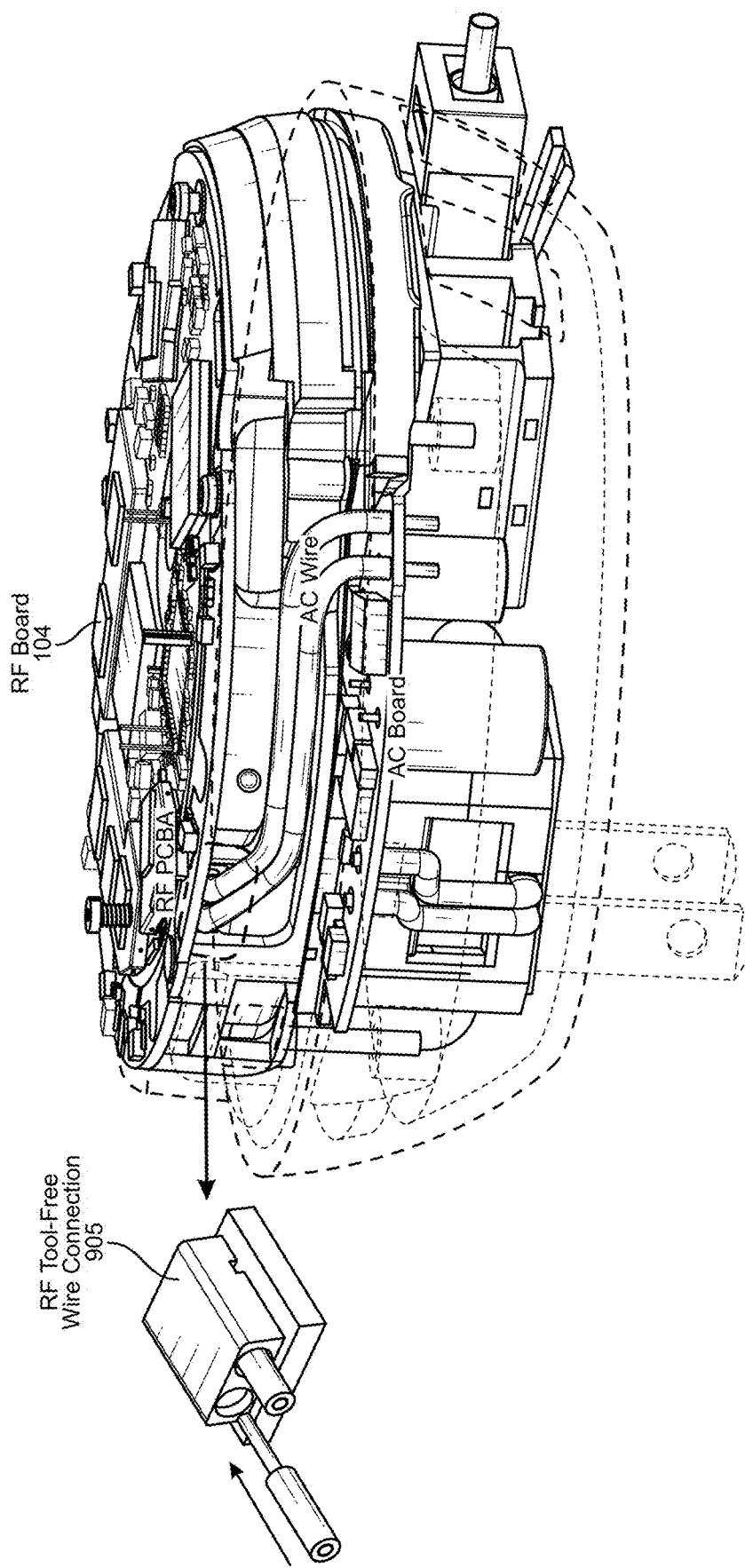
FIG. 60 shows a transparent view of the signal hub highlighting the RF tool-free wire connection in accordance with some embodiments.

Turning now to FIG. 60, a transparent assembled view of the signal hub is depicted in accordance with some embodiments. The RF tool-free wire connection 905 is shown as a POKE-HOME connection in this non-limiting example, where the POKE-HOME connection is configured to form a secure electrical connection with the lead end of a wire when the wire is pushed into a receptacle of the POKE-HOME connection, where the secure electrical connection can be formed without the use of tools. This allows for easy of assembly, where the wire and tool-free connection allows for a change in a wire connection location on an RF board without the need to change the wire connection on an AC board.

Figure 61:
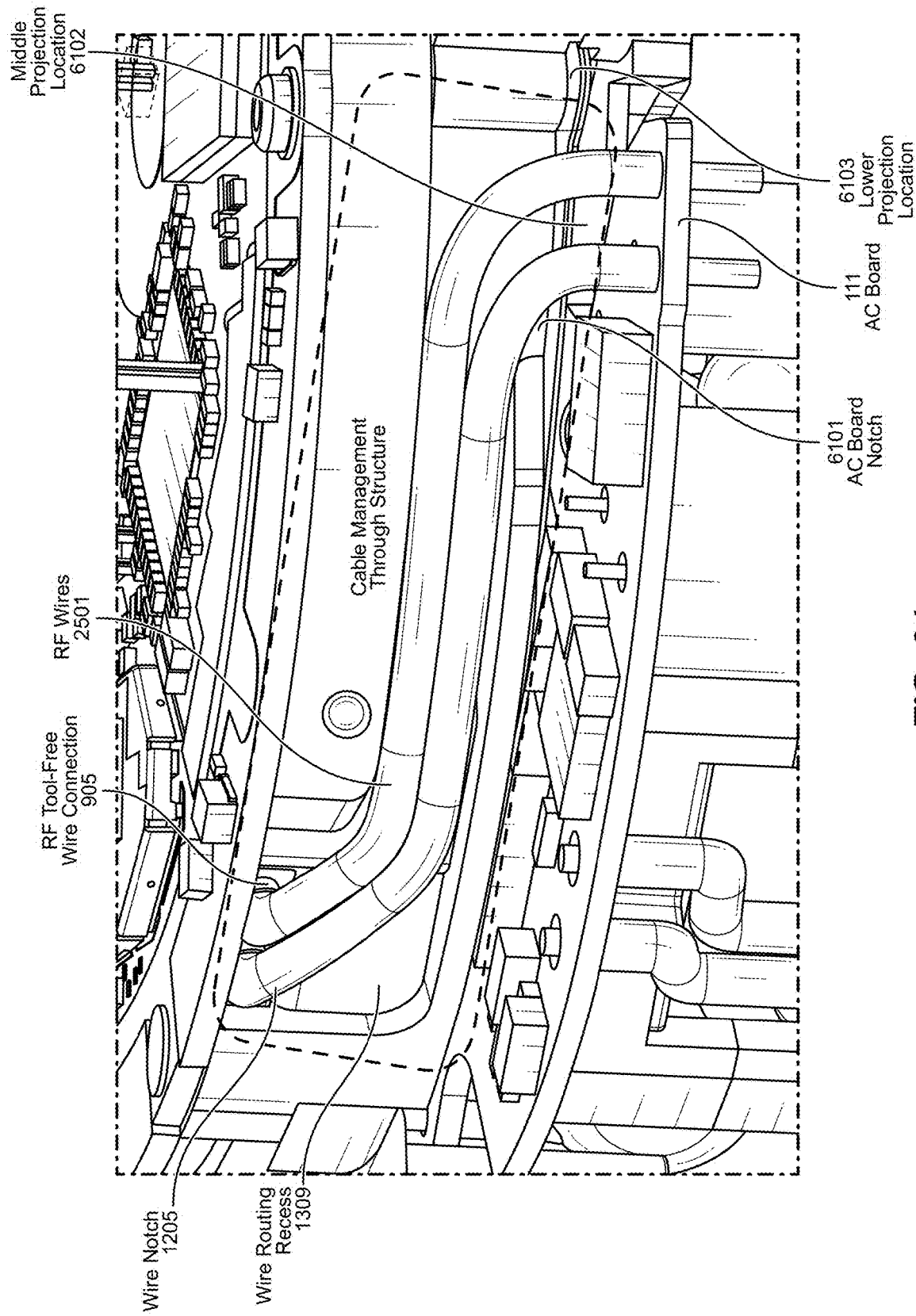
FIG. 61 shows details of the wire routing recess in accordance with some embodiments.
Figure 62:
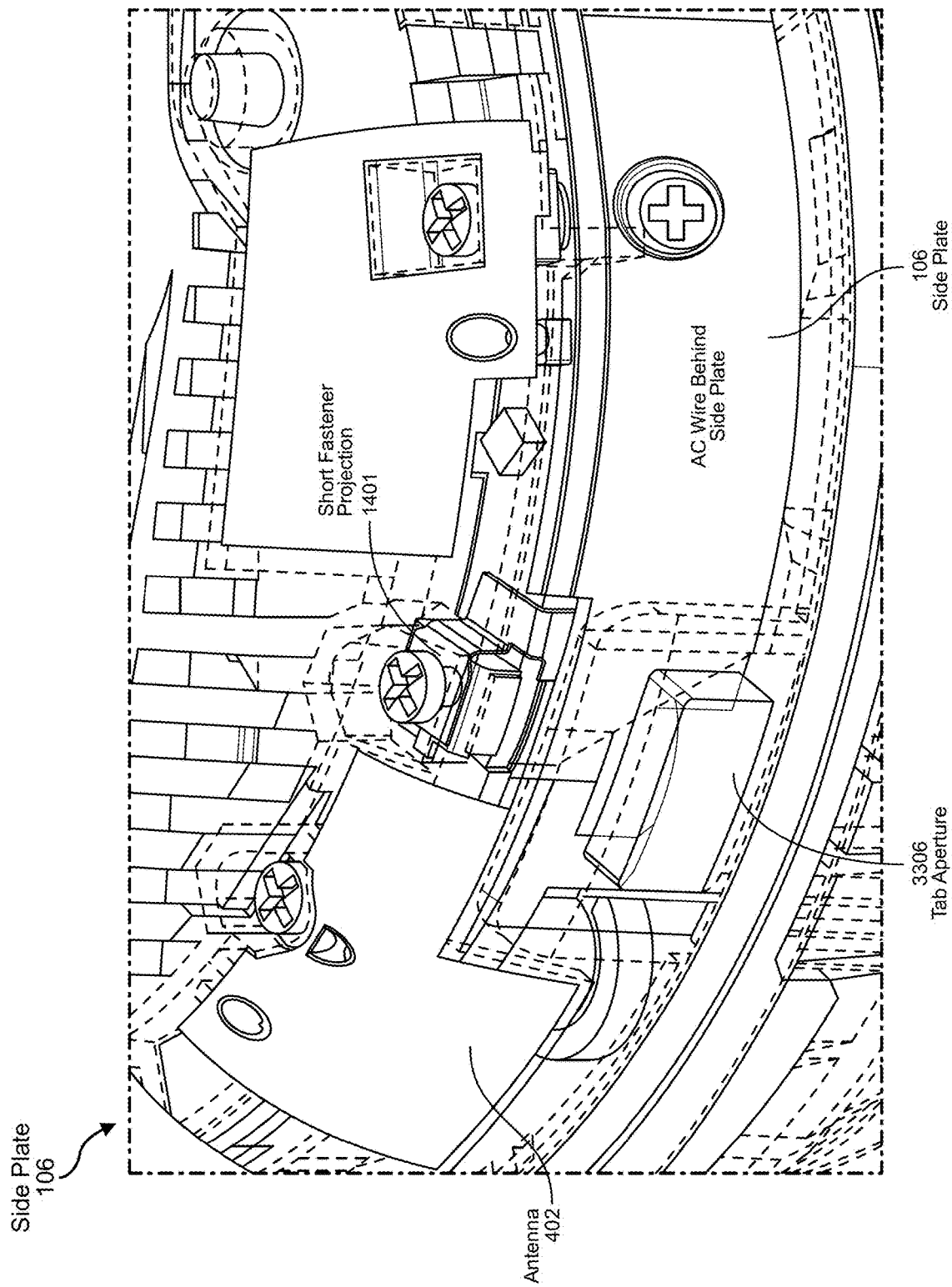
FIG. 62 illustrates the side plate coupled to the middle cooling plate in accordance with some embodiments.

FIG. 61 shows a zoomed view of FIG. 60 depicting the wire routing recess 1309 in accordance with some embodiments. In some embodiments, the RF wires 2501 are configured to connect to the RF tool-free connection 905 through the wire notch 1205 as previously described, where the wire notch 1205 enables access to the RF tool-free connection 905 with the middle cooling plate 105 is coupled to the RF board 104. In some embodiments, the wire routing recess 1309 is configured to guide RF wires 2501 from the AC board notch to the RF tool-free connection 905. FIG. 61 shows a middle projection 1402 location 6102 and lower projection 1403 location 6103 when the side plate 106 is attached. In some embodiments, the lower projection 1403 is configured to cover at least a portion of the AC board notch 6101 when assembled. FIG. 62 shows the side plate 106 coupled to the wire recess, where the side plate is also coupled to the short fastener projection 1401 to increase RF shielding capabilities. In some embodiments, the side plate 106 is both electrically and thermally conductive, and/or is configured to act as part of the middle cooling plate 105 for removing heat from one or more heat producing components.

According to some embodiments, the signal hub, or portions thereof, may be described using one or more of the following clauses and/or any combination of the following clauses, which as provided below, can be embodied via a system, or as one of ordinary skill in the art would understand, as a device, apparatus and/or a method:

Clause 1. A system comprising: a signal hub housing, a top shell, a bottom shell, an ambient air gap, a top cooling plate, a radio frequency (RF) board, and a middle cooling plate; wherein the top shell is configured to couple to the bottom shell to form the signal hub housing; wherein the ambient air gap is formed between the top shell and the bottom shell when the top shell is coupled to the bottom shell; and wherein the ambient air gap is configured to enable ambient air to pass over the top cooling plate, the RF board, and the middle cooling plate.

Clause 2. The system of clause 1, wherein the top cooling plate is coupled to a top surface of the RF board.

Clause 3. The system of clause 2, wherein the middle cooling plate is coupled to a bottom surface of the RF board.

Clause 4. The system of clause 3, wherein the ambient air gap extends around a perimeter of the signal hub housing along a same plane.

Clause 5. The system of clause 4, wherein the top shell is configured to surround all sides of the top cooling plate and RF board.

Clause 6. The system of clause 5, wherein the middle cooling plate includes a fan.

Clause 7. The system of clause 6, wherein the fan is configured to draw air from the ambient air gap into the top shell.

Clause 8. The system of clause 7, wherein the fan is configured to exhaust the air from the fan through an ambient exhaust gap formed in the ambient air gap.

Clause 9. The system of clause 6, wherein the fan is configured to create a vacuum force at an ambient intake gap within the ambient air gap.

Clause 10. The system of clause 9, wherein the vacuum force is configured to draw air over and through the top cooling plate from a plurality of directions.

Clause 11. The system of clause 10, wherein the top cooling plate comprises a plurality of fins; wherein a fin channel is formed between each of the plurality of fins; and wherein one or more fin channels include a channel aperture.

Clause 12. The system of clause 11, wherein the channel aperture includes an angled intake; and wherein the angled intake is configured to direct airflow at an angle to a surface of the RF board.

Clause 13. The system of clause 10, wherein the top cooling plate includes a top plate depression.

Clause 14. The system of clause 13, wherein the top plate depression includes a depression aperture at a lowest portion.

Clause 15. The system of clause 14, wherein the top plate depression is configured to contact the RF board at the lowest portion.

Clause 16. The system of clause 9, wherein the vacuum force is configured to draw air over and through the middle cooling plate from a plurality of directions.

Clause 17. The system of clause 16, wherein the middle cooling plate comprises a plurality of fins; wherein a fin channel is formed between each of the plurality of fins; and wherein one or more fin channels include a channel aperture.

Clause 18. The system of clause 11, wherein the channel aperture includes an angled intake; and wherein the angled intake is configured to direct airflow at an angle to a surface of the RF board.

Clause 19. The system of clause 10, wherein the middle cooling plate includes an exhaust fin.

Clause 20. The system of clause 19, wherein the exhaust fin is configured to direct a majority of exhaust air away from the bottom shell.

Clause 21. A system comprising a signal hub housing, a top shell, a bottom shell, an antenna carrier, a top cooling plate, a radio frequency (RF) board, and a middle cooling plate; wherein the top shell is configured to couple with the bottom shell to form the signal hub housing, wherein the antenna carrier is configured to be coupled to the top cooling plate; wherein the top cooling plate is configured to be coupled to a first side the RF board; and wherein the middle cooling plate is configured to be coupled to a second side of the RF board.

Clause 22. The system of clause 21, wherein the antenna carrier includes a plurality of antennas.

Clause 23. The system of clause 22, wherein the antenna carrier includes a carrier ring; and wherein the carrier ring includes a curved surface configured to contour to a flow guide at a top inner surface of the top shell.

Clause 24. The system of clause 22, wherein the top cooling plate is configured to electrically couple to the plurality of antennas when assembled.

Clause 25. The system of clause 24, wherein the top cooling plate includes a plurality of short fasteners.

Clause 26. The system of clause 25, wherein each of the plurality of short fasteners is configured to electrically couple to a short connection of a respective antenna of the plurality of antennas.

Clause 27. The system of clause 26, wherein each of the plurality of short fasteners is configured to tune the respective antenna to a particular frequency.

Clause 28. The system of clause 26, wherein the top cooling plate includes one or more RF decouplers.

Clause 29. The system of clause 28, wherein the one or more RF decouplers are formed from a respective projection extending from a perimeter of the top cooling plate.

Clause 30. The system of clause 29, wherein the one or more RF decouplers are positioned between a first antenna and a second antenna on the antenna carrier.

Clause 31. The system of clause 30, wherein the one or more RF decouplers are configured to reduce over-the-air coupling between the first antenna and the second antenna.

Clause 32. The system of clause 30, wherein the one or more RF decouplers are configured to reduce current coupling between the first antenna and the second antenna.

Clause 33. The system of clause 30, wherein the one or more RF decouplers are configured to reduce over-the-air coupling between the first antenna and the second antenna; and wherein the one or more RF decouplers are configured to reduce current coupling between the first antenna and the second antenna.

Clause 34. The system of clause 30, wherein the one or more RF decouplers do not include a fastener aperture.

Clause 35. The system of clause 30, wherein the one or more RF decouplers include a hybrid decoupler, wherein the hybrid decoupler is configured couple the antenna carrier to the top cooling plate.

Clause 36. The system of clause 35, wherein the hybrid decoupler is not configured to couple to the short connection.

Clause 37. The system of clause 30, wherein the top cooling plate is configured to form a ground connection with the RF board electrically isolate components on the RF board from the plurality of antennas.

Clause 38. The system of clause 22, wherein the RF board includes a grounding track extending along a perimeter of the RF board.

Clause 39. The system of clause 38, where in the middle cooling plate is configured to electrically couple to the grounding track to electrically isolate components on the RF board from the plurality of antennas.

Clause 40. The system of clause 39, wherein the middle cooling plate includes a side plate configured to electrically isolate wires delivering electrical power to the RF board.

It is understood that the system is not limited in its application to the details of construction and the arrangement of components set forth in the previous description or illustrated in the drawings. The system and methods disclosed herein fall within the scope of numerous embodiments. The previous discussion is presented to enable a person skilled in the art to make and use the system according to some embodiments. Any portion of the structures and/or principles included in some embodiments can be applied to any and/or all embodiments: it is understood that features from some embodiments presented herein are combinable with other features according to some other embodiments. Thus, some embodiments of the system are not intended to be limited to what is illustrated but are to be accorded the widest scope consistent with all principles and features disclosed herein.

Some embodiments of the system are presented with specific values and/or setpoints. These values and setpoints are not intended to be limiting and are merely examples of a higher configuration versus a lower configuration and are intended as an aid for those of ordinary skill to make and use the system.

Any text in the drawings is part of the system's disclosure and is understood to be readily incorporable into any description of the metes and bounds of the system. Any functional language in the drawings is a reference to the system being configured to perform the recited function, and structures shown or described in the drawings are to be considered as the system comprising the structures recited therein. It is understood that defining the metes and bounds of the system using a description of images in the drawing does not need a corresponding text description in the written specification to fall with the scope of the disclosure.

Furthermore, acting as Applicant's own lexicographer, Applicant imparts the explicit meaning and/or disavow of claim scope to the following terms:

Applicant defines any use of "and/or" such as, for example, "A and/or B," or "at least one of A and/or B" to mean element A alone, element B alone, or elements A and B together. In addition, a recitation of "at least one of A, B, and C," a recitation of "at least one of A, B, or C," or a recitation of "at least one of A, B, or C or any combination thereof" are each defined to mean element A alone, element B alone, element C alone, or any combination of elements A, B and C, such as AB, AC, BC, or ABC, for example.

"Substantially" and "approximately" when used in conjunction with a value encompass a difference of 5% or less of the same unit and/or scale of that being measured (e.g., degrees, volume, mass, distance).

As used herein, "can" or "may" or derivations thereof are used for descriptive purposes only and is understood to be synonymous and/or interchangeable with "configured to" when defining the metes and bounds of the system.

In addition, the term "configured to" means that the limitations recited in the specification and/or the claims must be arranged in such a way to perform the recited function: "configured to" excludes structures in the art that are "capable of" being modified to perform the recited function but the disclosures associated with the art have no explicit teachings to do so. For example, a recitation of a "container configured to receive a fluid from structure X at an upper portion and deliver fluid from a lower portion to structure Y" is limited to systems where structure X, structure Y, and the container are all disclosed as arranged to perform the recited function. The recitation "configured to" excludes elements that may be "capable of" performing the recited function simply by virtue of their construction but associated disclosures (or lack thereof) provide no teachings to make such a modification to meet the functional limitations between all structures recited.

It is understood that the phraseology and terminology used herein is for description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled"

and variations thereof are used broadly and encompass both direct and indirect mountings, connections, supports, and couplings. Further, "connected" and "coupled" are not restricted to physical or mechanical connections or couplings.

The previous detailed description is to be read with reference to the figures, in which like elements in different figures have like reference numerals. The figures, which are not necessarily to scale, depict some embodiments and are not intended to limit the scope of embodiments of the system.

It will be appreciated by those skilled in the art that while the system has been described above in connection with some embodiments and examples, the system is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the system are set forth in the following claims.

What is claimed is:

1. A system comprising:
   a signal hub housing;
   a top shell;
   a bottom shell;
   an ambient air gap;
   a top cooling plate;
   a radio frequency (RF) board; and
   a middle cooling plate,
      wherein the top cooling plate is coupled to a top surface of the RF board;
      wherein the middle cooling plate is coupled to a bottom surface of the RF board;
      wherein the top shell is configured to couple to the bottom shell to form the signal hub housing,
      wherein the ambient air gap is formed between the top shell and the bottom shell when the top shell is coupled to the bottom shell,
      wherein the ambient air gap extends around a perimeter of the signal hub housing along a same plane, and
      wherein the ambient air gap is configured to enable ambient air to pass over the top cooling plate, the RF board, and the middle cooling plate.

2. The system of claim 1, wherein the top shell is configured to surround all sides of the top cooling plate and RF board.

3. The system of claim 2, wherein the middle cooling plate includes a fan.

4. The system of claim 3, wherein the fan is configured to draw air from the ambient air gap into the top shell.

5. The system of claim 4, wherein the fan is configured to exhaust the air from the fan through an ambient exhaust gap formed in the ambient air gap.

6. The system of claim 3, wherein the fan is configured to create a vacuum force at an ambient intake gap within the ambient air gap.

7. The system of claim 6, wherein the vacuum force is configured to draw air over and through the top cooling plate from a plurality of directions.

8. The system of claim 7, wherein the top cooling plate comprises a plurality of fins, wherein a fin channel is formed between each of the plurality of fins, and wherein one or more fin channels include a channel aperture.

9. The system of claim 8, wherein the channel aperture includes an angled intake, and wherein the angled intake is configured to direct airflow at an angle to a surface of the RF board.

10. The system of claim 8, wherein the channel aperture includes an angled intake, and wherein the angled intake is configured to direct airflow at an angle to a surface of the RF board.

11. The system of claim 7, wherein the top cooling plate includes a top plate depression.

12. The system of claim 11, wherein the top plate depression includes a depression aperture at a lowest portion.

13. The system of claim 12, wherein the top plate depression is configured to contact the RF board at the lowest portion.

14. The system of claim 7, wherein the middle cooling plate includes an exhaust fin.

15. The system of claim 14, wherein the exhaust fin is configured to direct a majority of exhaust air away from the bottom shell.

16. The system of claim 6, wherein the vacuum force is configured to draw air over and through the middle cooling plate from a plurality of directions.

17. The system of claim 16, wherein the middle cooling plate comprises a plurality of fins, wherein a fin channel is formed between each of the plurality of fins, and wherein one or more fin channels include a channel aperture.

18. An apparatus comprising:
   a signal hub housing;
   a top shell;
   a bottom shell;
   an ambient air gap;
   a top cooling plate;
   a radio frequency (RF) board; and
   a middle cooling plate,
      wherein the top cooling plate is coupled to a top surface of the RF board;
      wherein the middle cooling plate is coupled to a bottom surface of the RF board;
      wherein the top shell is configured to couple to the bottom shell to form the signal hub housing,
      wherein the ambient air gap is formed between the top shell and the bottom shell when the top shell is coupled to the bottom shell,
      wherein the ambient air gap extends around a perimeter of the signal hub housing along a same plane, and
      wherein the ambient air gap is configured to enable ambient air to pass over the top cooling plate, the RF board, and the middle cooling plate.

* * * * *